(12) United States Patent
Yamazaki et al.

(10) Patent No.: US 11,955,562 B2
(45) Date of Patent: *Apr. 9, 2024

(54) SEMICONDUCTOR DEVICE AND METHOD FOR MANUFACTURING SEMICONDUCTOR DEVICE

(71) Applicant: Semiconductor Energy Laboratory Co., Ltd., Atsugi (JP)

(72) Inventors: Shunpei Yamazaki, Setagaya (JP); Haruyuki Baba, Isehara (JP); Naoki Okuno, Yamato (JP); Yoshihiro Komatsu, Ebina (JP); Toshikazu Ohno, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/889,597

(22) Filed: Aug. 17, 2022

(65) Prior Publication Data

US 2023/0073146 A1 Mar. 9, 2023

Related U.S. Application Data

(63) Continuation of application No. 17/256,341, filed as application No. PCT/IB2019/055318 on Jun. 25, 2019, now Pat. No. 11,424,369.

(30) Foreign Application Priority Data

Jul. 6, 2018 (JP) .................................. 2018-129050
Jul. 12, 2018 (JP) .................................. 2018-132300

(Continued)

(51) Int. Cl.
*H01L 29/786* (2006.01)
*H01L 29/49* (2006.01)
*H01L 29/51* (2006.01)

(52) U.S. Cl.
CPC ...... *H01L 29/7869* (2013.01); *H01L 29/4966* (2013.01); *H01L 29/517* (2013.01)

(58) Field of Classification Search
CPC ............... H01L 29/4966; H01L 29/517; H01L 29/7869

(Continued)

(56) References Cited

U.S. PATENT DOCUMENTS 10,032,918 B2  7/2018 Yamazaki et al.
10,333,004 B2  6/2019 Kimura et al.

(Continued)

FOREIGN PATENT DOCUMENTS

JP  2017-175129 A  9/2017
JP  2017-199901 A  11/2017

OTHER PUBLICATIONS

International Search Report (Application No. PCT/IB2019/055318) dated Sep. 24, 2019.

(Continued)

*Primary Examiner* — Monica D Harrison
(74) *Attorney, Agent, or Firm* — Eric J. Robinson; Robinson Intellectual Property Law Office, P.C.

(57) ABSTRACT

A semiconductor device having a large on-state current and high reliability is provided. The semiconductor device includes a first insulator, a first oxide over the first insulator, a second oxide over the first oxide, a third oxide and a fourth oxide over the second oxide, a first conductor over the third oxide, a second conductor over the fourth oxide, a fifth oxide over the second oxide, a second insulator over the fifth oxide, and a third conductor over the second insulator. The fifth oxide is in contact with a top surface of the second oxide, a side surface of the first conductor, a side surface of the second conductor, a side surface of the third oxide, and a side surface of the fourth oxide. The second oxide contains In, an element M, and Zn. The first oxide and the fifth oxide (Continued)

each contain at least one of constituent elements included in the second oxide. The third oxide and the fourth oxide each contain the element M. The third oxide and the fourth oxide include a region where the concentration of the element M is higher than that in the second oxide.

18 Claims, 45 Drawing Sheets

(30) Foreign Application Priority Data

| | | |
|---|---|---|
| Aug. 23, 2018 | (JP) | 2018-156319 |
| Sep. 7, 2018 | (JP) | 2018-168236 |
| Nov. 30, 2018 | (JP) | 2018-224773 |
| Feb. 22, 2019 | (JP) | 2019-030032 |
| Mar. 8, 2019 | (JP) | 2019-042602 |

(58) Field of Classification Search
USPC .......................................................... 257/287
See application file for complete search history.

(56) References Cited

U.S. PATENT DOCUMENTS

| | | |
|---|---|---|
| 10,658,519 B2 | 5/2020 | Kimura et al. |
| 11,424,369 B2 * | 8/2022 | Yamazaki ............. H01L 29/517 |
| 2016/0149055 A1 | 5/2016 | Yamazaki et al. |
| 2017/0271517 A1 | 9/2017 | Kimura et al. |
| 2017/0309752 A1 | 10/2017 | Yamazaki et al. |
| 2020/0227564 A1 | 7/2020 | Kimura et al. |

OTHER PUBLICATIONS

Written Opinion (Application No. PCT/IB2019/055318) dated Sep. 24, 2019.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.

Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.

Yamazaki.S et al., "In—Ga—Zn-Oxide Semiconductor and Its Transistor Characteristics", ECS Journal of Solid State Science and Technology, Jul. 1, 2014, vol. 3, No. 9, pp. Q3012-Q3022.

Yamazaki.S, "Crystalline Oxide Semiconductor Using CAAC-IGZO and its Application", ECS Transactions, Oct. 1, 2014, vol. 64, No. 10, pp. 155-164, The Electrochemical Society.

Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics) , 2012, vol. 51, pp. 021201-1-021201-7.

Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology : Digest of Technical Papers, 2015, pp. T216-T217.

Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.

* cited by examiner

SEMICONDUCTOR DEVICE AND METHOD FOR MANUFACTURING SEMICONDUCTOR DEVICE

TECHNICAL FIELD

One embodiment of the present invention relates to a semiconductor device and a method for manufacturing the semiconductor device. Alternatively, one embodiment of the present invention relates to a semiconductor wafer, a module, and an electronic device.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. It can be sometimes said that a display device (a liquid crystal display device, a light-emitting display device, and the like), a projection device, a lighting device, an electro-optical device, a power storage device, a memory device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. One embodiment of the present invention relates to a process, a machine, manufacture, or a composition of matter.

BACKGROUND ART

As semiconductor thin films applicable to the transistors, silicon-based semiconductor materials have been widely known, but oxide semiconductors have been attracting attention as alternative materials. Examples of oxide semiconductors include not only single-component metal oxides, such as indium oxide and zinc oxide, but also multi-component metal oxides. Among the multi-component metal oxides, in particular, an In—Ga—Zn oxide (hereinafter also referred to as IGZO) has been actively studied.

From the studies on IGZO, in an oxide semiconductor, a CAAC (c-axis aligned crystalline) structure and an nc (nanocrystalline) structure, which are not single crystal nor amorphous, have been found (see Non-Patent Document 1 to Non-Patent Document 3). Non-Patent Document 1 and Non-Patent Document 2 disclose a technique for fabricating a transistor using an oxide semiconductor having the CAAC structure. Moreover, Non-Patent Document 4 and Non-Patent Document 5 disclose that a fine crystal is included even in an oxide semiconductor which has lower crystallinity than an oxide semiconductor having the CAAC structure or the nc structure.

In addition, a transistor that includes IGZO as an active layer has an extremely low off-state current (see Non-Patent Document 6), and an LSI and a display utilizing the characteristics have been reported (see Non-Patent Document 7 and Non-Patent Document 8).

REFERENCE

Non-Patent Document

[Non-Patent Document 1] S. Yamazaki et al., "SID Symposium Digest of Technical Papers", 2012, volume 43, issue 1, p. 183-186

[Non-Patent Document 2] S. Yamazaki et al., "Japanese Journal of Applied Physics", 2014, volume 53, Number 4S, p. 04ED18-1-04ED18-10

[Non-Patent Document 3] S. I to et al., "The Proceedings of AM-FPD'13 Digest of Technical Papers", 2013, p. 151-154

[Non-Patent Document 4] S. Yamazaki et al., "ECS Journal of Solid State Science and Technology", 2014, volume 3, issue 9, p. Q3012-Q3022

[Non-Patent Document 5] S. Yamazaki, "ECS Transactions", 2014, volume 64, issue 10, p. 155-164

[Non-Patent Document 6] K. Kato et al., "Japanese Journal of Applied Physics", 2012, volume 51, p. 021201-1-021201-7

[Non-Patent Document 7] S. Matsuda et al., "2015 Symposium on VLSI Technology Digest of Technical Papers", 2015, p. T216-T217

[Non-Patent Document 8] S. Amano et al., "SID Symposium Digest of Technical Papers", 2010, volume 41, issue 1, p. 626-629

SUMMARY OF THE INVENTION

Problems to be Solved by the Invention

An object of one embodiment of the present invention is to provide a semiconductor device having a high on-state current. Another object of one embodiment of the present invention is to provide a semiconductor device having excellent frequency characteristics. Another object of one embodiment of the present invention is to provide a semiconductor device having favorable reliability. Another object of one embodiment of the present invention is to provide a semiconductor device that can be miniaturized or highly integrated. Another object of one embodiment of the present invention is to provide a semiconductor device having favorable electrical characteristics. Another object of one embodiment of the present invention is to provide a semiconductor device with high productivity.

Another object of one embodiment of the present invention is to provide a semiconductor device capable of retaining data for along time. Another object of one embodiment of the present invention is to provide a semiconductor device capable of high-speed data writing. Another object of one embodiment of the present invention is to provide a semiconductor device with high design flexibility. Another object of one embodiment of the present invention is to provide a semiconductor device in which power consumption can be reduced. Another object of one embodiment of the present invention is to provide a novel semiconductor device.

Note that the description of these objects does not preclude the existence of other objects. One embodiment of the present invention does not have to achieve all these objects. Other objects will be apparent from and can be derived from the description of the specification, the drawings, the claims, and the like.

Means for Solving the Problems

One embodiment of the present invention is a semiconductor device including a first insulator, a first oxide over the first insulator, a second oxide over the first oxide, a third oxide and a fourth oxide over the second oxide, a first conductor over the third oxide, a second conductor over the fourth oxide, a fifth oxide over the second oxide, a second insulator over the fifth oxide, and a third conductor over the second insulator. The fifth oxide is in contact with a top surface of the second oxide, a side surface of the first conductor, a side surface of the second conductor, a side surface of the third oxide, and a side surface of the fourth oxide. The second oxide contains In, an element M (M is Al, Ga, Y, or Sn), and Zn. The first oxide and the fifth oxide each contain at least one of constituent elements included in the second oxide. The third oxide and the fourth oxide each contain the element M. The third oxide and the fourth oxide include a region having a concentration of the element M higher than that in the second oxide.

In the above embodiment, the third oxide and the fourth oxide each preferably include a region having a thickness of greater than or equal to 0.5 nm and less than or equal to 5 nm.

In the above embodiment, the third oxide and the fourth oxide each preferably include a region having a thickness of greater than or equal to 1 nm and less than or equal to 3 nm.

In the above embodiment, the third oxide and the fourth oxide each preferably contain gallium.

In the above embodiment, the third oxide and the fourth oxide may each have crystallinity.

In the above embodiment, the second oxide may have crystallinity.

In the above embodiment, the first oxide, the third oxide, the fourth oxide, and the fifth oxide may have substantially the same composition.

Effect of the Invention

According to one embodiment of the present invention, a semiconductor device having a high on-state current can be provided. Alternatively, according to one embodiment of the present invention, a semiconductor device having excellent frequency characteristics can be provided. Alternatively, according to one embodiment of the present invention, a semiconductor device having favorable reliability can be provided. Alternatively, according to one embodiment of the present invention, a semiconductor device that can be miniaturized or highly integrated can be provided. Alternatively, according to one embodiment of the present invention, a semiconductor device having favorable electrical characteristics can be provided. Alternatively, according to one embodiment of the present invention, a semiconductor device with high productivity can be provided.

Alternatively, a semiconductor device capable of retaining data for a long time can be provided. Alternatively, a semiconductor device capable of high-speed data writing can be provided. Alternatively, a semiconductor device having high design flexibility can be provided. Alternatively, a semiconductor device in which power consumption can be reduced can be provided. Alternatively, a novel semiconductor device can be provided.

Note that the description of these effects does not preclude the existence of other effects. One embodiment of the present invention does not have to have all these effects. Effects other than these will be apparent from and can be derived from the description of the specification, the drawings, the claims, and the like.

BRIEF DESCRIPTION OF THE DRAWINGS

FIG. 22(A) to FIG. 22(F) are schematic diagrams illustrating electronic devices.

MODE FOR CARRYING OUT THE INVENTION

Figure 1A:
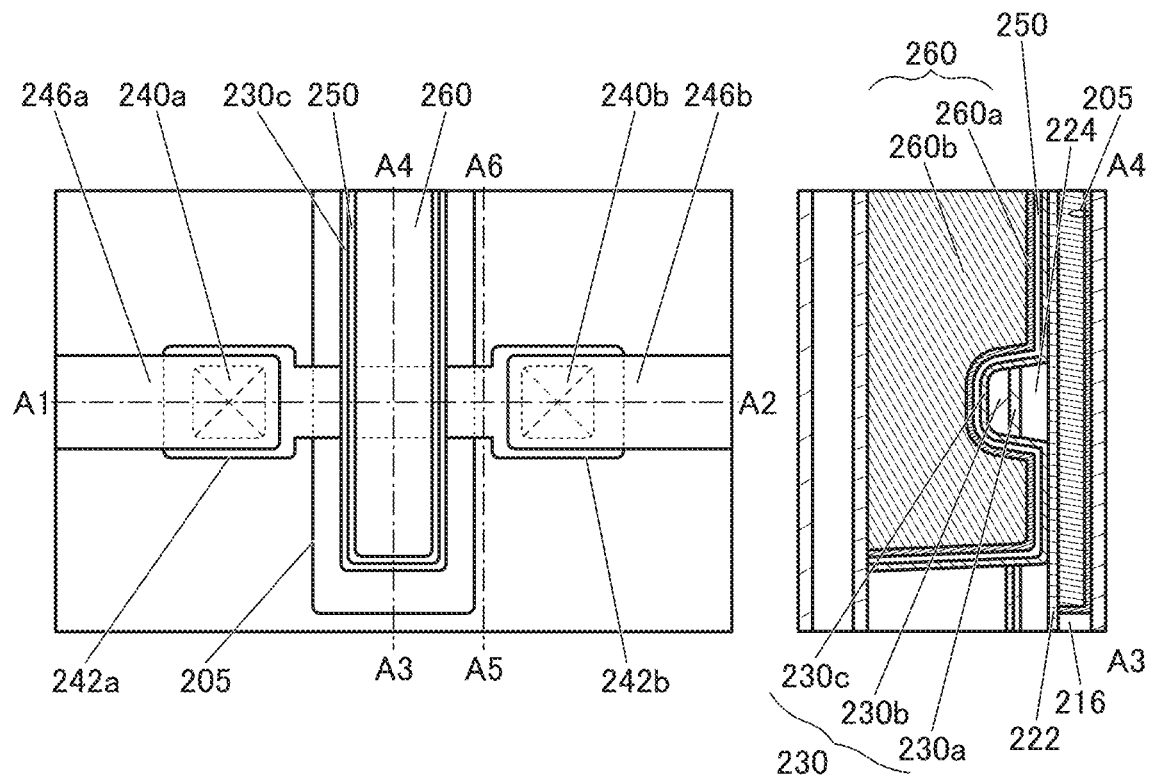
FIG. 1(A) is atop view illustrating a structure example of a semiconductor device.

Embodiments will be described below with reference to the drawings. Note that the embodiments can be implemented with many different modes, and it will be readily understood by those skilled in the art that modes and details thereof can be changed in various ways without departing from the spirit and scope thereof. Therefore, the present invention should not be construed as being limited to the description of embodiments below.

In the drawings, the size, the layer thickness, or the region is exaggerated for clarity in some cases. Therefore, they are not limited to the illustrated scale. Note that the drawings schematically illustrate ideal examples, and embodiments of the present invention are not limited to shapes, values, and the like shown in the drawings. For example, in an actual manufacturing process, a layer, a resist mask, or the like might be unintentionally reduced in size by treatment such as etching, which might not be reflected in the drawings for easy understanding. Furthermore, in the drawings, the same reference numerals are used in common for the same portions or portions having similar functions in different drawings, and repeated description thereof is omitted in some cases. Moreover, the same hatch pattern is used for the portions having similar functions, and the portions are not especially denoted by reference numerals in some cases.

Especially in a top view (also referred to as a plan view), a perspective view, or the like, some components might not be illustrated for easy understanding of the invention. In addition, some hidden lines and the like might not be shown.

Note that the ordinal numbers such as "first" and "second" in this specification and the like are used for convenience and do not denote the order of steps or the stacking order of layers. Therefore, for example, the term "first" can be replaced with the term "second", "third", or the like as appropriate. In addition, the ordinal numbers in this specification and the like do not sometimes correspond to the ordinal numbers that are used to specify one embodiment of the present invention.

In this specification and the like, terms for describing arrangement, such as "over" and "below", are used for convenience to describe the positional relation between components with reference to drawings. Furthermore, the positional relation between components is changed as appropriate in accordance with a direction in which the components are described. Thus, terms for the description are not limited to terms used in the specification, and description can be made appropriately depending on the situation.

When this specification and the like explicitly state that X and Y are connected, for example, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or text, a connection relation other than a connection relation shown in drawings or text is regarded as being disclosed in the drawings or the text.

Here, X and Y each denote an object (e.g., a device, an element, a circuit, a wiring, an electrode, a terminal, a conductive film, or a layer).

Functions of a source and a drain might be interchanged with each other when a transistor of opposite polarity is employed or when the direction of current is changed in circuit operation, for example. Therefore, the terms "source" and "drain" can sometimes be interchanged with each other in this specification and the like.

Note that in this specification and the like, depending on the transistor structure, a channel width in a region where a channel is actually formed (hereinafter also referred to as an effective channel width) is sometimes different from a channel width shown in a top view of a transistor (hereinafter also referred to as an apparent channel width). For example, in a transistor whose gate electrode covers a side surface of a semiconductor, the effective channel width is larger than the apparent channel width, and its influence cannot be ignored in some cases. For example, in a miniaturized transistor whose gate electrode covers a side surface of a semiconductor, the proportion of a channel formation region formed in the side surface of the semiconductor is increased in some cases. In that case, the effective channel width is larger than the apparent channel width.

In such a case, the effective channel width is sometimes difficult to estimate by actual measurement. For example, estimation of an effective channel width from a design value requires assumption that the shape of a semiconductor is known. Accordingly, in the case where the shape of a semiconductor is not known accurately, it is difficult to measure the effective channel width accurately.

In this specification, the simple term "channel width" refers to apparent channel width in some cases. Alternatively, in this specification, the simple term "channel width" refers to effective channel width in some cases. Note that values of channel length, channel width, effective channel width, apparent channel width, and the like can be determined, for example, by analyzing a cross-sectional TEM image and the like.

Note that impurities in a semiconductor refer to, for example, elements other than the main components of a semiconductor. For example, an element with a concentration lower than 0.1 atomic % can be regarded as an impurity. When an impurity is contained, for example, DOS (Density of States) in a semiconductor may be increased or the crystallinity may be decreased. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. In the case of an oxide semiconductor, water also serves as an impurity in some cases. Also in the case of an oxide semiconductor, oxygen vacancies are formed by the mixing of impurities, for example. Furthermore, when the semiconductor is silicon, examples of an impurity that changes characteristics of the semiconductor include oxygen, Group 1 elements except hydrogen, Group 2 elements, Group 13 elements, and Group 15 elements.

Note that in this specification and the like, silicon oxynitride is a material that contains more oxygen than nitrogen in its composition. Moreover, silicon nitride oxide is a material that contains more nitrogen than oxygen in its composition.

In this specification and the like, the term "insulator" can be replaced with an insulating film or an insulating layer. Furthermore, the term "conductor" can be replaced with a conductive film or a conductive layer. Moreover, the term "semiconductor" can be replaced with a semiconductor film or a semiconductor layer.

In this specification and the like, "parallel" indicates a state where two straight lines are placed at an angle greater than or equal to −10° and less than or equal to 10°. Accordingly, the case where the angle is greater than or equal to −5° and less than or equal to 5° is also included. Furthermore, "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Accordingly, the case where the angle is greater than or equal to 85° and less than or equal to 95° is also included. Moreover, "substantially perpendicular" indicates a state where two straight lines are placed at an angle greater than or equal to 60° and less than or equal to 120°.

Note that in this specification, a barrier film means a film having a function of inhibiting transmission of oxygen and impurities such as water and hydrogen, and the barrier film having conductivity is sometimes referred to as a conductive barrier film.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, an OS FET or an OS transistor can also be referred to as a transistor including an oxide or an oxide semiconductor.

In this specification and the like, "normally off" means that a current per micrometer of channel width flowing through a transistor when a potential is not applied to a gate or a ground potential is applied to the gate is lower than or equal to $1\times10^{-20}$ A at room temperature, lower than or equal to $1\times10^{-18}$ A at 85° C., or lower than or equal to $1\times10^{-16}$ A at 125° C.

Embodiment 1

An example of a semiconductor device including a transistor 200 according to one embodiment of the present invention will be described below.

<Structure Example of Semiconductor Device>

Figure 1C:
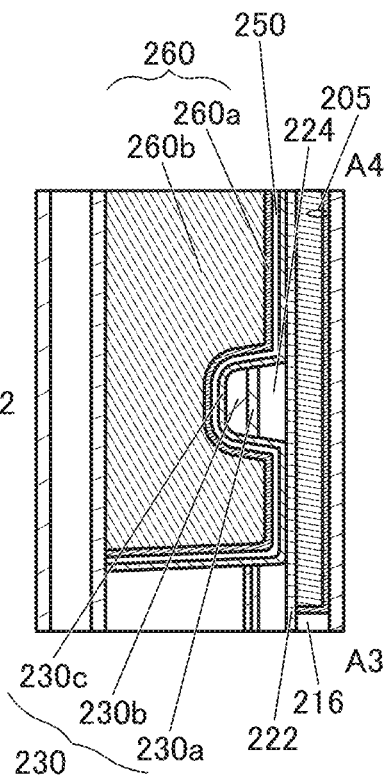
FIG. 1(B) and FIG. 1(C) are cross-sectional views illustrating the structure example of the semiconductor device.
Figure 1B:
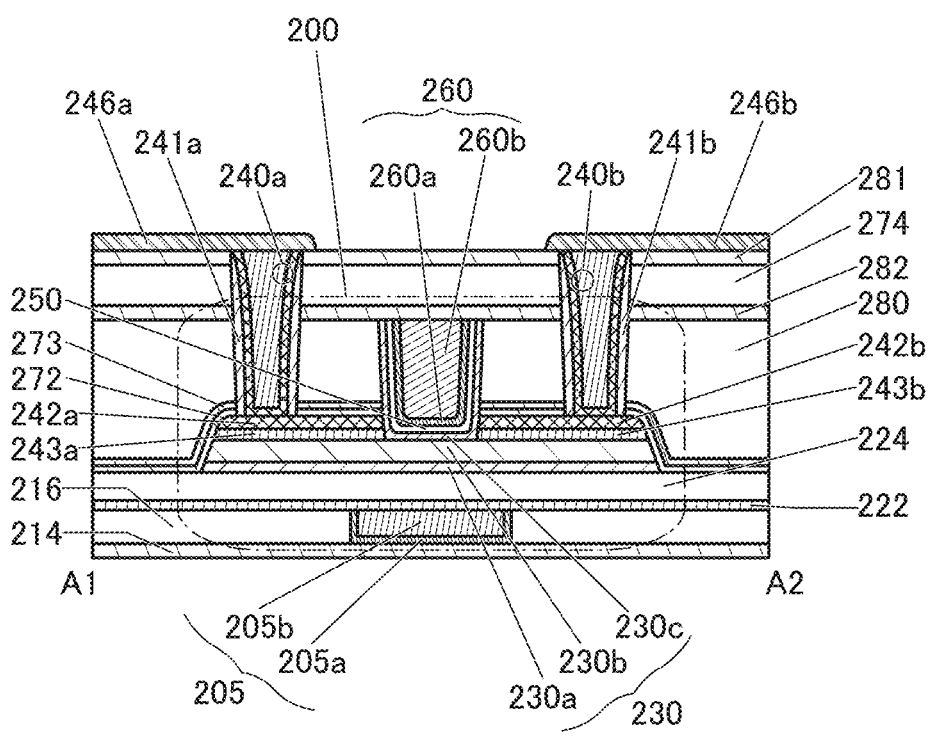

FIG. 1(A), FIG. 1(B), and FIG. 1(C) are a top view and cross-sectional views of the transistor 200 according to one embodiment of the present invention and the periphery of the transistor 200.

FIG. 1(A) is a top view of a semiconductor device including the transistor 200. FIG. 1(B) and FIG. 1(C) are cross-sectional views of the semiconductor device. Here, FIG. 1(B) is a cross-sectional view of a portion indicated by the dashed-dotted line A1-A2 in FIG. 1(A), and is a cross-sectional view in the channel length direction of the transistor 200. FIG. 1(C) is a cross-sectional view of a portion indicated by the dashed-dotted line A3-A4 in FIG. 1(A), and is a cross-sectional view in the channel width direction of the transistor 200. Note that for simplification of the drawing, some components are not illustrated in the top view in FIG. 1(A).

The semiconductor device of one embodiment of the present invention includes an insulator 214 over a substrate (not illustrated), the transistor 200 over the insulator 214, an insulator 280 over the transistor 200, an insulator 282 over the insulator 280, an insulator 274 over the insulator 282, and an insulator 281 over the insulator 274. The insulator 214, the insulator 280, the insulator 282, the insulator 274, and the insulator 281 function as interlayer films. A conductor 240 (a conductor 240a and a conductor 240b) that is electrically connected to the transistor 200 and functions as a plug is also included. Note that an insulator 241 (an insulator 241a and an insulator 241b) is provided in contact with a side surface of the conductor 240 functioning as a plug. A conductor 246 (a conductor 246a and a conductor 246b) that is electrically connected to the conductor 240 and functions as a wiring is provided over the insulator 281 and the conductor 240.

The insulator 241a is provided in contact with the inner wall of an opening in an insulator 272, an insulator 273, the insulator 280, the insulator 282, the insulator 274, and the insulator 281; a first conductor of the conductor 240a is provided in contact with a side surface of the insulator 241a;

and a second conductor of the conductor 240a is provided on the inner side thereof. The insulator 241b is provided in contact with the inner wall of an opening in the insulator 272, the insulator 273, the insulator 280, the insulator 282, the insulator 274, and the insulator 281; a first conductor of the conductor 240b is provided in contact with a side surface of the insulator 241b; and a second conductor of the conductor 240b is provided on the inner side thereof. Here, the level of a top surface of the conductor 240 and the level of a top surface of the insulator 281 can be substantially the same. Note that although the transistor 200 has a structure in which the first conductor of the conductor 240 and the second conductor of the conductor 240 are stacked, the present invention is not limited thereto. For example, the conductor 240 may be provided as a single layer or to have a stacked-layer structure of three or more layers. In the case where a component has a stacked-layer structure, layers may be distinguished by ordinal numbers corresponding to the formation order.

[Transistor 200]

As illustrated in FIG. 1, the transistor 200 includes an insulator 216 over the insulator 214; a conductor 205 (a conductor 205a and a conductor 205b) disposed so as to be embedded in the insulator 216; an insulator 222 over the insulator 216 and the conductor 205; an insulator 224 over the insulator 222; an oxide 230a over the insulator 224; an oxide 230b over the oxide 230a; an oxide 243a and an oxide 243b over the oxide 230b; a conductor 242a over the oxide 243a; a conductor 242b over the oxide 243b; an oxide 230c over the oxide 230b; an insulator 250 over the oxide 230c; a conductor 260 (a conductor 260a and a conductor 260b) that is positioned over the insulator 250 and overlaps with the oxide 230c; an insulator 272 in contact with part of a top surface of the insulator 224, a side surface of the oxide 230a, a side surface of the oxide 230b, a side surface of the oxide 243a, a side surface of the oxide 243b, a side surface of the conductor 242a, a top surface of the conductor 242a, a side surface of the conductor 242b, and a top surface of the conductor 242b; and an insulator 273 over the insulator 272. The oxide 230c is in contact with a side surface of the oxide 243a, a side surface of the oxide 243b, a side surface of the conductor 242a, and a side surface of the conductor 242b. The conductor 260 includes the conductor 260a and the conductor 260b, and the conductor 260a is positioned so as to cover a bottom surface and a side surface of the conductor 260b. Here, as illustrated in FIG. 1(B), the top surface of the conductor 260 is positioned to be substantially aligned with the top surface of the insulator 250 and the top surface of the oxide 230c. The insulator 282 is in contact with the top surface of each of the conductor 260, the oxide 230c, the insulator 250, and the insulator 280.

It is preferable that the insulator 222, the insulator 272, the insulator 273, and the insulator 282 have a function of inhibiting diffusion of hydrogen (e.g., at least one of a hydrogen atom, a hydrogen molecule, and the like). In addition, it is preferable that the insulator 222, the insulator 272, the insulator 273, and the insulator 282 have a function of inhibiting diffusion of oxygen (e.g., at least one of an oxygen atom, an oxygen molecule, and the like). For example, preferably, the insulator 222, the insulator 272, the insulator 273, and the insulator 282 each have a lower permeability of one or both of oxygen and hydrogen than the insulator 224. Preferably, the insulator 222, the insulator 272, the insulator 273, and the insulator 282 each have a lower permeability of one or both of oxygen and hydrogen than the insulator 250. Preferably, the insulator 222, the insulator 272, the insulator 273, and the insulator 282 each have a lower permeability of one or both of oxygen and hydrogen than the insulator 280.

As illustrated in FIG. 1(B), the insulator 272 is preferably in contact with the top surface and the side surface of the conductor 242a, the top surface and the side surface of the conductor 242b, the side surface of the oxide 243a, the side surface of the oxide 243b, the side surface of the oxide 230a, the side surface of the oxide 230b, and the top surface of the insulator 224. The insulator 273 is preferably provided on and in contact with the insulator 272. Thus, the insulator 280 is isolated from the insulator 224 and the oxide 230 by the insulator 272 and the insulator 273.

The oxide 230 preferably includes the oxide 230a over the insulator 224, the oxide 230b over the oxide 230a, and the oxide 230c that is placed over the oxide 230b and is at least partly in contact with the top surface of the oxide 230b.

The transistor 200 has a structure in which three layers of the oxide 230a, the oxide 230b, and the oxide 230c are stacked in a region where a channel is formed (hereinafter also referred to as a channel formation region) and its vicinity; however, the present invention is not limited thereto. For example, a single layer of the oxide 230b, a two-layer structure of the oxide 230b and the oxide 230a, a two-layer structure of the oxide 230b and the oxide 230c, or a stacked-layer structure of four or more layers may be provided. Although the transistor 200 described here has a structure in which the conductor 260 has a stacked-layer structure of two layers, the present invention is not limited thereto. For example, the conductor 260 may have a single-layer structure or a stacked-layer structure of three or more layers.

Here, the conductor 260 functions as a gate electrode of the transistor, and the conductor 242a and the conductor 242b function as a source electrode and a drain electrode. In the transistor 200, the conductor 260 functioning as a gate electrode is formed in a self-aligned manner to fill an opening formed in the insulator 280 and the like. The formation of the conductor 260 in this manner allows the conductor 260 to be surely placed in a region between the conductor 242a and the conductor 242b without alignment.

In the transistor 200, a metal oxide functioning as an oxide semiconductor (hereinafter also referred to as an oxide semiconductor) is preferably used for the oxide 230 (the oxide 230a, the oxide 230b, and the oxide 230c), which includes the channel formation region.

The transistor 200 using an oxide semiconductor in its channel formation region has an extremely low leakage current (off-state current) in a non-conduction state; thus, a semiconductor device with low power consumption can be provided. An oxide semiconductor can be deposited by a sputtering method or the like, and thus can be used in the transistor 200 included in a highly integrated semiconductor device.

For example, for the oxide 230, a metal oxide such as an In-M-Zn oxide (an element M is one or more selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used as the element M. An In—Ga oxide or an In—Zn oxide may be used for the oxide 230.

The oxide 230 includes the oxide 230a, the oxide 230b over the oxide 230a, and the oxide 230c over the oxide 230b. Including the oxide 230a below the oxide 230b makes it possible to inhibit diffusion of impurities into the oxide 230b from the components formed below the oxide 230a. Moreover, including the oxide 230c over the oxide 230b makes it possible to inhibit diffusion of impurities into the oxide 230b from the components formed above the oxide 230c.

Note that the oxide 230 preferably has a stacked-layer structure using oxides that differ in the atomic ratio of metal atoms. Specifically, the atomic proportion of the element M in the constituent elements in the metal oxide used as the oxide 230a is preferably greater than the atomic proportion of the element M in the constituent elements in the metal oxide used as the oxide 230b. Moreover, the atomic ratio of the element M to In in the metal oxide used as the oxide 230a is preferably greater than the atomic ratio of the element M to In in the metal oxide used as the oxide 230b. Furthermore, the atomic ratio of In to the element M in the metal oxide used as the oxide 230b is preferably greater than the atomic ratio of In to the element M in the metal oxide used as the oxide 230a. A metal oxide that can be used as the oxide 230a or the oxide 230b can be used as the oxide 230c.

The oxide 230b preferably has crystallinity. For example, a CAAC-OS (c-axis aligned crystalline oxide semiconductor) described later is preferably used. An oxide having crystallinity, such as a CAAC-OS, has a dense structure with small amounts of impurities and defects (e.g., oxygen vacancies) and high crystallinity. This can inhibit oxygen extraction from the oxide 230b by the source electrode or the drain electrode. This can reduce oxygen extraction from the oxide 230b even when heat treatment is performed; thus, the transistor 200 is stable with respect to high temperatures in a manufacturing process (what is called thermal budget).

The energy of the conduction band minimum of each of the oxide 230a and the oxide 230c is preferably higher than the energy of the conduction band minimum of the oxide 230b. In other words, the electron affinity of each of the oxide 230a and the oxide 230c is preferably smaller than the electron affinity of the oxide 230b.

Here, the energy level of the conduction band minimum is gradually varied at junction regions of the oxide 230a, the oxide 230b, and the oxide 230c. In other words, the energy level of the conduction band minimum at the junction regions of the oxide 230a, the oxide 230b, and the oxide 230c is continuously varied or continuously connected. To obtain this, the density of defect states in mixed layers formed at an interface between the oxide 230a and the oxide 230b and an interface between the oxide 230b and the oxide 230c is preferably made low.

Specifically, as the oxide 230a, a metal oxide with In:Ga:Zn=1:3:4 [atomic ratio] or 1:1:0.5 [atomic ratio] is used. As the oxide 230b, a metal oxide with In:Ga:Zn=4:2:3 [atomic ratio] or 1:1:1 [atomic ratio] is used. As the oxide 230c, a metal oxide with In:Ga:Zn=1:3:4 [atomic ratio], Ga:Zn=2:1 [atomic ratio], or Ga:Zn=2:5 [atomic ratio] is used. Specific examples of the oxide 230c having a stacked-layer structure include a stacked-layer structure of In:Ga:Zn=1:3:4 [atomic ratio] and In:Ga:Zn=4:2:3 [atomic ratio], a stacked-layer structure of Ga:Zn=2:1 [atomic ratio] and In:Ga:Zn=4:2:3 [atomic ratio], a stacked-layer structure of Ga:Zn=2:5 [atomic ratio] and In:Ga:Zn=4:2:3 [atomic ratio] and, and a stacked-layer structure of gallium oxide and In:Ga:Zn=4:2:3 [atomic ratio].

At this time, the oxide 230b serves as a main carrier path. When the oxide 230a and the oxide 230c have the above structure, the density of defect states at the interface between the oxide 230a and the oxide 230b and the interface between the oxide 230b and the oxide 230c can be made low. Thus, the influence of interface scattering on carrier conduction is small, and the transistor 200 can have high on-state current and excellent frequency characteristics.

A metal oxide functioning as an oxide semiconductor is preferably used as the oxide 230. For example, a metal oxide whose energy gap is greater than or equal to 2 eV, preferably greater than or equal to 2.5 eV is preferably used. With the use of a metal oxide having such a large energy gap, the off-state current of the transistor can be reduced. With the use of such a transistor, a semiconductor device with low power consumption can be provided.

Figure 12:
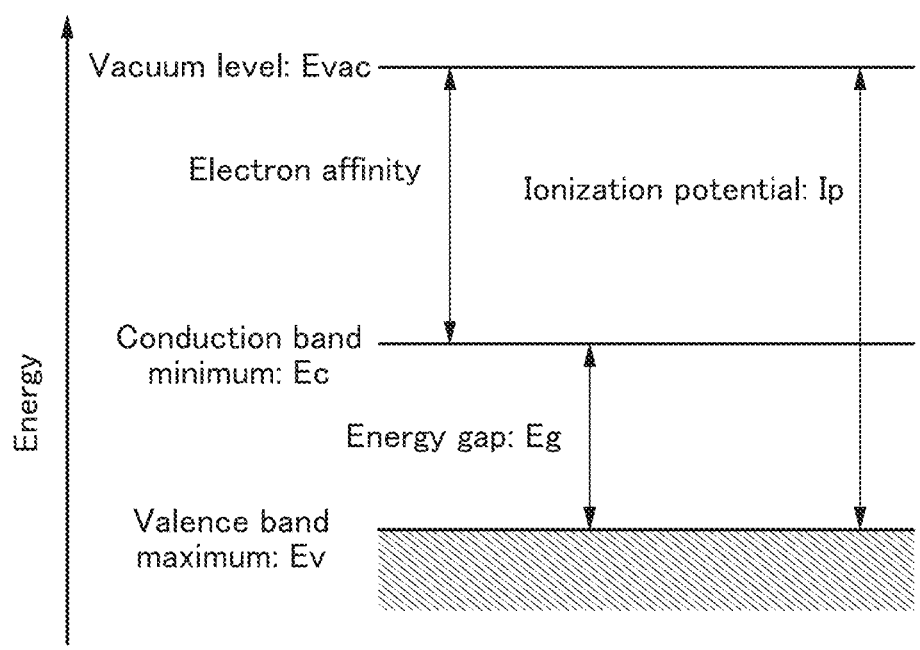
FIG. 12 is a diagram illustrating an energy band structure of an oxide semiconductor.

The electron affinity or the energy level Ec of the conduction band minimum can be obtained from a band gap Eg and an ionization potential Ip, which is a difference between the vacuum level Evac and the energy Ev of the valence band maximum, as shown in FIG. 12. The ionization potential Ip can be measured using, for example, an ultraviolet photoelectron spectroscopy (UPS) apparatus. The energy gap Eg can be measured using, for example, a spectroscopic ellipsometer.

A transistor using an oxide semiconductor is likely to have its electrical characteristics changed when impurities and oxygen vacancies exist in a region of the oxide semiconductor where a channel is formed, which may deteriorate the reliability. Moreover, if the region of the oxide semiconductor where a channel is formed contains oxygen vacancies, the transistor tends to have normally-on characteristics. Thus, oxygen vacancies in the region where a channel is formed are preferably reduced as much as possible. For example, oxygen is supplied to the oxide 230 through the insulator 250 or the like to fill the oxygen vacancies. Accordingly, a transistor with reduced variation in electrical characteristics, stable electrical characteristics, and improved reliability can be provided.

In the case where a conductor placed in the vicinity of the oxide semiconductor is made of a metal or an alloy, the conductor might be oxidized by oxygen atoms included in the oxide semiconductor. The reduction in conductivity of the conductor due to oxidation is highly likely to cause variations in electrical characteristics, a reduction in reliability, and the like of a semiconductor device.

Here, an oxidation reaction of a component including a metal or an alloy in contact with an oxide semiconductor due to oxygen atoms included in the oxide semiconductor will be described with reference to FIG. 13 to FIG. 15. Specifically, an oxidation reaction in the case where In—Ga—Zn oxide is used as the oxide semiconductor and tantalum nitride is used as the conductor will be described below.

Figure 13A:
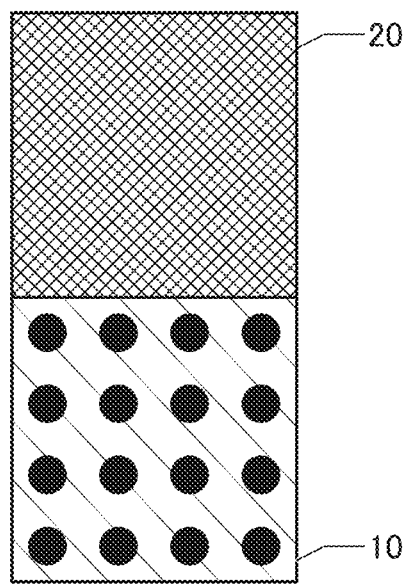
FIG. 13(A) to FIG. 13(C) are schematic diagrams illustrating oxidation of a conductor provided over an oxide semiconductor.

FIG. 13(A) illustrates a region in the vicinity of an interface in a cross section of a stack including an oxide semiconductor 10 made of In—Ga—Zn oxide and a conductor 20 made of tantalum nitride. Note that in the diagram, a black dot in each component represents an oxygen atom. Moreover, a white dot in the oxide semiconductor 10 represents an oxygen vacancy generated in the oxide semiconductor.

Figure 13B:
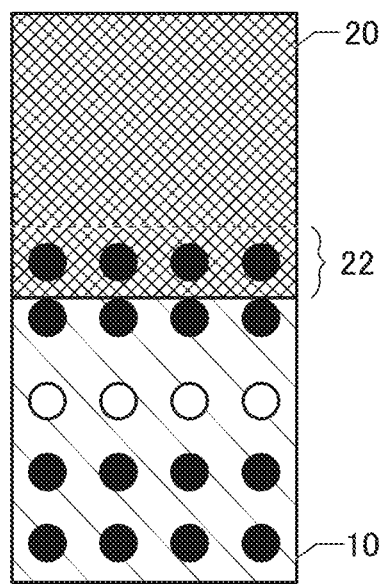
Figure 13C:
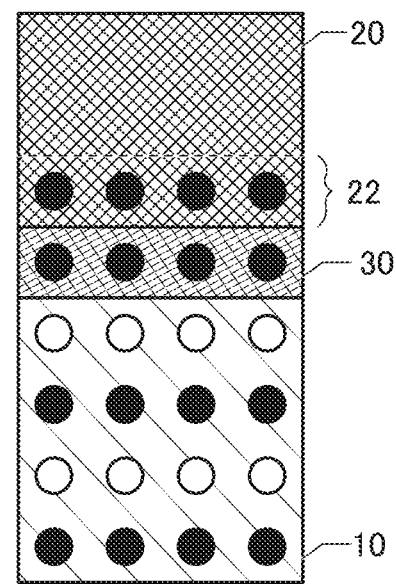

FIG. 13(B) illustrates an initial process of the oxidation reaction of the conductor 20. Note that in the conductor 20, a region where oxygen is dissolved at low concentration is denoted as an oxygen-dissolved region 22. FIG. 13(C) illustrates a growth process of an oxide 30 generated by the oxidation reaction of the conductor 20.

First, the initial process of the oxidation reaction of the conductor 20 is described with reference to FIG. 14. Note that arrows in the diagram indicate the direction of movement of oxygen atoms. In the initial process of the oxidation reaction of the conductor 20, a metal atom of tantalum at the interface of the conductor 20 and an oxygen ion at the interface of the oxide semiconductor 10 are assumed to interact with each other.

Figure 14A:
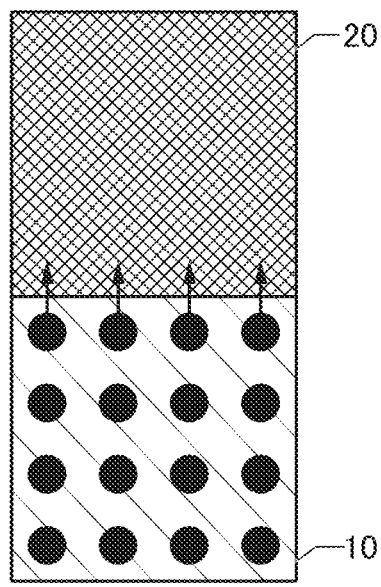
FIG. 14(A) to FIG. 14(D) are schematic diagrams illustrating oxidation of a conductor provided over an oxide semiconductor.

As illustrated in FIG. 14(A), when reaching the interface between the oxide semiconductor 10 and the conductor 20, an oxygen ion indicated by the black dot in the diagram is adsorbed on a metal atom of tantalum at the interface of the conductor 20.

Figure 14B:
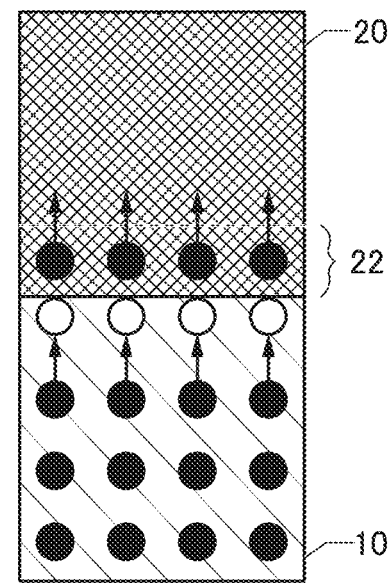

As illustrated in FIG. 14(B), when heat treatment is performed in a state where oxygen ions are adsorbed on metal atoms of tantalum, the oxygen ions are diffused into the conductor 20, and the oxygen-dissolved region 22 is formed in the tantalum nitride (see FIG. 14(B)). Note that at the time when the oxygen-dissolved region 22 is formed, the oxidation reaction has not yet occurred, and oxygen ions are dissolved in the conductor 20 as impurities. In addition, when oxygen ions are diffused into the conductor 20, an oxygen vacancy may be temporarily generated at the interface of the oxide semiconductor 10.

Presumably, the amount of oxygen that the conductor 20 can dissolve depends on the crystallinity or the density of the conductor 20. Moreover, oxygen vacancies generated at the interface of the oxide semiconductor 10 when oxygen ions at the interface of the oxide semiconductor 10 are dissolved in the conductor 20 are filled with oxygen atoms inside the oxide semiconductor 10 (see FIG. 14(C)).

Figure 14C:
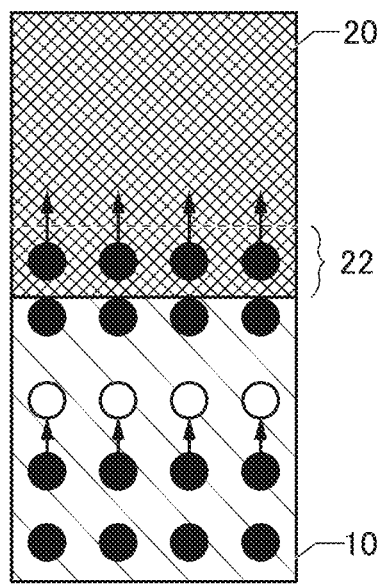
Figure 14D:
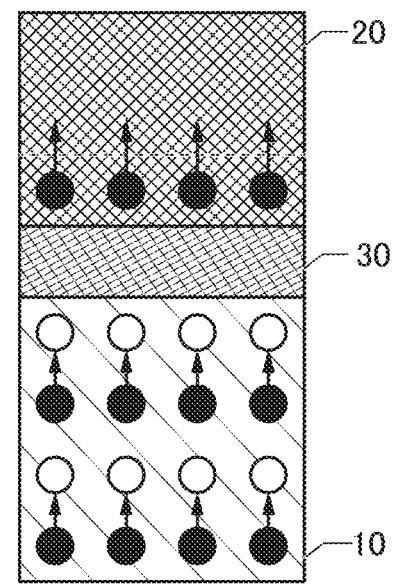

By repeating the processes shown in FIG. 14(A) to FIG. 14(C), the oxygen concentration in the oxygen-dissolved region 22 increases. Here, when oxygen dissolved in the oxygen-dissolved region 22 is saturated, oxidation of metal atoms of tantalum in the oxygen-dissolved region 22 starts. Thus, as illustrated in FIG. 14(D), the oxide 30 containing tantalum oxide is formed between the oxide semiconductor 10 and the conductor 20.

Note that it is known that nucleation of an oxide occurs generally in an initial process of an oxidation reaction of a metal. Meanwhile, since heat applied in a manufacturing process of a semiconductor device using an oxide semiconductor is relatively low, a thin film of an amorphous oxide is presumably formed at the interface between the oxide semiconductor 10 and the conductor 20.

Next, the growth process of the oxide 30 generated between the oxide semiconductor 10 and the conductor 20 is described with reference to FIG. 15. Generation of the oxide 30 causes the interface between the oxide 30 and the oxide semiconductor 10 to be deficient in oxygen and have a high concentration of oxygen vacancies. That is, it is probable that a concentration gradient of oxygen vacancies occurs in the oxide semiconductor 10.

Figure 15A:
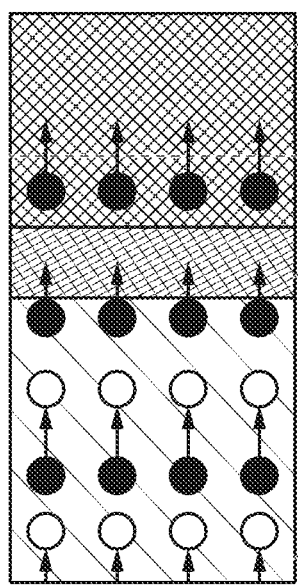
FIG. 15(A) to FIG. 15(C) are schematic diagrams illustrating oxidation of a conductor provided over an oxide semiconductor.
Figure 15B:
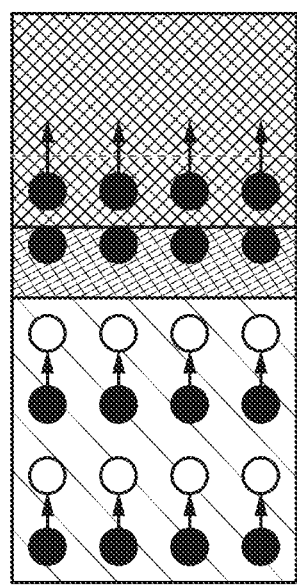
Figure 15C:
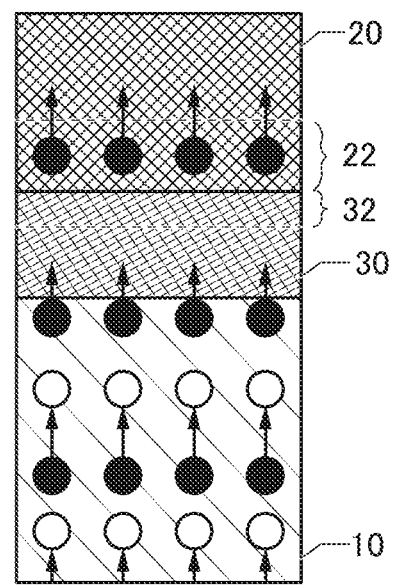

Accordingly, to make the concentration of oxygen vacancies uniform in the oxide semiconductor 10, oxygen ions inside the oxide semiconductor 10 diffuses as illustrated in FIG. 15(A) to FIG. 15(C). The oxygen ions are thought to reach the interface with the oxide 30 (see FIG. 15(A)). Then, the oxygen ions that have been reached the interface are used for the growth reaction of the tantalum oxide in the oxide 30, and the thickness of the oxide 30 increases (see FIG. 15(B) and FIG. 15(C)).

When the influence of defects at the interface is not taken into consideration in the oxide 30 containing tantalum oxide, the oxidation reaction depends generally on the diffusion rate of the metal and oxygen ions in the thin film of the oxide 30.

Accordingly, diffusion of oxygen ions causes a gradient in the oxygen concentration inside the oxide semiconductor 10 and the oxide 30. In that case, it can be presumed that the diffusion rate of oxygen ions in the oxide 30 is a determinant of the growth rate of tantalum oxide in the oxide 30. Note that it is likely that oxygen ions are diffused into tantalum oxide in the oxide 30, reach the interface between the oxide 30 and the conductor 20, and thus generate new tantalum oxide, whereby the thickness of the oxide 30 increases. In addition, it is likely that the oxygen-dissolved region 22 of the conductor 20 expands inside the conductor 20 in the growth process of this oxidation reaction.

To inhibit the above-described oxidation reaction of a conductor, the transistor 200 of one embodiment of the present invention includes the oxide 243 (the oxide 243a and the oxide 243b) between the oxide 230b and the conductor 242 (the conductor 242a and the conductor 242b) functioning as the source electrode and the drain electrode, as illustrated in FIG. 1(B). This structure in which the conductor 242 and the oxide 230 are not in contact with each other can inhibit the conductor 242 from absorbing oxygen in the oxide 230. That is, preventing oxidation of the conductor 242 can inhibit the decrease in conductivity of the conductor 242. Thus, the oxide 243 preferably has a function of inhibiting oxidation of the conductor 242.

Accordingly, the oxide 243 preferably has a function of inhibiting transmission of oxygen. It is preferable to provide the oxide 243 having a function of inhibiting transmission of oxygen between the oxide 230b and the conductor 242, which functions as the source electrode and the drain electrode, in which case the electrical resistance between the conductor 242 and the oxide 230b is reduced. Such a structure improves the electrical characteristics of the transistor 200 and the reliability of the transistor 200.

A metal oxide containing the element M may be used as the oxide 243. In particular, aluminum, gallium, yttrium, or tin is preferably used as the element M. The concentration of the element M in the oxide 243 is preferably higher than that in the oxide 230b. Alternatively, gallium oxide may be used as the oxide 243. A metal oxide such as an In-M-Zn oxide may be used as the oxide 243. Specifically, the atomic ratio of the element M to In in the metal oxide used as the oxide 243 is preferably greater than the atomic ratio of the element M to In in the metal oxide used as the oxide 230b. The thickness of the oxide 243 is preferably larger than or equal to 0.5 nm and smaller than or equal to 5 nm, further preferably larger than or equal to 1 nm and smaller than or equal to 3 nm. The oxide 243 preferably has crystallinity. In the case where the oxide 243 has crystallinity, release of oxygen from the oxide 230 can be favorably suppressed. When the oxide 243 has a hexagonal crystal structure, for example, release of oxygen from the oxide 230 can sometimes be inhibited.

As illustrated in FIG. 1(B) and FIG. 1(C), the transistor 200 of one embodiment of the present invention has a structure in which the insulator 282 and the insulator 250 are in direct contact with each other. With such a structure, oxygen contained in the insulator 280 is less likely to be absorbed into the conductor 260. Thus, oxygen contained in the insulator 280 can be efficiently injected into the oxide 230a and the oxide 230b through the oxide 230c; hence, oxygen vacancies in the oxide 230a and the oxide 230b can be reduced and the electrical characteristics and the reliability of the transistor 200 can be improved. In addition, the mixing of impurities such as hydrogen contained in the insulator 280 into the insulator 250 can be inhibited, which can reduce the adverse effects on the electrical characteristics and the reliability of the transistor 200. For the insulator 282, silicon nitride, silicon nitride oxide, aluminum oxide, or hafnium oxide can be used.

The insulator 272 and the insulator 273 preferably have a function of inhibiting transmission of oxygen and impurities such as hydrogen and water.

Figure 3A:
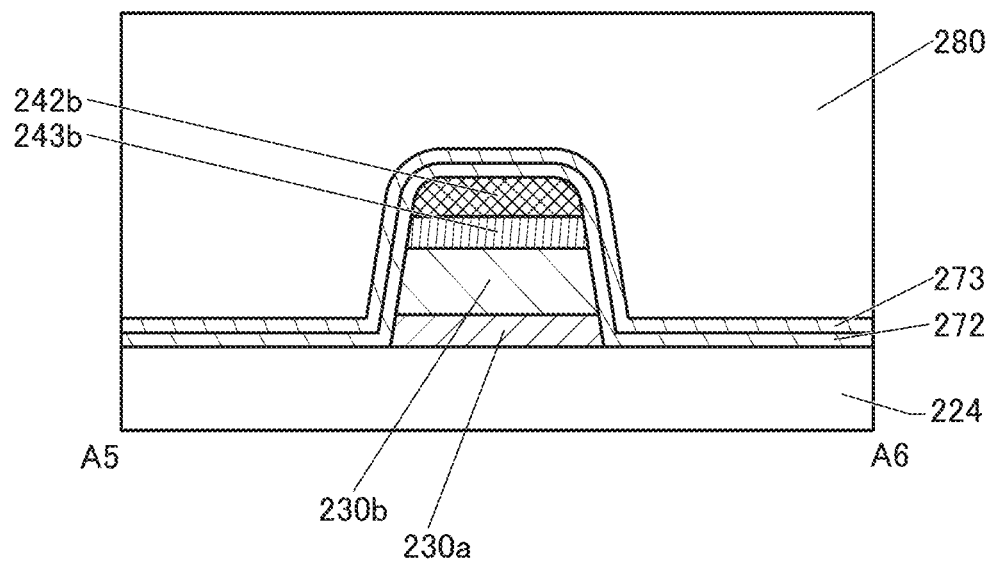
FIG. 3(A) and FIG. 3(B) are cross-sectional views illustrating a structure example of a semiconductor device.

FIG. 3(A) is an enlarged view of a cross section of a portion indicated by the dashed-dotted line A5-A6 in FIG. 1(A), and is also a cross-sectional view in the channel width direction of a source region or a drain region of the transistor 200. As illustrated in FIG. 3(A), the top surface of the conductor 242b, the side surface of the conductor 242b, the side surface of the oxide 230a, and the side surface of the oxide 230b are covered with the insulator 272 and the insulator 273, thereby inhibiting diffusion of oxygen and impurities such as hydrogen and water into the conductor 242b from the side surface direction of the conductor 242b and the top surface direction of the conductor 242b. Furthermore, the bottom surface of the conductor 242b is in contact with the oxide 243b, and oxygen in the oxide 230b is blocked by the oxide 243b and thus inhibited from being diffused into the conductor 242b. Hence, diffusion of oxygen into the conductor 242b from the periphery of the conductor 242b can be inhibited, so that oxidation of the conductor 242b can be inhibited. Note that a similar effect can also be obtained with the conductor 242a. Impurities such as hydrogen and water can be inhibited from being diffused into the oxide 230a and the oxide 230b from the side surface direction of the oxide 230a and the side surface direction of the oxide 230b. For the insulator 272, aluminum oxide, hafnium oxide, gallium oxide, indium gallium zinc oxide, a silicon oxide film, a silicon nitride film, or a silicon nitride oxide film can be used, for example. For the insulator 273, aluminum oxide or hafnium oxide can be used, for example.

Figure 3B:
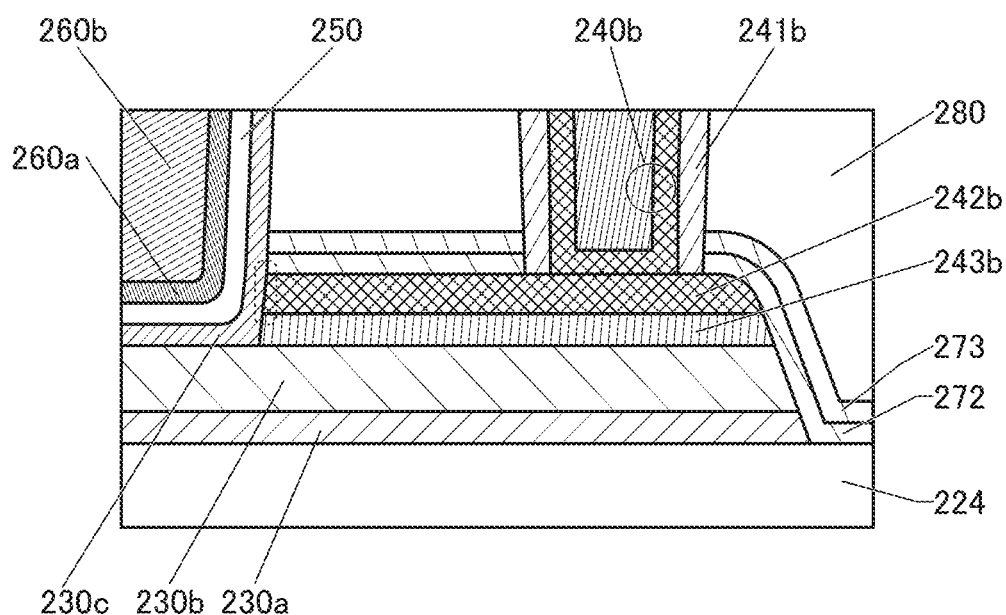

FIG. 3(B) is an enlarged view of the right half of the transistor 200 in FIG. 1(B). The oxide 230c is in contact with the left side surface of the conductor 240b (the portion surrounded by a dotted line in FIG. 3(B)), thereby inhibiting diffusion of oxygen and impurities such as hydrogen and water from the insulator 250 into the conductor 240b. Moreover, the insulator 272 is in contact with the right side surface of the conductor 240b, thereby inhibiting diffusion of oxygen and impurities such as hydrogen and water from the insulator 280 into the conductor 240b. Note that a similar effect can also be obtained with the conductor 240a.

The above-described structure in which the conductor 242b is surrounded by insulator 272, the oxide 230c, and the oxide 243b, each of which has a function of inhibiting transmission of oxygen and impurities such as hydrogen and water, can inhibit oxidation of the conductor 240, whereby the electronic characteristics of the transistor 200 and the reliability of the transistor 200 can be improved.

As illustrated in FIG. 1(C), when the bottom surface of the insulator 224 is used as a reference, the level of the bottom surface of the conductor 260 in a region where the oxide 230a and the oxide 230b do not overlap with the conductor 260 is preferably lower than the level of the bottom surface of the oxide 230b. The difference between the level of the bottom surface of the conductor 260 in the region where the oxide 230b does not overlap with the conductor 260 and the level of the bottom surface of the oxide 230b is set greater than or equal to 0 nm and less than or equal to 100 nm, preferably greater than or equal to 3 nm and less than or equal to 50 nm, further preferably greater than or equal to 5 nm and less than or equal to 20 nm.

As described above, the conductor 260, which functions as the gate electrode, covers the side surface and the top surface of the oxide 230b of the channel formation region, with the oxide 230c and the insulator 250 positioned therebetween; this structure enables the electric field of the conductor 260 to easily affect the entire oxide 230b of the channel formation region. Thus, the on-state current of the transistor 200 can be increased and the frequency characteristics of the transistor 200 can be improved.

Accordingly, a semiconductor device that includes a transistor having a high on-state current can be provided. Alternatively, a semiconductor device that includes a transistor having excellent frequency characteristics can be provided. Alternatively, a semiconductor device that has stable electrical characteristics with a small variation in electrical characteristics and improved reliability can be provided. Alternatively, a semiconductor device that includes a transistor having a low off-state current can be provided.

The detailed structure of the semiconductor device including the transistor 200 according to one embodiment of the present invention is described below.

The conductor 205 is provided to overlap with the oxide 230 and the conductor 260. Furthermore, the conductor 205 is preferably provided to be embedded in the insulator 214 and the insulator 216.

The conductor 260 sometimes functions as a first gate (also referred to as top gate) electrode. The conductor 205 sometimes functions as a second gate (also referred to as bottom gate) electrode. In that case, Vth of the transistor 200 can be controlled by changing a potential applied to the conductor 205 independently of a potential applied to the conductor 260. In particular, by applying a negative potential to the conductor 205, Vth of the transistor 200 can be higher than 0 V, and the off-state current can be reduced. Thus, drain current when a potential applied to the conductor 260 is 0 V can be lower in the case where a negative potential is applied to the conductor 205 than in the case where the negative potential is not applied to the conductor 205.

As illustrated in FIG. 1(A), the conductor 205 is preferably provided to be larger than a region of the oxide 230a and the oxide 230b that does not overlap with the conductor 242a or the conductor 242b. In particular, as illustrated in FIG. 1(C), the conductor 205 preferably extends to a region outside of the end portions of the oxide 230a and the oxide 230b that intersect with the channel width direction. That is, the conductor 205 and the conductor 260 preferably overlap with each other with the insulators therebetween on the outer side of the side surfaces of the oxide 230a and the oxide 230b in the channel width direction. A large conductor 205 can sometimes reduce local charging (referred to as charge up) in treatment using plasma after the formation of the conductor 205 in the manufacturing process. Note that one embodiment of the present invention is not limited thereto. The conductor 205 overlaps with at least the oxide 230a and the oxide 230b positioned between the conductor 242a and the conductor 242b.

With the above structure, the channel formation region can be electrically surrounded by the electric field of the conductor 260 having a function of the first gate electrode and the electric field of the conductor 205 having a function of the second gate electrode. In this specification, the transistor structure in which the channel formation region is electrically surrounded by the electric fields of the first gate electrode and the second gate electrode is referred to as a surrounded channel (S-channel) structure.

The conductor 205a is preferably a conductor that inhibits the transmission of oxygen and impurities such as water or hydrogen. For example, titanium, titanium nitride, tantalum, or tantalum nitride can be used. Moreover, the conductor 205b is preferably formed using a conductive material containing tungsten, copper, or aluminum as its main component. Although the conductor 205 is illustrated as having two layers, a multilayer structure with three or more layers may be employed.

Figure 2A:
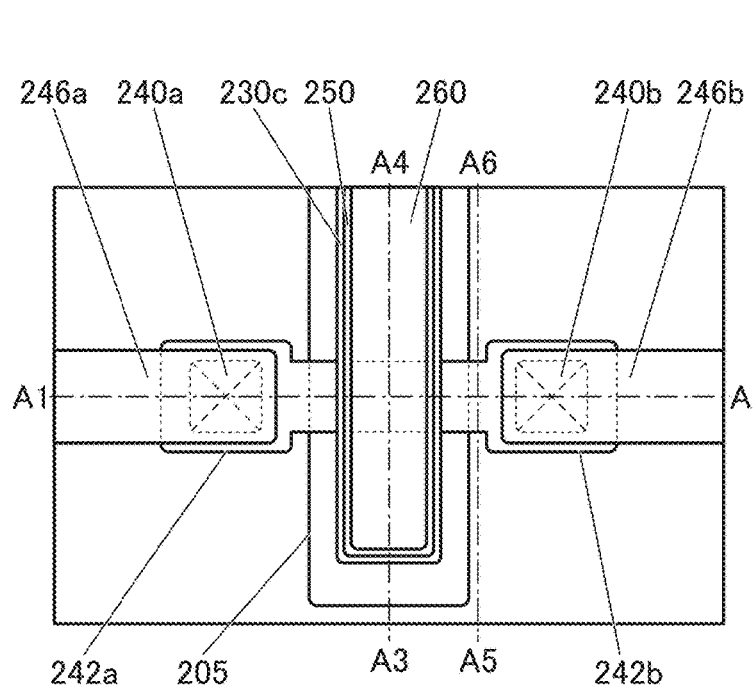
FIG. 2(A) is atop view illustrating a structure example of a semiconductor device.
Figure 2C:
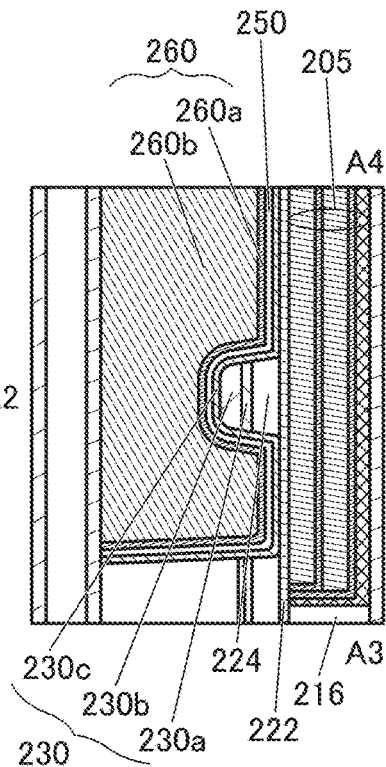
FIG. 2(B) and FIG. 2(C) are cross-sectional views illustrating the structure example of the semiconductor device.
Figure 2B:
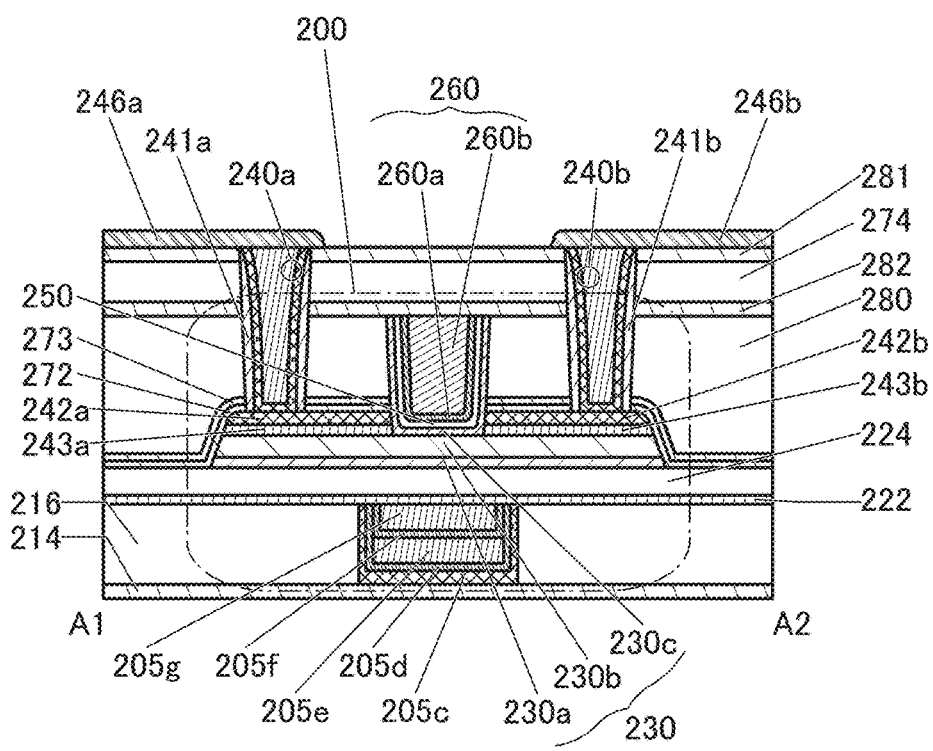

FIG. 2 illustrates an example where the conductor 205 is composed of five layers. In the conductor 205, a conductor 205c is formed in contact with the inner wall of the opening in the insulator 216, and a conductor 205d is formed on the inner side. A conductor 205e is formed on the inner side of the conductor 205d. A conductor 205f is formed to be in contact with the inner wall of the conductor 205d and in contact with the top surface of the conductor 205e, and a conductor 205g is formed on the inner side of the conductor 205f. Here, the top surfaces of the conductor 205c, the conductor 205d, the conductor 205f, and the conductor 205g can be substantially level with the top surface of the insulator 216. The conductor 205c is preferably formed using a material similar to that for the conductor 205a, and the conductor 205e and the conductor 205g are preferably formed using a material similar to that for the conductor 205b.

Here, it is preferable that as an oxide semiconductor, an insulator or a conductor positioned below the oxide semiconductor, and an insulator or a conductor positioned over the oxide semiconductor, different kinds of films be successively deposited without being exposed to the air, in which case a substantially highly purified intrinsic oxide semiconductor film where the concentration of impurities (in particular, hydrogen and water) is reduced can be formed.

For example, insulating films to be the insulator 222 and the insulator 224 positioned over the insulator 216 and the conductor 205, an oxide film to be the oxide 230a, an oxide film to be the oxide 230b, an oxide film to be the oxide 243, and a conductive film to be the conductor 242 are successively deposited in this order using a deposition apparatus including six treatment chambers.

The insulator 214, the insulator 272, and the insulator 281 preferably function as a barrier insulating film that inhibits impurities such as water or hydrogen from entering the transistor 200 from the substrate side or from above. Thus, the insulator 214, the insulator 272, and the insulator 281 are preferably formed using an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom (or through which the impurities are less likely to pass). Alternatively, it is preferable to use an insulating material having a function of inhibiting diffusion of oxygen (e.g., at least one of an oxygen atom, an oxygen molecule, and the like) (or through which the oxygen is less likely to pass).

For example, it is preferable that silicon nitride or the like be used for the insulator 214, the insulator 272, and the insulator 281. Accordingly, impurities such as water or hydrogen can be inhibited from being diffused to the transistor 200 side from the substrate side through the insulator 214. Alternatively, oxygen contained in the insulator 224 and the like can be inhibited from being diffused to the substrate side through the insulator 214. Impurities such as water or hydrogen can be inhibited from being diffused to the transistor 200 side from the insulator 280, the conductor 246, and/or the like, which are provided above the insulator 272.

The resistivities of the insulator 214, the insulator 272, and the insulator 281 are preferably low in some cases. For example, by setting the resistivities of the insulator 214, the insulator 272, and the insulator 281 to approximately $1 \times 10^{13}$ $\Omega$cm, the insulator 214, the insulator 272, and the insulator 281 can sometimes reduce charge up of the conductor 205, the conductor 242, or the conductor 260 in treatment using plasma or the like in the manufacturing process of a semiconductor device. The resistivities of the insulator 214, the insulator 272, and the insulator 281 are preferably higher than or equal to $1 \times 10^{10}$ $\Omega$cm and lower than or equal to $1 \times 10^{15}$ $\Omega$cm.

The insulator 214 may have a stacked-layer structure. For example, a stacked-layer structure of an aluminum oxide film and a silicon nitride film is suitably used for the insulator 214. The aluminum oxide film enables oxygen to be supplied below the insulator 214. The silicon nitride film can inhibit diffusion of impurities such as hydrogen and water to the transistor 200 side from the substrate side.

The insulator 216, the insulator 280, and the insulator 274 preferably have a lower permittivity than the insulator 214. When a material with a low permittivity is used as an interlayer film, the parasitic capacitance generated between wirings can be reduced. As the insulator 216, the insulator 280, and the insulator 274, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide is used as appropriate, for example.

The insulator 222 and the insulator 224 have a function of a gate insulator.

Here, it is preferable that the insulator 224 in contact with the oxide 230 release oxygen by heating. In this specification, oxygen that is released by heating is referred to as excess oxygen in some cases. For example, silicon oxide, silicon oxynitride, or the like is used as appropriate for the insulator 224. When an insulator containing oxygen is provided in contact with the oxide 230, oxygen vacancies in the oxide 230 can be reduced and the reliability of the transistor 200 can be improved.

As the insulator 224, specifically, an oxide material from which part of oxygen is released by heating is preferably used. An oxide that releases oxygen by heating is an oxide film in which the amount of released oxygen converted into oxygen molecules is greater than or equal to $1.0 \times 10^{18}$ molecules/cm$^3$, preferably greater than or equal to $1.0 \times 10^{19}$ molecules/cm$^3$, further preferably greater than or equal to $2.0 \times 10^{19}$ molecules/cm$^3$ or greater than or equal to $3.0 \times 10^{20}$ molecules/cm$^3$ in TDS (Thermal Desorption Spectroscopy) analysis. Note that the temperature of the film surface in the TDS analysis is preferably within the range of 100° C. to 700° C., or 100° C. to 400° C.

The insulator 222 preferably functions as a barrier insulating film that inhibits impurities such as water or hydrogen from being mixed in the transistor 200 from the substrate side. For example, the insulator 222 preferably has lower hydrogen permeability than the insulator 224. Surrounding the insulator 224, the oxide 230, and the like by the insulator 222 and the insulator 272 can inhibit entry of impurities such as water or hydrogen into the transistor 200 from the outside.

Furthermore, the insulator 222 preferably has a function of inhibiting diffusion of oxygen (e.g., at least one of an oxygen atom, an oxygen molecule, and the like) (or is preferably less likely to transmit the above oxygen). For example, the insulator 222 preferably has lower oxygen permeability than the insulator 224. The insulator 222 preferably has a function of inhibiting diffusion of oxygen or impurities, in which case diffusion of oxygen contained in the oxide 230 into a layer under the insulator 222 can be reduced. Moreover, the conductor 205 can be inhibited from reacting with oxygen contained in the insulator 224 and the oxide 230.

As the insulator 222, an insulator containing an oxide of one or both of aluminum and hafnium, which is an insulating material, is preferably used. As the insulator containing an oxide of one or both of aluminum and hafnium, aluminum oxide, hafnium oxide, an oxide containing aluminum and hafnium (hafnium aluminate), or the like is preferably used. When the insulator 222 is formed using such a material, the insulator 222 functions as a layer that inhibits release of oxygen from the oxide 230 and mixing of impurities such as hydrogen from the periphery of the transistor 200 into the oxide 230.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

Alternatively, for example, a single layer or stacked layers of an insulator containing what is called a high-k material, such as aluminum oxide, hafnium oxide, tantalum oxide, zirconium oxide, lead zirconate titanate (PZT), strontium titanate ($SrTiO_3$), or $(Ba,Sr)TiO_3$ (BST), may be used as the insulator 222. With miniaturization and high integration of transistors, a problem such as leakage current may arise because of a thinner gate insulator. When a high-k material is used as an insulator functioning as the gate insulator, a gate potential during operation of the transistor can be lowered while the physical thickness of the gate insulator is kept.

Note that the insulator 222 and the insulator 224 may each have a stacked-layer structure of two or more layers. In that case, the stacked layers are not necessarily formed of the same material and may be formed of different materials.

The oxide 243 is provided over the oxide 230b, and the conductor 242 (the conductor 242a and the conductor 242b) functioning as the source electrode and the drain electrode is provided over the oxide 243. The thickness of the conductor 242 is greater than or equal to 1 nm and less than or equal to 50 nm, preferably greater than or equal to 2 nm and less than or equal to 25 nm, for example.

For the conductors 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

The insulator 250 functions as a gate insulator. The insulator 250 is preferably placed in contact with the top surface of the oxide 230c. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which have thermal stability, are preferable.

Like the insulator 224, the insulator 250 is preferably formed using an insulator from which oxygen is released by heating. When an insulator from which oxygen is released by heating is provided as the insulator 250 in contact with the top surface of the oxide 230c, oxygen can be efficiently supplied to the channel formation region of the oxide 230b. Furthermore, as in the insulator 224, the concentration of impurities such as water or hydrogen in the insulator 250 is preferably reduced. The thickness of the insulator 250 is preferably greater than or equal to 1 nm and less than or equal to 20 nm.

Furthermore, a metal oxide may be provided between the insulator 250 and the conductor 260. The metal oxide preferably inhibits diffusion of oxygen from the insulator 250 into the conductor 260. Providing the metal oxide that inhibits diffusion of oxygen inhibits diffusion of oxygen from the insulator 250 to the conductor 260. That is, a reduction in the amount of oxygen supplied to the oxide 230 can be inhibited. In addition, oxidation of the conductor 260 due to oxygen from the insulator 250 can be inhibited.

The metal oxide has a function of part of the gate insulator in some cases. Therefore, when silicon oxide, silicon oxynitride, or the like is used for the insulator 250, a metal oxide that is a high-k material with a high relative permittivity is preferably used as the metal oxide. When the gate insulator has a stacked-layer structure of the insulator 250 and the metal oxide, the stacked-layer structure can be thermally stable and have a high relative permittivity. Thus, agate potential that is applied during operation of the transistor can be reduced while the physical thickness of the gate insulator is maintained. Furthermore, the equivalent oxide thickness (EOT) of the insulator functioning as the gate insulator can be reduced.

Specifically, it is possible to use a metal oxide containing one kind or two or more kinds selected from hafnium, aluminum, gallium, yttrium, zirconium, tungsten, titanium, tantalum, nickel, germanium, magnesium, and the like. It is particularly preferable to use an insulator containing an oxide of one or both of aluminum and hafnium, such as aluminum oxide, hafnium oxide, or an oxide containing aluminum and hafnium (hafnium aluminate).

Alternatively, the metal oxide has a function of part of the gate electrode in some cases. In that case, the conductive material containing oxygen is preferably provided on the channel formation region side. When the conductive material containing oxygen is provided on the channel formation region side, oxygen released from the conductive material is more likely to be supplied to the channel formation region.

For the conductor functioning as the gate electrode, it is particularly preferable to use a conductive material containing oxygen and a metal element contained in a metal oxide where the channel is formed. Alternatively, a conductive material containing the above metal element and nitrogen may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen contained in the metal oxide where the channel is formed can be trapped in some cases. Alternatively, hydrogen entering from an external insulator or the like can be trapped in some cases.

Although the conductor 260 has a two-layer structure in FIG. 1, a single-layer structure or a stacked-layer structure of three or more layers may be employed.

For the conductor 260a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like).

In addition, when the conductor 260a has a function of inhibiting diffusion of oxygen, the conductivity of the conductor 260b can be inhibited from being lowered because of oxidation due to oxygen contained in the insulator 250. As a conductive material having a function of inhibiting diffusion of oxygen, for example, tantalum, tantalum nitride, ruthenium, ruthenium oxide, or the like is preferably used.

Moreover, a conductive material containing tungsten, copper, or aluminum as its main component is preferably used for the conductor 260b. The conductor 260 also functions as a wiring and thus is preferably formed using a conductor having high conductivity. For example, a conductive material containing tungsten, copper, or aluminum as its main component can be used. The conductor 260b may have a stacked-layer structure, for example, a stacked-layer structure of any of the above conductive materials and titanium or titanium nitride.

The insulator 280 preferably contain, for example, silicon oxide, silicon oxynitride, silicon nitride oxide, silicon oxide to which fluorine is added, silicon oxide to which carbon is added, silicon oxide to which carbon and nitrogen are added, porous silicon oxide, or the like. In particular, silicon oxide and silicon oxynitride, which have thermal stability, are preferable. Materials such as silicon oxide, silicon oxynitride, and porous silicon oxide, in each of which a region containing oxygen released by heating can be easily formed, are particularly preferable.

The concentration of impurities such as water or hydrogen in the insulator 280 is preferably reduced. In addition, the top surface of the insulator 280 may be planarized.

The insulator 282 preferably functions as a barrier insulating film that inhibits impurities such as water or hydrogen from entering the insulator 280 from the above. As the insulator 282, an insulator such as aluminum oxide, silicon nitride, or silicon nitride oxide is used, for example.

The insulator 274 functioning as an interlayer film is preferably provided over the insulator 282. As in the insulator 224 and the like, the concentration of impurities such as water or hydrogen in the insulator 274 is preferably lowered.

For the conductor 240a and the conductor 240b, a conductive material containing tungsten, copper, or aluminum as its main component is preferably used. The conductor 240a and the conductor 240b may each have a stacked-layer structure.

In the case where the conductor 240 has a stacked-layer structure, a conductive material having a function of inhibiting transmission of impurities such as water or hydrogen is preferably used for a conductor in contact with the insulator 281, the insulator 274, the insulator 282, the insulator 280, the insulator 273, and the insulator 272. For example, tantalum, tantalum nitride, titanium, titanium nitride, ruthenium, ruthenium oxide, or the like is preferably used. A single layer or a stacked layer of the conductive material having a function of inhibiting transmission of impurities such as water or hydrogen may be used. The use of the conductive material can prevent oxygen added to the insulator 280 from being absorbed by the conductor 240a and the conductor 240b. Moreover, impurities such as water or hydrogen can be inhibited from being mixed in the oxide 230 through the conductor 240a and the conductor 240b from a layer above the insulator 281.

As the insulator 241a and the insulator 241b, an insulator such as aluminum oxide, silicon nitride, or silicon nitride oxide is used, for example. Since the insulator 241a and the insulator 241b are provided in contact with the insulator 272 and the insulator 273, impurities such as water or hydrogen can be inhibited from being mixed into the oxide 230 through the conductor 240a and the conductor 240b from the insulator 280 or the like.

The conductor 246 (the conductor 246a and the conductor 246b) functioning as a wiring may be provided in contact with the top surface of the conductor 240a and the top surface of the conductor 240b. The conductor 246 is preferably formed using a conductive material containing tungsten, copper, or aluminum as its main component. Furthermore, the conductor may have a stacked-layer structure and may be a stack of titanium or titanium nitride and any of the above conductive materials, for example. Note that the conductor may be formed to be embedded in an opening provided in an insulator.

<Constituent Materials of Semiconductor Device>

Constituent materials that can be used for the semiconductor device are described below.

<Substrate>

As a substrate where the transistor 200 is formed, an insulator substrate, a semiconductor substrate, or a conductor substrate is used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate using silicon, germanium, or the like as a material and a compound semiconductor substrate including silicon carbide, silicon germanium, gallium arsenide, indium phosphide, zinc oxide, or gallium oxide. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor, a resistor, a switching element, a light-emitting element, and a memory element.

<Insulator>

Examples of an insulator include an oxide, a nitride, an oxynitride, a nitride oxide, a metal oxide, a metal oxynitride, and a metal nitride oxide, each of which has an insulating property.

As miniaturization and high integration of transistors progress, for example, a problem such as leakage current may arise because of a thinner gate insulator. When a high-k material is used as the insulator functioning as a gate insulator, the voltage during operation of the transistor can be lowered while the physical thickness of the gate insulator is maintained. In contrast, when a material with a low relative permittivity is used as the insulator functioning as an interlayer film, parasitic capacitance generated between wirings can be reduced. Thus, a material is preferably selected depending on the function of an insulator.

Examples of the insulator with a high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low relative permittivity include silicon oxide, silicon oxynitride, silicon nitride oxide, silicon oxide to which fluorine is added, silicon oxide to which carbon is added, silicon oxide to which carbon and nitrogen are added, porous silicon oxide, and a resin.

When a transistor using an oxide semiconductor is surrounded by an insulator having a function of inhibiting transmission of oxygen and impurities such as hydrogen, the electrical characteristics of the transistor can be stable. As the insulator having a function of inhibiting transmission of oxygen and impurities such as hydrogen, a single layer or stacked layers of an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum are used, for example. Specifically, as the insulator having a function of inhibiting transmission of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide or a metal nitride such as aluminum nitride, aluminum titanium nitride, titanium nitride, silicon nitride oxide, or silicon nitride can be used.

The insulator functioning as the gate insulator is preferably an insulator including a region containing oxygen released by heating. For example, when a structure is employed in which silicon oxide or silicon oxynitride including a region containing oxygen released by heating is in contact with the oxide 230, oxygen vacancies included in the oxide 230 can be compensated for.

<Conductor>

For the conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. A semiconductor having high electrical conductivity, typified by polycrystalline silicon containing an impurity element such as phosphorus, or silicide such as nickel silicide may be used.

A stack including a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed.

Note that when an oxide is used as the channel formation region of the transistor, a stacked-layer structure in which a material containing the above metal element and a conductive material containing oxygen are combined is preferably used as the conductor functioning as the gate electrode. In that case, the conductive material containing oxygen is preferably provided on the channel formation region side. When the conductive material containing oxygen is provided on the channel formation region side, oxygen released from the conductive material is more likely to be supplied to the channel formation region.

It is particularly preferable to use, for the conductor functioning as the gate electrode, a conductive material containing oxygen and a metal element contained in a metal oxide where the channel is formed. Alternatively, a conductive material containing the above metal element and nitrogen may be used. For example, a conductive material containing nitrogen, such as titanium nitride or tantalum nitride, may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen contained in the metal oxide where the channel is formed can be trapped in some cases. Alternatively, hydrogen entering from an external insulator or the like can be trapped in some cases.

<Metal Oxide>

As the oxide 230, a metal oxide functioning as an oxide semiconductor is preferably used. A metal oxide that can be used as the oxide 230 according to the present invention is described below.

The metal oxide preferably contains at least indium or zinc. In particular, indium and zinc are preferably contained. Furthermore, aluminum, gallium, yttrium, tin, or the like is preferably contained in addition to them. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, an element M, and zinc is considered. Note that the element M is aluminum, gallium, yttrium, tin, or the like. of other elements that can be used as the element M include boron, titanium, iron, nickel, germanium, zirconium, molybdenum, lanthanum, cerium, neodymium, hafnium, tantalum, tungsten, and magnesium. Note that it is sometimes acceptable to use a plurality of the above elements in combination as the element M.

Note that in this specification and the like, a metal oxide containing nitrogen is also collectively referred to as a metal oxide in some cases. A metal oxide containing nitrogen may be referred to as a metal oxynitride.

[Structure of Metal Oxide]

Oxide semiconductors (metal oxides) can be classified into a single crystal oxide semiconductor and a non-single-crystal oxide semiconductor. Examples of the non-single-crystal oxide semiconductors include a CAAC-OS, a polycrystalline oxide semiconductor, an nc-OS, an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

The CAAC-OS tends to have a layered crystal structure (also referred to as a layered structure) in which a layer containing indium and oxygen (hereinafter referred to as an In layer) and a layer containing the element M, zinc, and oxygen (hereinafter referred to as an (M,Zn) layer) are stacked. Note that indium and the element M can be replaced with each other, and when the element M in the (M,Zn) layer is replaced with indium, the layer can be referred to as an (In,M,Zn) layer. Furthermore, when indium in the In layer is replaced with the element M, the layer can be referred to as an (In,M) layer.

The CAAC-OS is a metal oxide with high crystallinity. By contrast, in the CAAC-OS, a reduction in electron mobility due to the crystal grain boundary is less likely to occur because it is difficult to observe a clear crystal grain boundary. Entry of impurities, formation of defects, or the like might decrease the crystallinity of a metal oxide; thus, it can be said that the CAAC-OS is a metal oxide that has small amounts of impurities and defects (e.g., oxygen vacancies (also referred to as Vo)). Thus, a metal oxide including a CAAC-OS is physically stable. Therefore, the metal oxide including a CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

Note that indium-gallium-zinc oxide (hereinafter referred to as IGZO) that is a kind of metal oxide containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS includes a void or a low-density region. That is, the a-like OS has low crystallinity compared with the nc-OS and the CAAC-OS.

An oxide semiconductor (metal oxide) can have various structures that show different properties. An oxide semiconductor of one embodiment of the present invention may include two or more of an amorphous oxide semiconductor, a polycrystalline oxide semiconductor, the a-like OS, the nc-OS, and the CAAC-OS.

Note that there is no particular limitation on a structure of an oxide semiconductor (metal oxide) in the semiconductor device of one embodiment of the present invention; however, the oxide semiconductor preferably has crystallinity. For example, the oxide 230 can have a CAAC-OS structure and the oxide 243 can have a hexagonal crystal structure. The semiconductor device can have high reliability when the oxide 230 and the oxide 243 have the above crystal structures. Moreover, the oxide 230a, the oxide 230c, and the oxide 243 can have substantially the same composition.

[Impurities]

Here, the influence of each impurity in the metal oxide will be described.

When the metal oxide contains an alkali metal or an alkaline earth metal, defect states are formed and carriers are generated in some cases. Thus, a transistor using a metal oxide that contains an alkali metal or an alkaline earth metal for its channel formation region is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide obtained by SIMS (the concentration obtained by secondary ion mass spectrometry (SIMS)) is set lower than or equal to $1\times10^{18}$ atoms/cm$^3$, preferably lower than or equal to $2\times10^{16}$ atoms/cm$^3$.

Hydrogen contained in a metal oxide reacts with oxygen bonded to a metal atom to be water, and thus forms an oxygen vacancy in some cases. When hydrogen enters the oxygen vacancy, an electron which is a carrier is generated in some cases. Furthermore, in some cases, bonding of part of hydrogen to oxygen bonded to a metal atom causes generation of an electron serving as a carrier. Thus, a transistor using a metal oxide containing hydrogen is likely to have normally-on characteristics.

Accordingly, hydrogen in the metal oxide is preferably reduced as much as possible. Specifically, the hydrogen concentration of the metal oxide obtained by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide in which the impurities are sufficiently reduced is used in a channel formation region of a transistor, stable electrical characteristics can be given.

As a metal oxide used as a semiconductor of a transistor, a thin film having high crystallinity is preferably used. With the use of the thin film, the stability or reliability of the transistor can be improved. Examples of the thin film include a thin film of a single-crystal metal oxide and a thin film of a polycrystalline metal oxide. However, to form a thin film of a single-crystal metal oxide or a thin film of a polycrystalline metal oxide over a substrate, a high-temperature process or a laser heating process is needed. Thus, manufacturing cost is increased, and throughput is decreased.

Non-Patent Document 1 and Non-Patent Document 2 have reported that an In—Ga—Zn oxide having a CAAC structure (referred to as CAAC-IGZO) was found in 2009. It has been reported that CAAC-IGZO has c-axis alignment, a crystal grain boundary is not clearly observed in CAAC-IGZO, and CAAC-IGZO can be formed over a substrate at low temperatures. It has also been reported that a transistor using CAAC-IGZO has excellent electrical characteristics and high reliability.

In addition, an In—Ga—Zn oxide having an nc structure (referred to as nc-IGZO) was found in 2013 (see Non-Patent Document 3). It has been reported that nc-IGZO has a periodic atomic arrangement in a microscopic region (e.g., a region with a size greater than or equal to 1 nm and less than or equal to 3 nm) and there is no regularity of crystal orientation between different regions.

Non-Patent Document 4 and Non-Patent Document 5 have shown changes in average crystal size due to electron beam irradiation to thin films of the CAAC-IGZO, the nc-IGZO, and IGZO having low crystallinity. In the thin film of IGZO having low crystallinity, crystalline IGZO with a size of approximately 1 nm was observed even before electron beam irradiation. Thus, it has been reported that the existence of a completely amorphous structure could not be observed in IGZO. In addition, it has been shown that the thin film of CAAC-IGZO and the thin film of nc-IGZO each have higher stability against electron beam irradiation than the thin film of IGZO having low crystallinity. Thus, the thin film of CAAC-IGZO or the thin film of nc-IGZO is preferably used as the semiconductor of the transistor.

Non-Patent Document 6 shows that a transistor using a metal oxide has an extremely low leakage current in an off state, and specifically, the off-state current per micrometer of channel width of the transistor is on the order of yA/µm ($10^{-24}$ A/µm). For example, a low-power-consumption CPU applying a characteristic of low leakage current of a transistor using a metal oxide is disclosed (see Non-Patent Document 7).

Furthermore, application of a transistor using a metal oxide to a display device that utilizes the characteristic of low leakage current of the transistor has been reported (see Non-Patent Document 8). In the display device, a displayed image is changed several tens of times per second. The number of times images are changed in one second is referred to as a refresh rate. The refresh rate is also referred to as drive frequency. Such high-speed screen change that is hard for human eyes to recognize is considered as a cause of eyestrain. Accordingly, reducing the number of times of image rewriting by lowering the refresh rate of the display device is proposed. Moreover, driving with a lowered refresh rate can reduce the power consumption of the display device. Such a driving method is referred to as idling stop driving.

The discovery of the CAAC structure and the nc structure has contributed to an improvement in electrical characteristics and reliability of a transistor using a metal oxide having the CAAC structure or the nc structure, a reduction in manufacturing cost, and an improvement in throughput. Furthermore, applications of the transistor to a display device and LSI utilizing the characteristics of low leakage current of the transistor have been studied.

<Manufacturing Method of Semiconductor Device>

Next, a method for manufacturing a semiconductor device including the transistor 200 according to the present invention, which is illustrated in FIG. 1, will be described with reference to FIG. 4 to FIG. 11. In FIG. 4 to FIG. 11, (A) of each drawing is a top view. Moreover, (B) of each drawing is a cross-sectional view corresponding to a portion indicated by the dashed-dotted line A1-A2 in (A), and is also a cross-sectional view of the transistor 200 in the channel length direction. Furthermore, (C) of each drawing is a cross-sectional view corresponding to a portion indicated by the dashed-dotted line A3-A4 in (A), and is also a cross-sectional view in the channel width direction of the transistor 200. Note that for simplification of the drawings, some components are not illustrated in the top view of (A) of each drawing.

First, a substrate (not shown) is prepared, and the insulator 214 is deposited over the substrate. The insulator 214 can be deposited by a sputtering method, a chemical vapor deposition (CVD) method, a molecular beam epitaxy (MBE) method, a pulsed laser deposition (PLD) method, an atomic layer deposition (ALD) method, or the like.

Note that the CVD method can be classified into a plasma enhanced CVD (PECVD) method using plasma, a thermal CVD (TCVD) method using heat, a photo CVD method using light, and the like. Moreover, the CVD method can be classified into a metal CVD (MCVD) method and a metal organic CVD (MOCVD) method depending on a source gas to be used.

By a plasma CVD method, a high-quality film can be obtained at a relatively low temperature. Furthermore, a thermal CVD method is a deposition method that does not use plasma and thus enables less plasma damage to an object to be processed. For example, a wiring, an electrode, an element (a transistor, a capacitor, or the like), or the like included in a semiconductor device might be charged up by receiving electric charge from plasma. In that case, accumulated electric charge might break the wiring, the electrode, the element, or the like included in the semiconductor device. In contrast, such plasma damage does not occur in the case of a thermal CVD method, which does not use plasma, and thus the yield of the semiconductor device can be increased. In addition, a thermal CVD method does not cause plasma damage during deposition, so that a film with few defects can be obtained.

In an ALD method, one atomic layer can be deposited at a time using self-regulating characteristics of atoms. Hence, an ALD method has effects such as deposition of an extremely thin film, deposition on a component with a high aspect ratio, deposition of a film with a small number of defects such as pinholes, deposition with excellent coverage, and low-temperature deposition. An ALD method includes a PEALD (Plasma Enhanced ALD) method, which is a deposition method using plasma. The use of plasma is sometimes preferable because deposition at lower temperature is possible. Note that a precursor used in an ALD method sometimes contains impurities such as carbon. Thus, in some cases, a film provided by an ALD method contains impurities such as carbon in a larger amount than a film provided by another deposition method. Note that impurities can be quantified by X-ray photoelectron spectroscopy (XPS).

Unlike a deposition method in which particles ejected from a target or the like are deposited, a CVD method and an ALD method are deposition methods in which a film is formed by reaction at a surface of an object. Thus, a CVD method and an ALD method are deposition methods that enable favorable step coverage almost regardless of the shape of an object. In particular, an ALD method has excellent step coverage and excellent thickness uniformity, and thus is suitable for covering a surface of an opening with a high aspect ratio, for example. On the other hand, an ALD method has a relatively low deposition rate, and thus is sometimes preferably used in combination with another deposition method with a high deposition rate, such as a CVD method.

When a CVD method or an ALD method is used, the composition of a film to be obtained can be controlled with the flow rate ratio of source gases. For example, by a CVD method or an ALD method, a film with a certain composition can be deposited depending on the flow rate ratio of the source gases. As another example, with a CVD method or an ALD method, by changing the flow rate ratio of the source gases while depositing the film, a film whose composition is continuously changed can be formed. In the case where the film is deposited while changing the flow rate ratio of the source gases, as compared to the case where the film is deposited using a plurality of deposition chambers, the time taken for the deposition can be shortened because the time taken for transfer and pressure adjustment is omitted. Thus, the productivity of the semiconductor device can be increased in some cases.

In this embodiment, for the insulator 214, silicon nitride is deposited by a CVD method. As described here, an insulator through which copper is less likely to pass, such as silicon nitride, is used for the insulator 214; accordingly, even when a metal that is likely to diffuse, such as copper, is used for a conductor in a layer (not illustrated) below the insulator 214, diffusion of the metal into a layer above the insulator 214 can be inhibited.

Next, the insulator 216 is deposited over the insulator 214. The insulator 216 can be deposited by a sputtering method, a CVD method, an MBE method, a PLD method, an ALD method, or the like.

Then, an opening reaching the insulator 214 is formed in the insulator 216. A groove and a slit, for example, are included in the category of the opening. A region where an opening is formed may be referred to as an opening portion. Wet etching can be used for the formation of the opening; however, dry etching is preferably used for microfabrication. As the insulator 214, it is preferable to select an insulator that functions as an etching stopper film used in forming the groove by etching the insulator 216. For example, in the case where a silicon oxide film is used as the insulator 216 in which the groove is to be formed, a silicon nitride film, an aluminum oxide film, or a hafnium oxide film is preferably used as the insulator 214.

After the formation of the opening, a conductive film to be the conductor 205 is deposited. The conductive film preferably includes a conductor that has a function of inhibiting transmission of oxygen. For example, tantalum nitride, tungsten nitride, or titanium nitride can be used. Alternatively, a stacked-layer film with tantalum, tungsten, titanium, molybdenum, aluminum, copper, or a molybdenum-tungsten alloy can be used. The conductive film to be the conductor 205 can be deposited by a sputtering method, a CVD method, an MBE method, a PLD method, an ALD method, or the like.

In this embodiment, the conductive film to be the conductor 205 has a multilayer structure. First, tantalum nitride is deposited by a sputtering method, and titanium nitride is stacked over the tantalum nitride. Even when a metal that is likely to diffuse, such as copper, is used for a below-mentioned upper layer of the conductive film to be the conductor 205, the use of such metal nitrides for a lower layer of the conductive film to be the conductor 205 can prevent outward diffusion of the metal from the conductor 205.

Next, a conductive film that is the upper layer of the conductive film to be the conductor 205 is deposited. The conductive film can be deposited by a plating method, a sputtering method, a CVD method, an MBE method, a PLD method, an ALD method, or the like. In this embodiment, for the conductive film that is the upper layer of the conductive film to be the conductor 205, a low-resistance conductive material such as copper is deposited.

Next, CMP treatment (Chemical Mechanical Polishing) is performed, thereby removing part of the upper layer of the conductive film to be the conductor 205 and part of the lower layer the conductive film to be the conductor 205 to expose the insulator 216. As a result, the conductive film to be the conductor 205 remains only in the opening portion. Thus, the conductor 205 whose top surface is flat can be formed. Note that the insulator 216 is partly removed by the CMP treatment in some cases (see FIG. 4).

Here, a method for forming the conductor 205 which is different from the above will be described below.

A conductive film to be the conductor 205 is deposited over the insulator 214. The conductive film to be the conductor 205 can be deposited by a sputtering method, a CVD method, an MBE method, a PLD method, an ALD method, or the like. The conductive film to be the conductor 205 can be a multilayer film. In this embodiment, tungsten is deposited for the conductive film to be the conductor 205.

Next, the conductive film to be the conductor 205 is processed by a lithography method, so that the conductor 205 is formed.

Note that in the lithography method, first, a resist is exposed to light through a mask. Next, a region exposed to light is removed or left using a developer, so that a resist mask is formed. Then, etching treatment through the resist mask is conducted, whereby a conductor, a semiconductor, an insulator, or the like can be processed into a desired shape. The resist mask is formed by, for example, exposure of the resist to light such as KrF excimer laser light, ArF excimer laser light, EUV (Extreme Ultraviolet) light, or the like. Alternatively, a liquid immersion technique may be employed in which a gap between a substrate and a projection lens is filled with liquid (e.g., water) in light exposure. Alternatively, an electron beam or an ion beam may be used instead of the light. Note that a mask is unnecessary in the case of using an electron beam or an ion beam. Note that the resist mask can be removed by dry etching treatment such as ashing, wet etching treatment, wet etching treatment after dry etching treatment, or dry etching treatment after wet etching treatment.

In addition, a hard mask formed of an insulator or a conductor may be used instead of the resist mask. In the case where a hard mask is used, a hard mask with a desired shape can be formed by forming an insulating film or a conductive film that is the hard mask material over the conductive film to be the conductor 205, forming a resist mask thereover, and then etching the hard mask material. The etching of the conductive film to be the conductor 205 may be performed after removing the resist mask or with the resist mask remaining. In the latter case, the resist mask sometimes disappears during the etching. The hard mask may be removed by etching after the etching of the conductive film to be the conductor 205. Meanwhile, the hard mask is not necessarily removed when the hard mask material does not affect subsequent steps or can be utilized in the subsequent steps.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency power is applied to one of the parallel plate electrodes. Alternatively, a structure may be employed in which different high-frequency powers are applied to one of the parallel plate electrodes. Alternatively, a structure may be employed in which high-frequency powers with the same frequency are applied to the parallel plate electrodes. Alternatively, a structure may be employed in which high-frequency powers with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus or the like can be used, for example.

Next, an insulating film to be the insulator 216 is deposited over the insulator 214 and the conductor 205. The insulator to be insulator 216 can be deposited by a sputtering method, a CVD method, an MBE method, a PLD method, an ALD method, or the like. In this embodiment, for the insulating film to be insulator 216, silicon oxide is deposited by a CVD method.

Here, the thickness of the insulating film to be the insulator 216 is preferably greater than or equal to the thickness of the conductor 205. For example, when the thickness of the conductor 205 is 1, the thickness of the insulating film to be the insulator 216 is greater than or equal to 1 and less than or equal to 3. In this embodiment, the thickness of the conductor 205 is 150 nm, and the thickness of the insulating film to be the insulator 216 is 350 nm.

Next, CMP treatment is performed on the insulating film to be the insulator 216, so that part of the insulating film to be the insulator 216 is removed and a surface of the conductor 205 is exposed. Thus, the conductor 205 and the insulator 216 whose top surfaces are flat can be formed. The above is the different formation method of the conductor 205.

Next, the insulator 222 is deposited over the insulator 216 and the conductor 205. An insulator containing an oxide of one or both of aluminum and hafnium is preferably deposited as the insulator 222. Note that as the insulator containing an oxide of one or both of aluminum and hafnium, aluminum oxide, hafnium oxide, an oxide containing aluminum and hafnium (hafnium aluminate), or the like is preferably used. The insulator containing an oxide of one or both of aluminum and hafnium has a barrier property against oxygen, hydrogen, and water. When the insulator 222 has a barrier property against hydrogen and water, hydrogen and water contained in components provided around the transistor 200 are inhibited from diffusing into the transistor 200 through the insulator 222, and generation of oxygen vacancies in the oxide 230 can be inhibited.

The insulator 222 can be deposited by a sputtering method, a CVD method, an MBE method, a PLD method, an ALD method, or the like.

Then, an insulating film 224A is deposited over the insulator 222. The insulating film 224A can be deposited by a sputtering method, a CVD method, an MBE method, a PLD method, an ALD method, or the like.

Sequentially, heat treatment is preferably performed. The heat treatment is performed at a temperature higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is performed in a nitrogen atmosphere, an inert gas atmosphere, or an atmosphere containing an oxidizing gas at 10 ppm or more, 1% or more, or 10% or more. Alternatively, the heat treatment may be performed under reduced pressure. Alternatively, the heat treatment may be performed in such a manner that heat treatment is performed in a nitrogen atmosphere or an inert gas atmosphere, and then another heat treatment is performed in an atmosphere containing an oxidizing gas at 10 ppm or more, 1% or more, or 10% or more in order to compensate for released oxygen.

In this embodiment, treatment is performed at 400° C. in a nitrogen atmosphere for one hour, and treatment is successively performed at 400° C. in an oxygen atmosphere for one hour. By the heat treatment, impurities such as water and hydrogen contained in the insulating film 224A can be removed.

Heat treatment may be performed after the insulator 222 is deposited. For the heat treatment, the above-described heat treatment conditions can be used.

Here, in order to form an excess-oxygen region in the insulating film 224A, plasma treatment with oxygen may be performed under reduced pressure. For the plasma treatment with oxygen, an apparatus including a power source for generating high-density plasma using microwaves is preferably used, for example. Alternatively, a power source for applying an RF (Radio Frequency) to a substrate side may be included. The use of high-density plasma enables high-density oxygen radicals to be produced, and RF application to the substrate side allows the oxygen radicals generated by the high-density plasma to be efficiently introduced into the insulating film 224A. Alternatively, after plasma treatment with an inert gas is performed using this apparatus, plasma treatment with oxygen may be performed to compensate for released oxygen. Note that impurities such as water and hydrogen contained in the insulating film 224A can be removed by selecting the conditions for the plasma treatment appropriately. In that case, the heat treatment does not need to be performed.

Here, aluminum oxide may be deposited over the insulating film 224A by a sputtering method, for example, and then CMP may be performed until the insulating film 224A is exposed. The CMP can planarize the surface of the insulating film 224A and smooth the surface of the insulating film 224A. When the CMP is performed on the aluminum oxide placed over the insulating film 224A, it is easy to detect the endpoint of CMP. Part of the insulating film 224A may be polished by the CMP so that the thickness of the insulating film 224A may be reduced; the thickness of the insulating film 224A is adjusted at the time of the deposition. Planarizing and smoothing the surface of the insulating film 224A can sometimes prevent a decrease in the coverage with an oxide deposited later and a decrease in the yield of the semiconductor device. The deposition of aluminum oxide over the insulating film 224A by a sputtering method is preferred because oxygen can be added to the insulating film 224A.

Figure 4A:
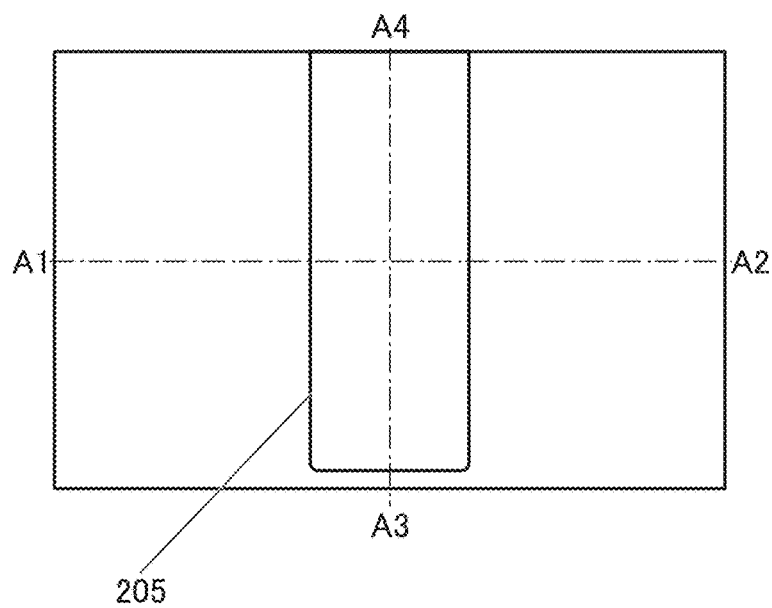
FIG. 4(A) is a top view illustrating a method for manufacturing a semiconductor device.
Figure 4C:
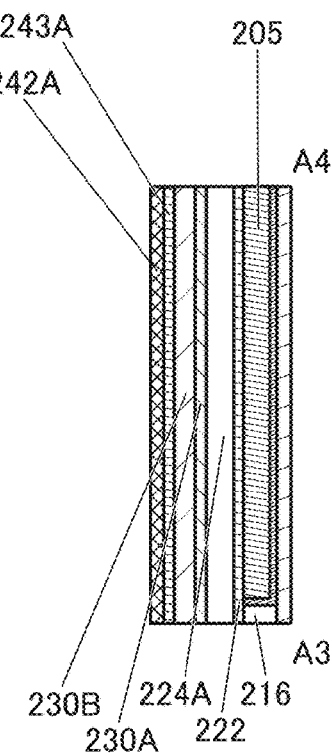
FIG. 4(B) and FIG. 4(C) are cross-sectional views illustrating the method for manufacturing the semiconductor device.
Figure 4B:
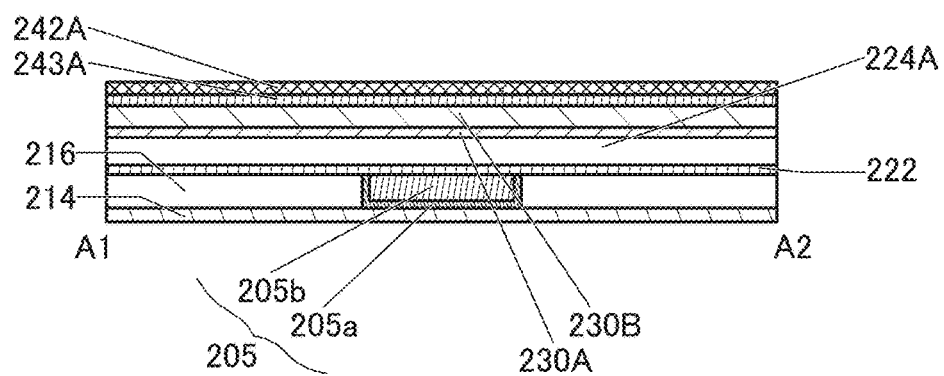

Next, an oxide film 230A and an oxide film 230B are deposited in this order over the insulating film 224A (see FIG. 4). Note that the oxide films are preferably deposited successively without being exposed to an air atmosphere. By the deposition without exposure to the air, impurities or moisture from the atmospheric environment can be prevented from being attached onto the oxide film 230A and the oxide film 230B, so that the vicinity of the interface between the oxide film 230A and the oxide film 230B can be kept clean.

The oxide film 230A and the oxide film 230B can be deposited by a sputtering method, a CVD method, an MBE method, a PLD method, an ALD method, or the like.

For example, in the case where the oxide film 230A and the oxide film 230B are deposited by a sputtering method, oxygen or a mixed gas of oxygen and a rare gas is used as a sputtering gas. Increasing the proportion of oxygen contained in the sputtering gas can increase the amount of excess oxygen in the deposited oxide films. In the case where the above oxide films are deposited by a sputtering method, a target of the above-described In-M-Zn oxide can be used.

In particular, at the time of depositing the oxide film 230A, part of oxygen contained in the sputtering gas is supplied to the insulating film 224A in some cases. Therefore, the proportion of oxygen contained in the sputtering gas for the oxide film 230A is preferably 70% or higher, further preferably 80% or higher, still further preferably 100%.

In the case where the oxide film 230B is formed by a sputtering method, when the proportion of oxygen contained in the sputtering gas is higher than or equal to 1% and lower than or equal to 30%, preferably higher than or equal to 5% and lower than or equal to 20% during the deposition, an oxygen-deficient oxide semiconductor is formed. A transistor in which an oxygen-deficient oxide semiconductor is used for its channel formation region can have relatively high field-effect mobility.

In this embodiment, the oxide film 230A is deposited by a sputtering method using a target with In:Ga:Zn=1:1:0.5 [atomic ratio] (2:2:1 [atomic ratio]) or 1:3:4 [atomic ratio]. The oxide film 230B is deposited by a sputtering method using a target with In:Ga:Zn=4:2:4.1 [atomic ratio] or 1:1:1 [atomic ratio]. Note that each of the oxide films is formed to have characteristics required for the oxide 230 by selecting the deposition condition and the atomic ratio as appropriate.

Next, heat treatment may be performed. For the heat treatment, the above-described heat treatment conditions can be used. Through the heat treatment, impurities such as water and hydrogen in the oxide film 230A and the oxide film 230B can be removed, for example. In this embodiment, treatment is performed at 400° C. in a nitrogen atmosphere for one hour, and treatment is successively performed at 400° C. in an oxygen atmosphere for one hour.

Next, a conductive film 243A is deposited over the oxide film 230B. The oxide film 243A can be deposited by a sputtering method, a CVD method, an MBE method, a PLD method, an ALD method, or the like. The atomic ratio of Ga to In in the oxide film 243A is preferably greater than the atomic ratio of Ga to In in the oxide film 230B. In this embodiment, the oxide film 243A is formed by a sputtering method using a target with In:Ga:Zn=1:3:4 [atomic ratio]. Then, a conductive film 242A is deposited over the oxide film 243A. The conductive film 242A can be formed by a sputtering method, a CVD method, an MBE method, a PLD method, an ALD method, or the like (see FIG. 4).

Figure 5A:
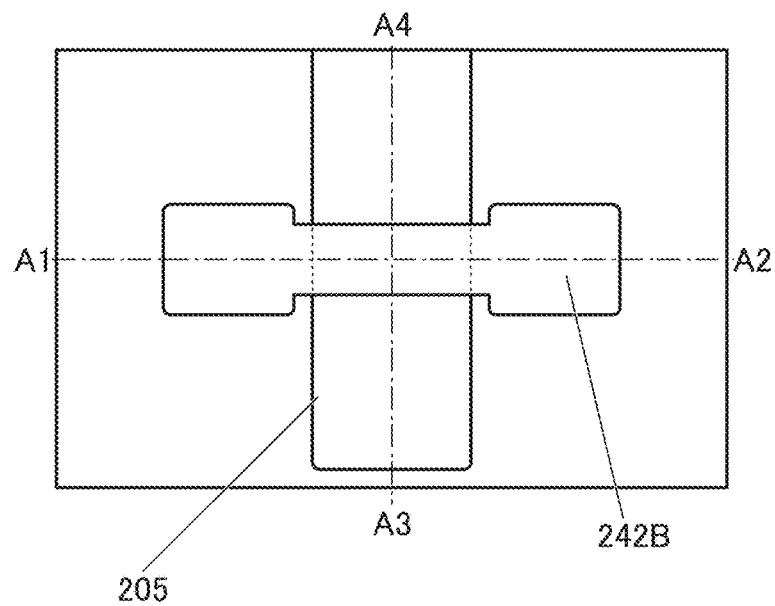
FIG. 5(A) is a top view illustrating a method for manufacturing a semiconductor device.
Figure 5C:
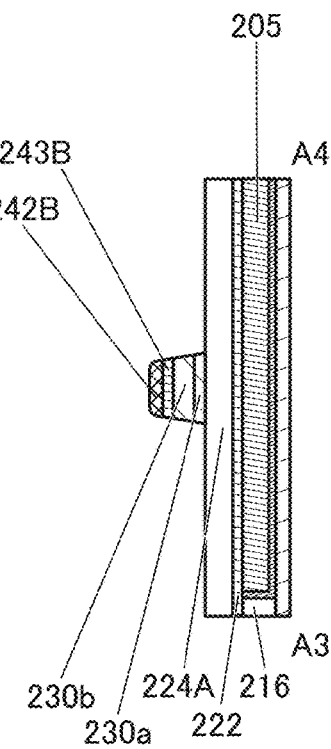
FIG. 5(B) and FIG. 5(C) are cross-sectional views illustrating the method for manufacturing the semiconductor device.
Figure 5B:
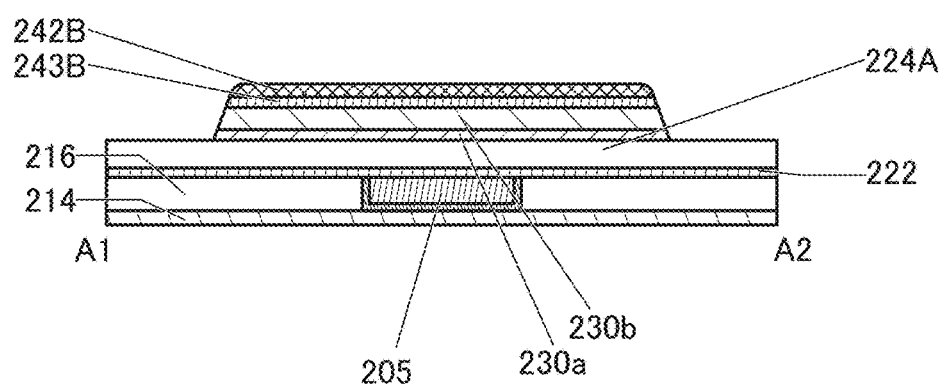

Next, the oxide film 230A, the oxide film 230B, the oxide film 243A, and the conductive film 242A are processed into island shapes to form the oxide 230a, the oxide 230b, an oxide layer 243B, and a conductor layer 242B (see FIG. 5). Note that although not illustrated, in this step, the thickness of the region of the insulating film 224A that does not overlap with the oxide 230a is reduced in some cases.

Here, the oxide 230a, the oxide 230b, the oxide layer 243B, and the conductor layer 242B are formed to at least partly overlap with the conductor 205. It is preferable that the side surfaces of the oxide 230a, the oxide 230b, the oxide layer 243B, and the conductor layer 242B be substantially perpendicular to the top surface of the insulator 222. When the side surfaces of the oxide 230a, the oxide 230b, the oxide layer 243B, and the conductor layer 242B are substantially perpendicular to the top surface of the insulator 222, a plurality of transistors 200 can be provided in a smaller area and at a higher density. Alternatively, a structure may be employed in which an angle formed by the oxide 230a, the oxide 230b, the oxide layer 243B, and the conductor layer 242B and the top surface of the insulator 222 is an acute angle. In that case, the angle formed by the side surfaces of the oxide 230a, the oxide 230b, the oxide layer 243B, and the conductor layer 242B and the top surface of the insulator 222 is preferably greater than or equal to 60° and less than 70°. With such a shape, in later steps, the coverage with the insulator 272 and the like can be improved, so that defects such as a void can be reduced.

There is a curved surface between the side surface of the conductor layer 242B and the top surface of the conductor layer 242B. That is, an end portion of the side surface and an end portion of the top surface are preferably curved (hereinafter such a curved shape is also referred to as a rounded shape). The radius of curvature of the curved surface at an end portion of the conductor layer 242B is greater than or equal to 3 nm and less than or equal to 10 nm, preferably greater than or equal to 5 nm and less than or equal to 6 nm, for example. When the end portions are not angular, coverage with films in later deposition steps is improved.

Note that the oxide films and the conductive film are processed by a lithography method. A dry etching method or a wet etching method can be used for the processing. Processing by a dry etching method is suitable for microfabrication.

Figure 6A:
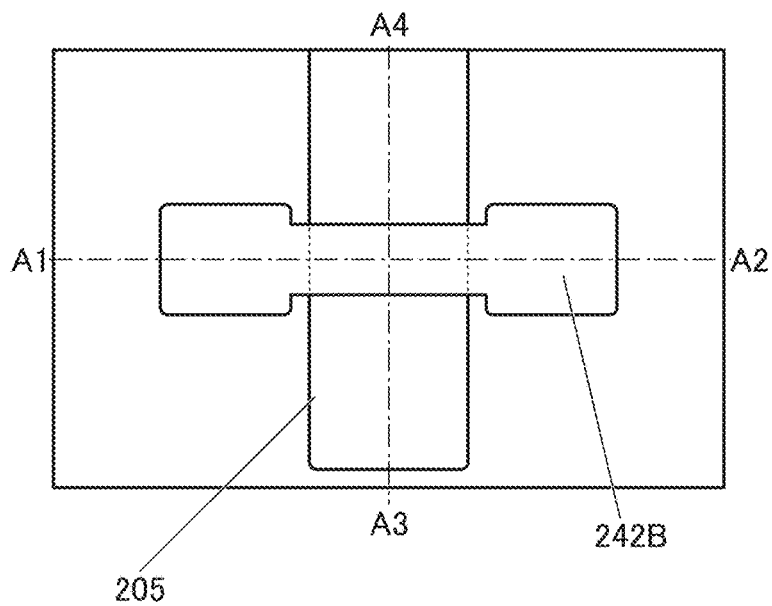
FIG. 6(A) is a top view illustrating a method for manufacturing a semiconductor device.
Figure 6C:
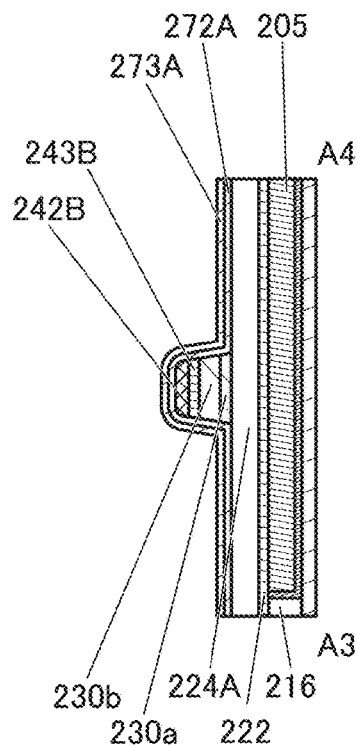
FIG. 6(B) and FIG. 6(C) are cross-sectional views illustrating the method for manufacturing the semiconductor device.
Figure 6B:
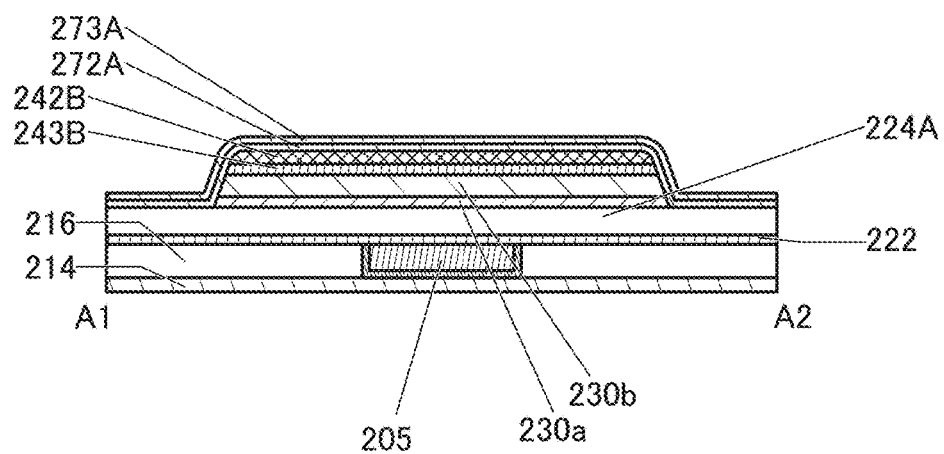
Figure 7A:
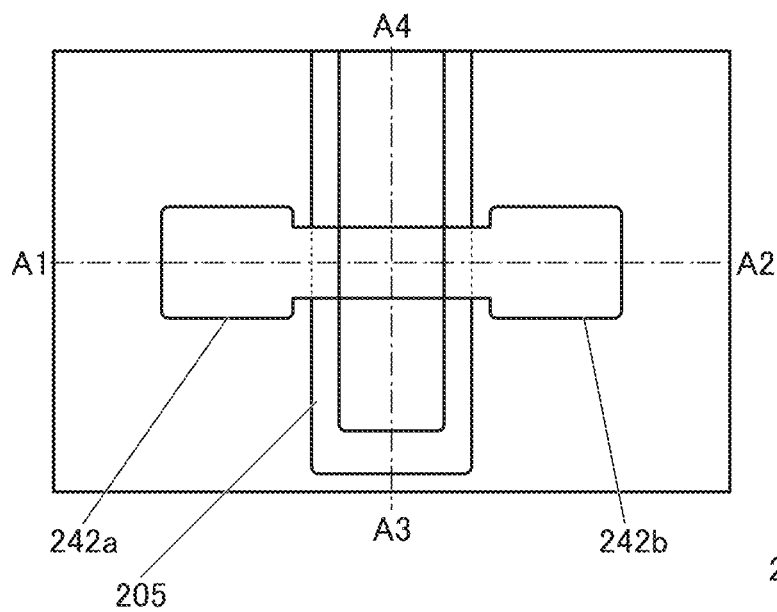
FIG. 7(A) is a top view illustrating a method for manufacturing a semiconductor device.
Figure 7C:
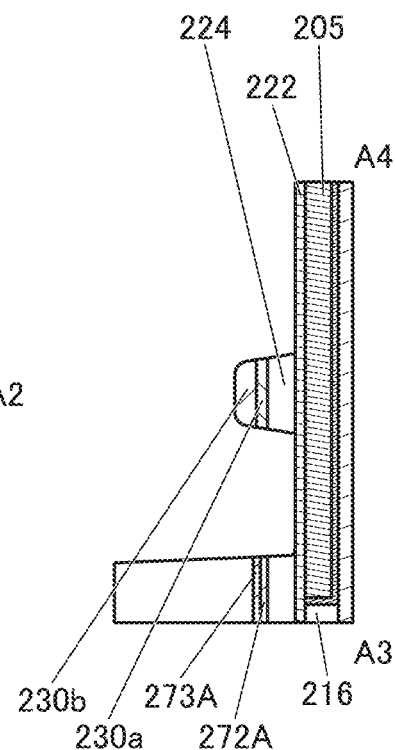
FIG. 7(B) and FIG. 7(C) are cross-sectional views illustrating the method for manufacturing the semiconductor device.
Figure 7B:
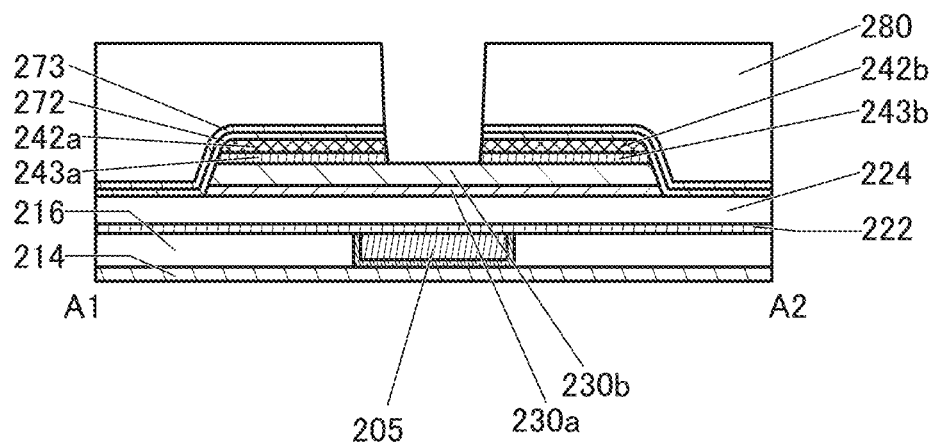
Figure 8A:
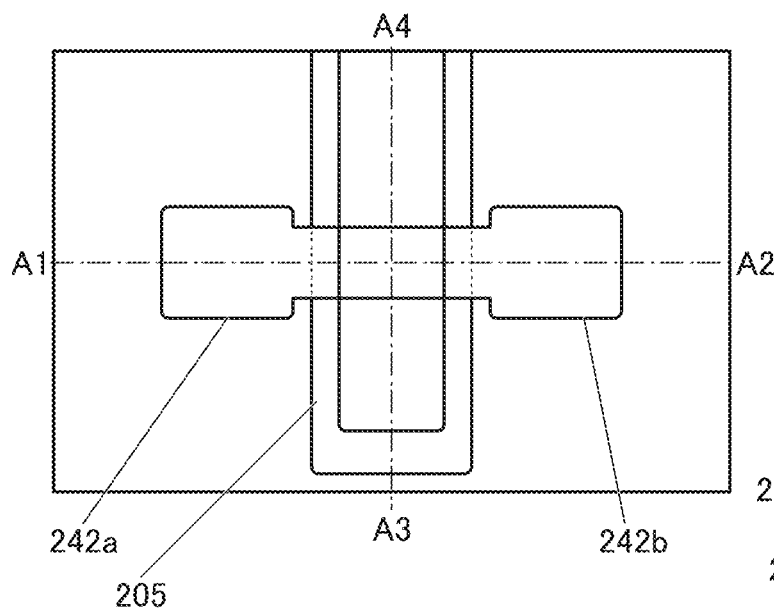
FIG. 8(A) is a top view illustrating a method for manufacturing a semiconductor device.
Figure 8C:
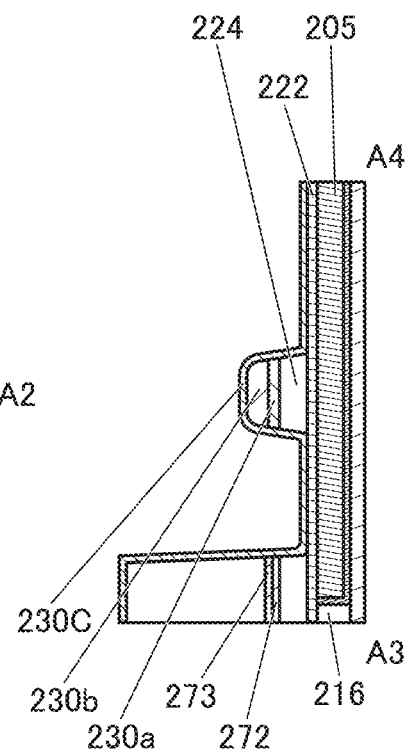
FIG. 8(B) and FIG. 8(C) are cross-sectional views illustrating the method for manufacturing the semiconductor device.
Figure 8B:
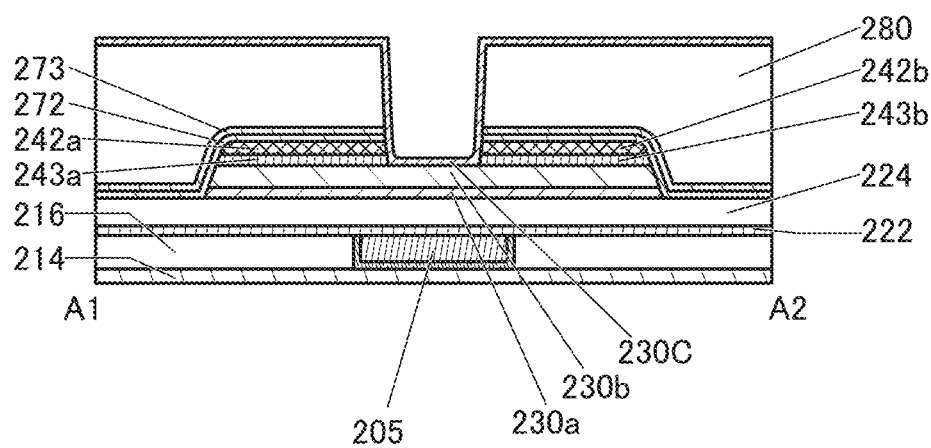
Figure 9A:
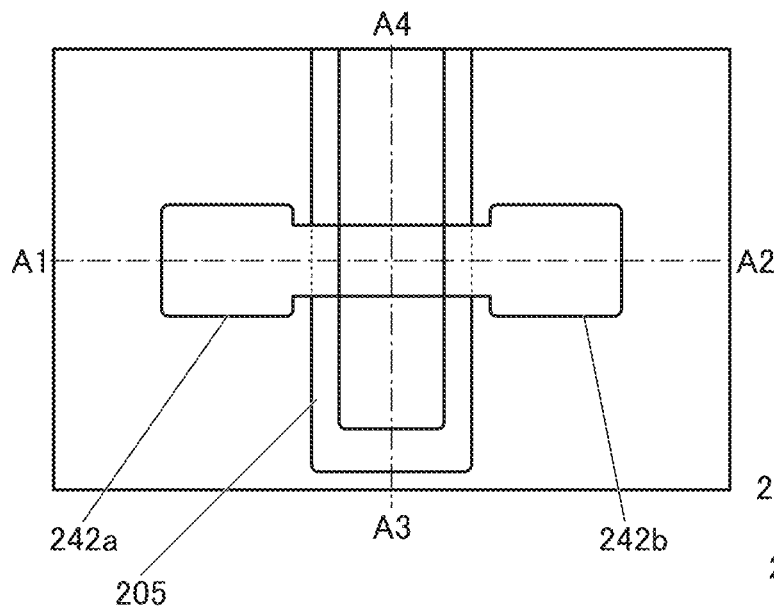
FIG. 9(A) is a top view illustrating a method for manufacturing a semiconductor device.
Figure 9C:
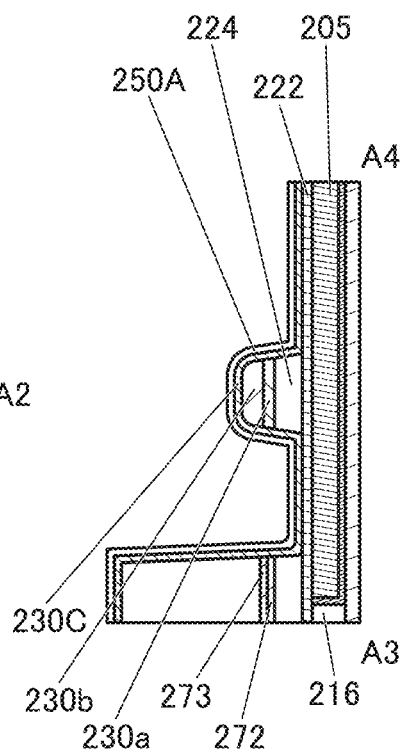
FIG. 9(B) and FIG. 9(C) are cross-sectional views illustrating the method for manufacturing the semiconductor device.
Figure 9B:
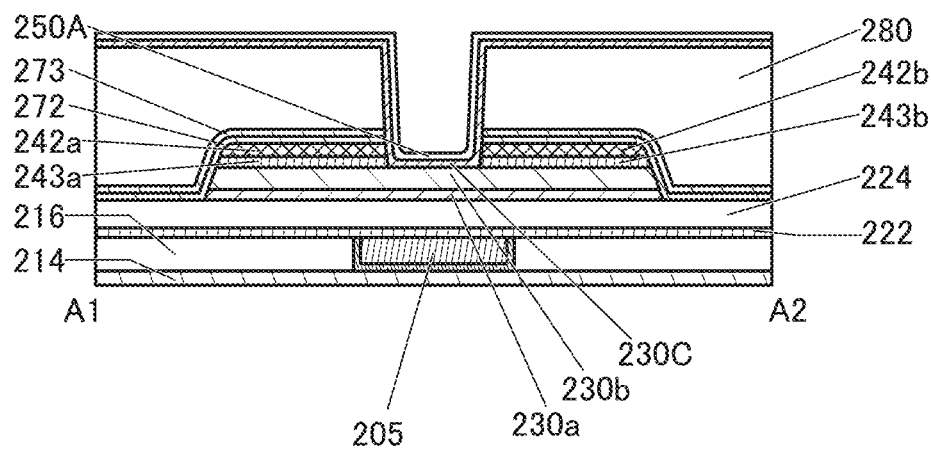
Figure 10A:
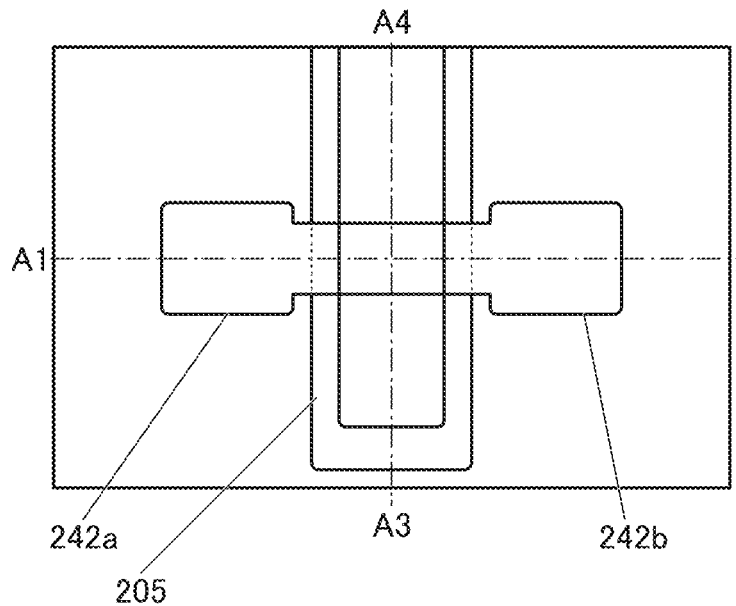
FIG. 10(A) is a top view illustrating a method for manufacturing a semiconductor device.
Figure 10C:
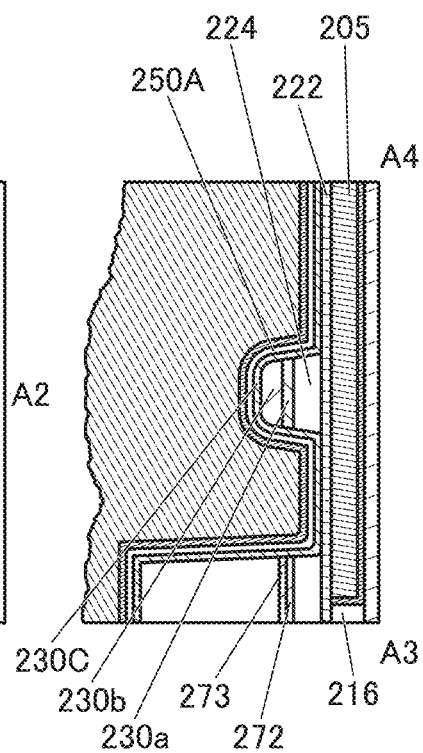
FIG. 10(B) and FIG. 10(C) are cross-sectional views illustrating the method for manufacturing the semiconductor device.
Figure 10B:
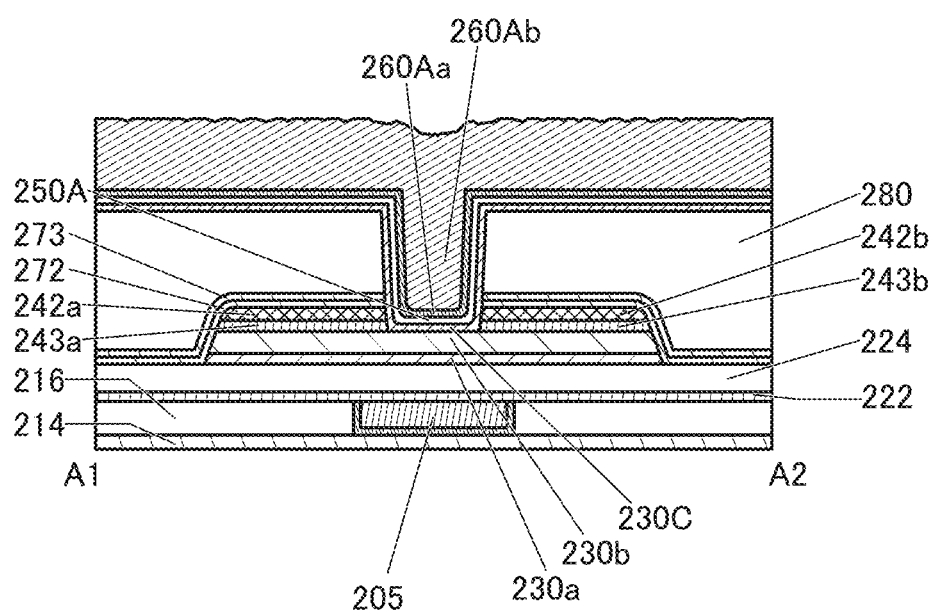

Next, an insulating film 272A is deposited over the insulator 224, the oxide 230a, the oxide 230b, the oxide layer 243B, and the conductor layer 242B (see FIG. 6).

The insulating film 272A can be deposited by a sputtering method, a CVD method, an MBE method, a PLD method, an ALD method, or the like. As the insulating film 272A, an insulating film having a function of inhibiting transmission of oxygen is preferably used. For example, aluminum oxide, silicon nitride, silicon oxide, or gallium oxide may be deposited by a sputtering method or an ALD method.

Then, an insulating film 273A is deposited over the insulating film 272A. The insulating film 273A can be deposited by a sputtering method, a CVD method, an MBE method, a PLD method, an ALD method, or the like. For example, aluminum oxide is preferably deposited by an ALD method. In this embodiment, aluminum oxide is deposited by an ALD method (see FIG. 6). Note that it is possible to employ a structure in which the insulating film 273A is not deposited.

Next, an insulating film to be the insulator 280 is deposited over the insulating film 273A. The insulating film to be the insulator 280 can be deposited by a sputtering method, a CVD method, an MBE method, a PLD method, an ALD method, or the like. Subsequently, the insulating film to be the insulator 280 is subjected to CMP treatment, so that the insulator 280 having a flat top surface is formed (see FIG. 7).

Then, part of the insulator 280, part of the insulating film 273A, part of the insulating film 272A, part of the oxide layer 243B, part of the conductor layer 242B, and part of the insulating film 224A are processed to form an opening reaching the oxide 230b. The opening is preferably formed to overlap with the conductor 205. By formation of the opening, the oxide 243a, the oxide 243b, the conductor 242a, the conductor 242b, the insulator 224, the insulator 272, and the insulator 273 are formed (see FIG. 7).

Part of the insulator 280, part of the insulating film 273A, part of the insulating film 272A, part of the oxide layer 243B, part of the conductor layer 242B, and part of the insulating film 224A may be processed under different conditions. For example, part of the insulator 280 may be processed by a dry etching method, part of the insulating film 273A may be processed by a wet etching method, and part of the insulating film 272A, part of the oxide layer 243B, part of the conductor layer 242B, and part of the insulating film 224A may be processed by a dry etching method.

In some cases, the treatment such as the dry etching performed thus far causes the attachment or diffusion of impurities due to an etching gas or the like to a surface or an inside of the oxide 230a, the oxide 230b, or the like. Examples of the impurities include fluorine and chlorine.

In order to remove the above impurities and the like, cleaning is performed. Examples of the cleaning method include wet cleaning using a cleaning solution or the like, plasma treatment using plasma, and cleaning by heat treatment, and any of these cleanings may be performed in appropriate combination.

The wet cleaning may be performed using an aqueous solution in which oxalic acid, phosphoric acid, ammonia water, hydrofluoric acid, or the like is diluted with carbonated water or pure water. Alternatively, ultrasonic cleaning using pure water or carbonated water may be performed.

Next, heat treatment may be performed. Heat treatment may be performed under reduced pressure, and an oxide film 230C may be successively deposited without exposure to the air. The treatment can remove moisture and hydrogen adsorbed onto the surface of the oxide 230b and the like, and further can reduce the moisture concentration and the hydrogen concentration of the oxide 230a and the oxide 230b. The heat treatment is preferably performed at a temperature higher than or equal to 100° C. and lower than or equal to 400° C. In this embodiment, the heat treatment is performed at 200° C. (see FIG. 8).

Here, it is preferable that the oxide film 230C be provided in contact with at least part of the side surface of the oxide 230a, part of the side surface and part of the top surface of the oxide 230b, part of the side surface of the oxide 243, part of the side surface of the conductor 242, the side surface of the insulator 272, the side surface of the insulator 273, and the side surface of the insulator 280. When the conductor 242 is surrounded by the oxide 243, the insulator 272, and the oxide film 230C, a decrease in the conductivity of the conductor 242 due to oxidation can be inhibited in subsequent steps.

The oxide film 230C can be deposited by a sputtering method, a CVD method, an MBE method, a PLD method, an ALD method, or the like. The atomic ratio of Ga to In in the oxide film 230C is preferably greater than the atomic ratio of Ga to In in the oxide film 230B. In this embodiment, the oxide film 230C is deposited by a sputtering method using a target with In:Ga:Zn=1:3:4 [atomic ratio].

Note that the oxide film 230C may be a stack. For example, by a sputtering method, deposition may be performed using a target of In:Ga:Zn=1:3:4 [atomic ratio] and successively deposition may be performed using a target of In:Ga:Zn=4:2:4.1 [atomic ratio].

In particular, in the deposition of the oxide film 230C, part of oxygen contained in the sputtering gas is sometimes supplied to the oxide 230a and the oxide 230b. Therefore, the proportion of oxygen contained in the sputtering gas for the oxide film 230C is preferably higher than or equal to 70%, further preferably higher than or equal to 80%, still further preferably 100%.

Next, heat treatment may be performed. Heat treatment may be performed under reduced pressure, and an insulating film 250A may be successively deposited without exposure to the air. The treatment can remove moisture and hydrogen adsorbed onto the surface of the oxide film 230C and the like, and further can reduce the moisture concentration and the hydrogen concentration of the oxide 230a, the oxide 230b, and the oxide film 230C. The heat treatment is preferably performed at a temperature higher than or equal to 100° C. and lower than or equal to 400° C. (see FIG. 9).

The insulating film 250A can be deposited by a sputtering method, a CVD method, an MBE method, a PLD method, an ALD method, or the like. For the insulating film 250A, silicon oxynitride is preferably deposited by a CVD method. Note that the deposition temperature at the time of the deposition of the insulating film 250A is preferably higher than or equal to 350° C. to lower than 450° C., particularly preferably approximately 400° C. When the insulating film 250A is deposited at 400° C., an insulator having few impurities can be deposited.

Next, a conductive film 260Aa and a conductive film 260Ab are deposited. The conductive film 260Aa and the conductive film 260Ab can be deposited by a sputtering method, a CVD method, an MBE method, a PLD method, an ALD method, or the like. A CVD method is preferably used, for example. In this embodiment, the conductive film 260Aa is deposited by an ALD method, and the conductive film 260Ab is deposited by a CVD method (see FIG. 10).

Figure 11A:
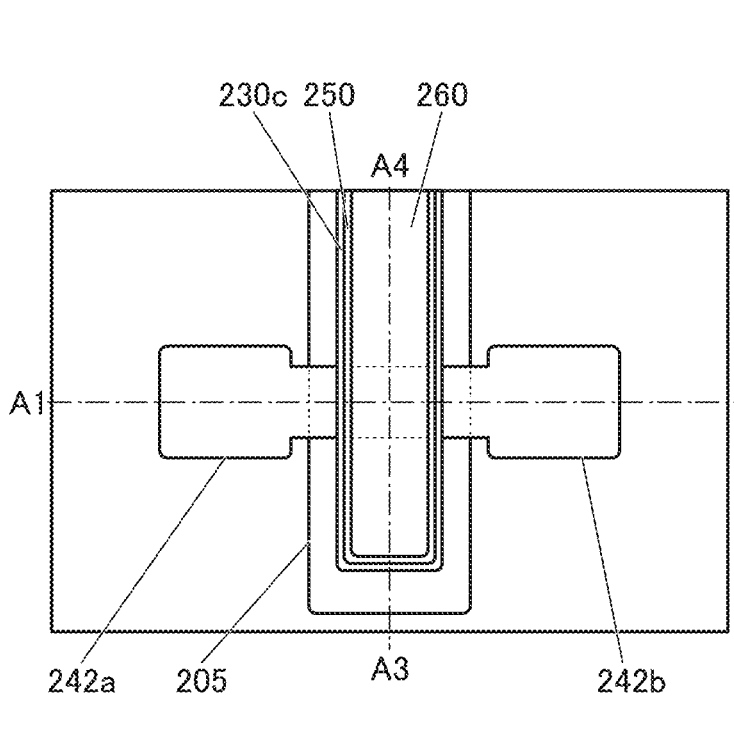
FIG. 11(A) is atop view illustrating a method for manufacturing a semiconductor device.
Figure 11C:
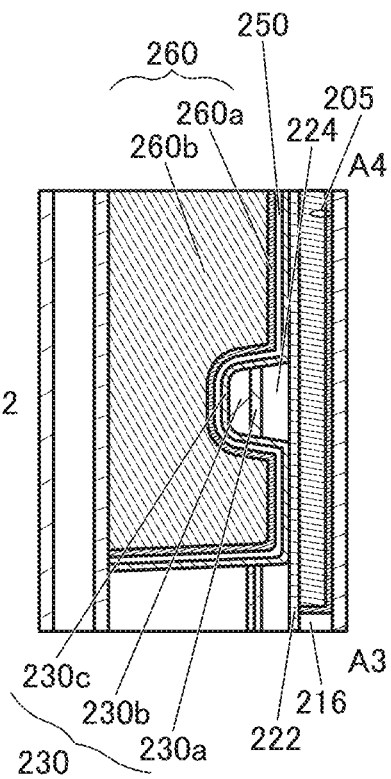
FIG. 11(B) and FIG. 11(C) are cross-sectional views illustrating the method for manufacturing the semiconductor device.
Figure 11B:
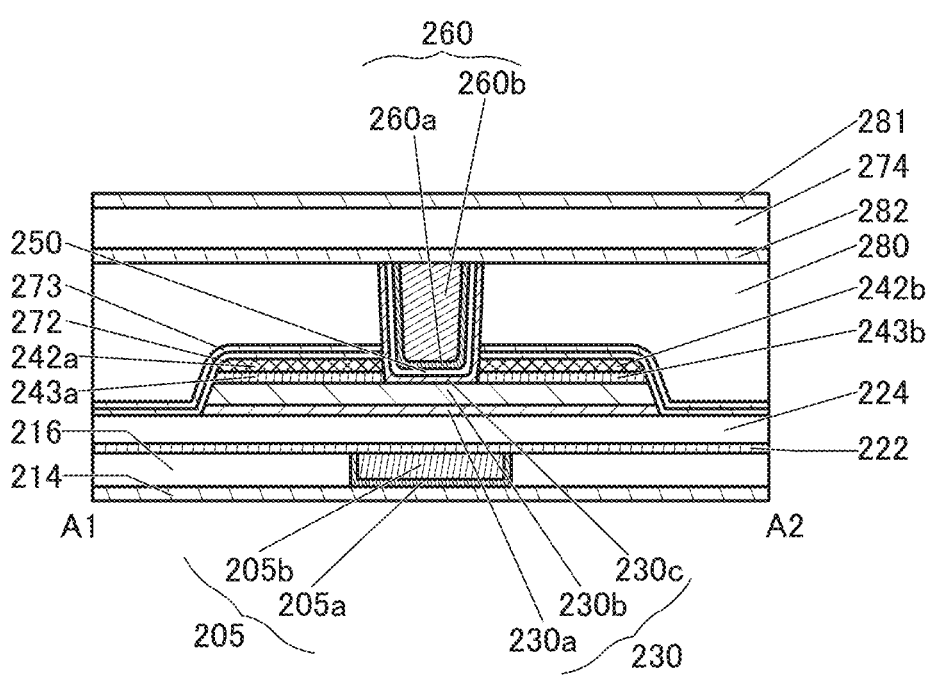

Then, the oxide film 230C, the insulating film 250A, the conductive film 260Aa, and the conductive film 260Ab are polished by CMP treatment until the insulator 280 is exposed, so that the oxide 230c, the insulator 250, and the conductor 260 (the conductor 260a and the conductor 260b) are formed (see FIG. 11).

Here, the conductor 242 is provided to be surrounded by the oxide 243, the insulator 272, and the oxide 230c; thus, a decrease in conductivity of the conductor 242 due to oxidation can be inhibited.

Next, heat treatment may be performed. In this embodiment, treatment is performed at 400° C. in a nitrogen atmosphere for one hour. The heat treatment can reduce the moisture concentration and the hydrogen concentration of the insulator 250 and the insulator 280.

Next, an insulating film to be the insulator 282 may be formed over the conductor 260, the oxide 230c, the insulator 250, and the insulator 280. The insulating film to be the insulator 282 can be deposited by a sputtering method, a CVD method, an MBE method, a PLD method, an ALD method, or the like. As the insulating film to be the insulator 282, aluminum oxide is preferably deposited by a sputtering method, for example. It is preferable to form the insulator 282 in contact with the top surface of the conductor 260 in this manner, in which case oxygen included in the insulator 280 can be inhibited from being absorbed into the conductor 260 in a later heat treatment (see FIG. 11).

Next, heat treatment may be performed. In this embodiment, treatment is performed at 400° C. in a nitrogen atmosphere for one hour. By the heat treatment, oxygen added by the deposition of the insulator 282 can be injected into the insulator 280. In addition, the oxygen can be injected into the oxide 230a and the oxide 230b through the oxide 230c.

Then, an insulator to be the insulator 274 may be deposited over the insulator 282. The insulating film to be the insulator 274 can be deposited by a sputtering method, a CVD method, an MBE method, a PLD method, an ALD method, or the like (see FIG. 11).

Next, an insulating film to be the insulator 281 may be deposited over the insulator 274. The insulating film to be the insulator 281 can be deposited by a sputtering method, a CVD method, an MBE method, a PLD method, an ALD method, or the like. As the insulating film to be the insulator 281, silicon nitride is preferably deposited by a sputtering method, for example (see FIG. 11).

Next, openings reaching the conductor 242*a* and the conductor 242*b* are formed in the insulator 272, the insulator 273, the insulator 280, the insulator 282, the insulator 274, and the insulator 281. The openings are formed by a lithography method.

Subsequently, an insulating film to be the insulator 241 is deposited and the insulating film is subjected to anisotropic etching, so that the insulator 241 is formed. The insulating film can be deposited by a sputtering method, a CVD method, an MBE method, a PLD method, an ALD method, or the like. As the insulating film to be the insulator 241, an insulating film having a function of inhibiting transmission of oxygen and impurities such as water and hydrogen is preferably used. For example, aluminum oxide or silicon nitride is preferably deposited by an ALD method. For the anisotropic etching, a dry etching method or the like is employed, for example. When the side wall portions of the openings have such a structure, transmission of oxygen from the outside can be inhibited and oxidation of the conductor 240*a* and the conductor 240*b* to be formed next can be prevented. Furthermore, impurities such as water and hydrogen can be prevented from diffusing from the conductor 240*a* and the conductor 240*b* to the outside.

Next, a conductive film to be the conductor 240*a* and the conductor 240*b* is deposited. The conductive film to be the conductor 240*a* and the conductor 240*b* preferably has a stacked-layer structure that includes a conductor having a function of inhibiting transmission of impurities such as water and hydrogen. For example, a stacked layer of tantalum nitride, titanium nitride, or the like and tungsten, molybdenum, copper, or the like can be employed. The conductive film to be the conductor 240 can be deposited by a sputtering method, a CVD method, an MBE method, a PLD method, an ALD method, or the like.

Then, CMP treatment is performed, thereby removing part of the conductive film to be the conductor 240*a* and the conductor 240*b* to expose the insulator 281. As a result, the conductive film remains only in the openings, so that the conductor 240*a* and the conductor 240*b* having flat top surfaces can be formed (see FIG. 1). Note that the insulator 281 is partly removed by the CMP treatment in some cases.

Next, a conductive film to be the conductor 246 is deposited. The conductive film to be the conductor 246 can be deposited by a sputtering method, a CVD method, an MBE method, a PLD method, an ALD method, or the like.

Then, the conductive film to be the conductor 246 is processed by a lithography method, thereby forming the conductor 246*a* in contact with the top surface of the conductor 240*a* and the conductor 246*b* in contact with the top surface of the conductor 240*b* (see FIG. 1).

Through the above process, the semiconductor device including the transistor 200 illustrated in FIG. 1 can be manufactured. As illustrated in FIG. 4 to FIG. 11, with the use of the method of manufacturing the semiconductor device described in this embodiment, the transistor 200 can be fabricated.

According to one embodiment of the present invention, a semiconductor device having a high on-state current can be provided. Alternatively, according to one embodiment of the present invention, a semiconductor device having excellent frequency characteristics can be provided. Alternatively, according to one embodiment of the present invention, a semiconductor device having favorable reliability can be provided. Alternatively, according to one embodiment of the present invention, a semiconductor device that can be miniaturized or highly integrated can be provided. Alternatively, according to one embodiment of the present invention, a semiconductor device having favorable electrical characteristics can be provided. Alternatively, according to one embodiment of the present invention, a semiconductor device having a low off-state current can be provided. Alternatively, according to one embodiment of the present invention, a semiconductor device with reduced power consumption can be provided. Alternatively, according to one embodiment of the present invention, a semiconductor device with high productivity can be provided.

The structures, methods, and the like described above in this embodiment can be used in combination as appropriate with the structures, methods, and the like described in the other embodiments and other examples.

Embodiment 2

In this embodiment, one embodiment of a semiconductor device will be described with reference to FIG. 16 and FIG. 17.

[Memory Device 1]

Figure 16:
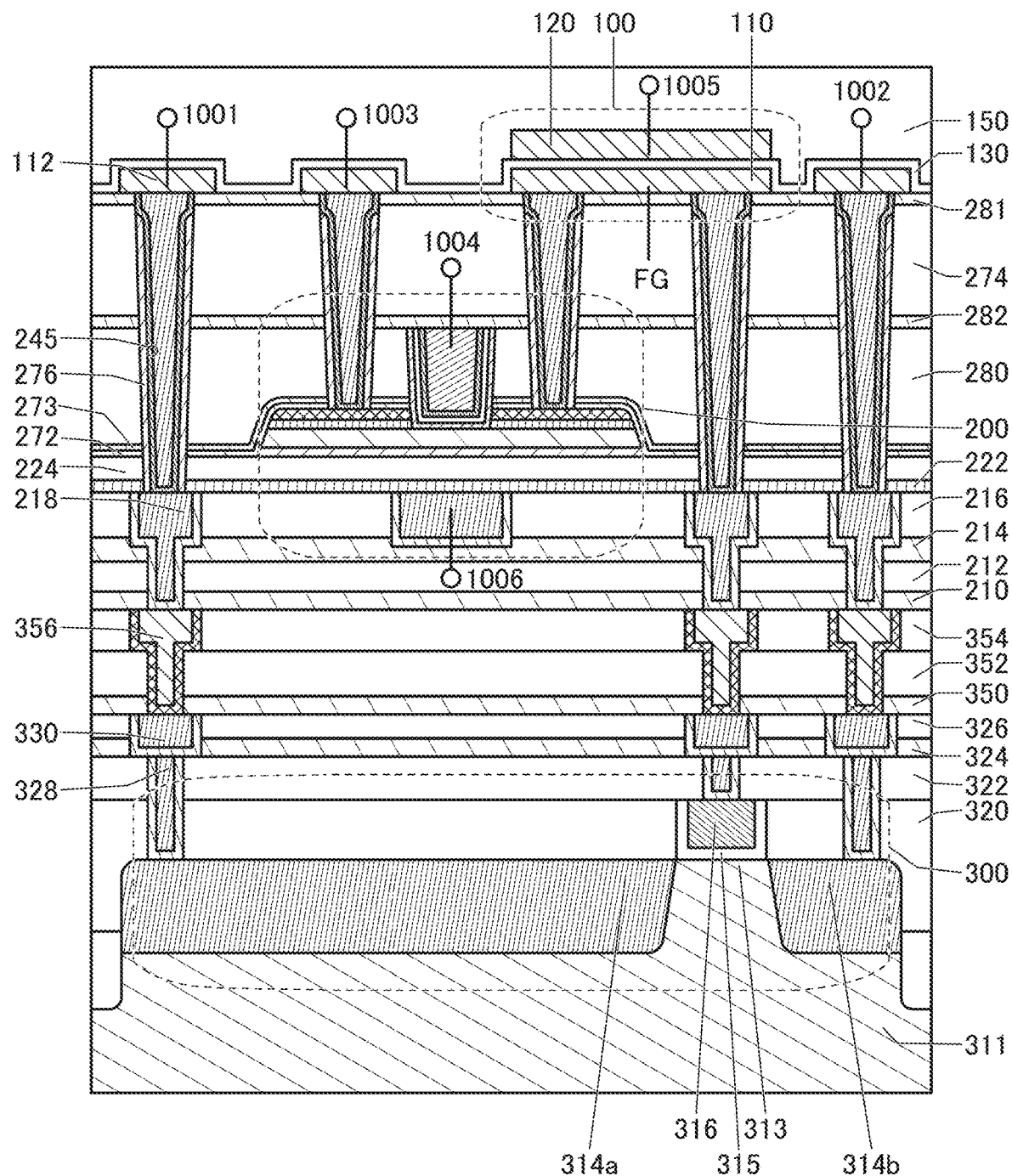
FIG. 16 is a cross-sectional view illustrating a structure of a memory device.

FIG. 16 illustrates an example of a memory device using the semiconductor device of one embodiment of the present invention. The memory device illustrated in FIG. 16 includes the transistor 200, a transistor 300, and a capacitor 100. The transistor 200 is provided above the transistor 300, and the capacitor 100 is provided above the transistor 300 and the transistor 200. Note that the transistor 200 described in the foregoing embodiment can be used as the transistor 200, for example.

The transistor 200 is a transistor whose channel is formed in a semiconductor layer containing an oxide semiconductor. Since the transistor 200 has a low off-state current, a memory device using the transistor 200 can retain stored data for a long time. In other words, such a memory device does not require refresh operation or has an extremely low frequency of the refresh operation, which leads to a sufficient reduction in power consumption of the memory device.

In the semiconductor device illustrated in FIG. 16, a wiring 1001 is electrically connected to a source of the transistor 300, and a wiring 1002 is electrically connected to a drain of the transistor 300. A wiring 1003 is electrically connected to one of a source and a drain of the transistor 200, a wiring 1004 is electrically connected to a first gate of the transistor 200, and a wiring 1006 is electrically connected to a second gate of the transistor 200. A gate of the transistor 300 and the other of the source and the drain of the transistor 200 are electrically connected to one electrode of the capacitor 100, and a wiring 1005 is electrically connected to the other electrode of the capacitor 100.

When the memory devices illustrated in FIG. 16 are arranged in a matrix, a memory cell array can be formed.

<Transistor 300>

The transistor 300 is provided over a substrate 311 and includes a conductor 316 functioning as the gate electrode, an insulator 315 functioning as a gate insulator, a semiconductor region 313 that is part of the substrate 311, and a low-resistance region 314a and a low-resistance region 314b functioning as a source region and a drain region. The transistor 300 may be a p-channel transistor or an n-channel transistor.

Here, in the transistor 300 illustrated in FIG. 16, the semiconductor region 313 (part of the substrate 311) in which the channel is formed has a convex shape. Furthermore, the conductor 316 is provided so as to cover a side surface and top surface of the semiconductor region 313 with the insulator 315 positioned therebetween. Note that a material for adjusting the work function may be used for the conductor 316. Such a transistor 300 is also referred to as a FIN-type transistor because it utilizes a convex portion of the semiconductor substrate. Note that an insulator functioning as a mask for forming the convex portion may be placed in contact with an upper portion of the convex portion. Furthermore, although the case where the convex portion is formed by processing part of the semiconductor substrate is described here, a semiconductor film having a convex shape may be formed by processing an SOI substrate.

Note that the transistor 300 illustrated in FIG. 16 is only an example and the structure is not limited thereto; a transistor appropriate for a circuit configuration or a driving method is used.

<Capacitor 100>

The capacitor 100 is provided above the transistor 200. The capacitor 100 includes a conductor 110 functioning as a first electrode, a conductor 120 functioning as a second electrode, and an insulator 130 functioning as a dielectric.

For example, a conductor 112 provided over the conductor 246 and the conductor 110 can be formed at the same time. Note that the conductor 112 has a function of a plug or a wiring that is electrically connected to the capacitor 100, the transistor 200, or the transistor 300.

Although FIG. 16 illustrates the conductor 112 and the conductor 110 each having a single-layer structure, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The insulator 130 can be provided to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, or hafnium nitride.

For example, the insulator 130 preferably has a stacked-layer structure using a material with high dielectric strength, such as silicon oxynitride, and a high-permittivity (high-k) material. In the capacitor 100 having such a structure, a sufficient capacitance can be provided owing to the high permittivity (high-k) insulator, and the dielectric strength can be increased owing to the insulator with high dielectric strength, so that the electrostatic breakdown of the capacitor 100 can be inhibited.

Examples of insulators that are high-permittivity (high-k) materials (materials with a high relative permittivity) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of materials with high dielectric strength (materials with a low relative permittivity) include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

<Wiring Layer>

Wiring layers provided with an interlayer film, a wiring, a plug, and the like may be provided between the components. A plurality of wiring layers can be provided in accordance with the design. Note that a plurality of conductors functioning as plugs or wirings are collectively denoted by the same reference numeral in some cases. Furthermore, in this specification and the like, a wiring and a plug electrically connected to the wiring may be a single component. That is, there are a case where part of a conductor functions as a wiring and a case where part of a conductor functions as a plug.

For example, an insulator 320, an insulator 322, an insulator 324, and an insulator 326 are stacked in this order as interlayer films over the transistor 300. In addition, a conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 function as plugs or wirings.

The insulator functioning as an interlayer film may also function as a planarization film that covers an uneven shape thereunder. For example, the top surface of the insulator 322 may be planarized by planarization treatment using a chemical mechanical polishing (CMP) method or the like to improve planarity.

A wiring layer may be provided over the insulator 326 and the conductor 330. For example, in FIG. 16, an insulator 350, an insulator 352, and an insulator 354 are stacked in this order. Furthermore, a conductor 356 is formed in the insulator 350, the insulator 352, and the insulator 354. The conductor 356 functions as a plug or a wiring.

Similarly, a conductor 218 and a conductor included in the transistor 200 are embedded in the insulator 210, the insulator 212, the insulator 214, and the insulator 216. Note that the conductor 218 has a function of a plug or a wiring that is electrically connected to the capacitor 100 or the transistor 300. In addition, an insulator 150 is provided over the conductor 120 and the insulator 130.

Examples of an insulator that can be used as an interlayer film include an oxide, a nitride, an oxynitride, a nitride oxide, a metal oxide, a metal oxynitride, and a metal nitride oxide, each of which has an insulating property.

For example, when a material having a low relative permittivity is used for the insulator functioning as an interlayer film, the parasitic capacitance generated between wirings can be reduced. Thus, a material is preferably selected depending on the function of an insulator.

For example, as the insulator 150, the insulator 212, the insulator 352, the insulator 354, and the like, an insulator having a low relative permittivity is preferably used. For example, the insulators each preferably contain silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulators each preferably have a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low relative permittivity. Examples of the resin include polyester, polyolefin, polyamide (e.g., nylon and aramid), polyimide, polycarbonate, and acrylic.

When a transistor using an oxide semiconductor is surrounded by an insulator having a function of inhibiting transmission of oxygen and impurities such as hydrogen, the electrical characteristics of the transistor can be stable. Thus, an insulator having a function of inhibiting transmission of oxygen and impurities such as hydrogen is used as the insulator 210, the insulator 350, and the like.

As the insulator having a function of inhibiting transmission of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum are used. Specifically, as the insulator having a function of inhibiting transmission of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

As the conductors that can be used as a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. A semiconductor having high electrical conductivity, typified by polycrystalline silicon containing an impurity element such as phosphorus, or silicide such as nickel silicide may be used.

For example, for the conductor 328, the conductor 330, the conductor 356, the conductor 218, the conductor 112, and the like, a single layer or stacked layers of a conductive material such as a metal material, an alloy material, a metal nitride material, or a metal oxide material that is formed using the above material can be used. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

<Wiring or Plug in Layer Provided with Oxide Semiconductor>

In the case where an oxide semiconductor is used in the transistor 200, an insulator including an excess oxygen region is sometimes provided in the vicinity of the oxide semiconductor. In that case, an insulator having a barrier property is preferably provided between the insulator including the excess oxygen region and a conductor provided in the insulator including the excess oxygen region.

For example, in FIG. 16, an insulator 276 is preferably provided between the insulator 224 containing excess oxygen and the conductor 245. Since the insulator 276 is provided in contact with the insulator 222, the insulator 272, and the insulator 273, the insulator 224 and the transistor 200 can be sealed by the insulators having a barrier property. Furthermore, the insulator 276 is preferably in contact with the insulator 280. With such a structure, diffusion of oxygen and impurities can be further inhibited.

That is, when the insulator 276 is provided, absorption of excess oxygen contained in the insulator 224 by the conductor 245 can be inhibited. In addition, when the insulator 276 is provided, diffusion of hydrogen, which is an impurity, into the transistor 200 through the conductor 245 can be inhibited.

The insulator 276 is preferably formed using an insulating material having a function of inhibiting diffusion of oxygen and impurities such as water or hydrogen. For example, aluminum oxide or hafnium oxide is preferably used. It is also possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The above is the description of the structure example. With the use of the structure, a change in electrical characteristics can be reduced and reliability can be improved in a semiconductor device using a transistor including an oxide semiconductor. Alternatively, a transistor that includes an oxide semiconductor and has a high on-state current can be provided. Alternatively, a transistor that includes an oxide semiconductor and has a low off-state current can be provided. Alternatively, a semiconductor device with low power consumption can be provided.

[Memory Device 2]

Figure 17:
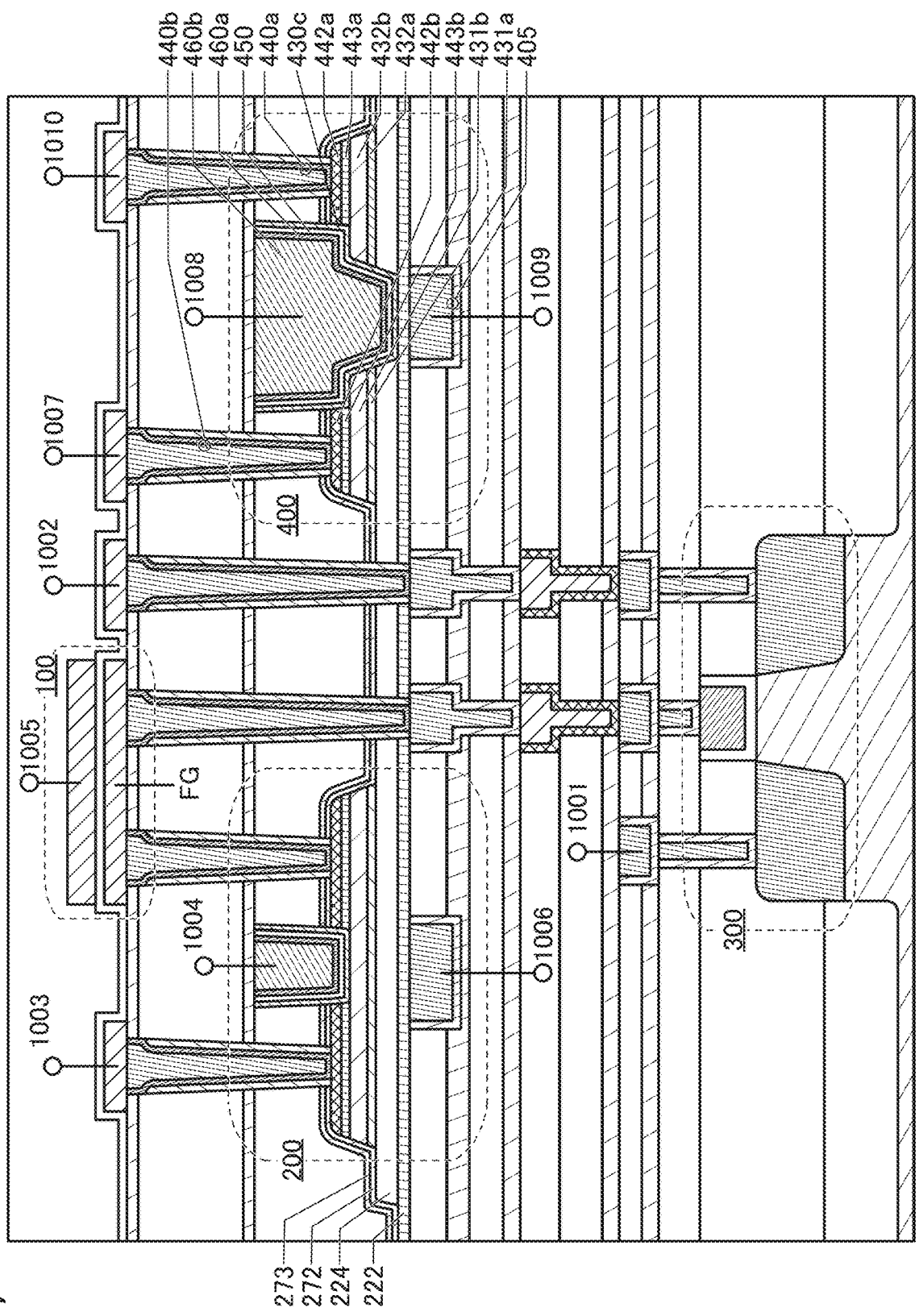
FIG. 17 is a cross-sectional view illustrating a structure of a memory device.

FIG. 17 illustrates an example of a memory device using the semiconductor device of one embodiment of the present invention. The memory device illustrated in FIG. 17 includes a transistor 400 in addition to the semiconductor device including the transistor 200, the transistor 300, and the capacitor 100 illustrated in FIG. 16.

The transistor 400 can control a second gate voltage of the transistor 200. For example, a first gate and a second gate of the transistor 400 are diode-connected to a source of the transistor 400, and the source of the transistor 400 is connected to the second gate of the transistor 200. When a negative potential of the second gate of the transistor 200 is retained in this structure, the first gate-source voltage and the second gate-source voltage of the transistor 400 become 0 V. In the transistor 400, a drain current at the time when a second gate voltage and a first gate voltage are 0 V is extremely low; thus, the negative potential of the second gate of the transistor 200 can be maintained for a long time even without power supply to the transistor 200 and the transistor 400. Accordingly, the memory device including the transistor 200 and the transistor 400 can retain stored data for a long time.

Hence, in FIG. 17, the wiring 1001 is electrically connected to the source of the transistor 300, and the wiring 1002 is electrically connected to the drain of the transistor 300. The wiring 1003 is electrically connected to one of the source and the drain of the transistor 200, the wiring 1004 is electrically connected to the first gate of the transistor 200, and the wiring 1006 is electrically connected to the second gate of the transistor 200. The gate of the transistor 300 and the other of the source and the drain of the transistor 200 are electrically connected to one electrode of the capacitor 100, and the wiring 1005 is electrically connected to the other electrode of the capacitor 100. A wiring 1007 is electrically connected to the source of the transistor 400, a wiring 1008 is electrically connected to the first gate of the transistor 400, a wiring 1009 is electrically connected to the second gate of the transistor 400, and a wiring 1010 is electrically connected to a drain of the transistor 400. Here, the wiring 1006, the wiring 1007, the wiring 1008, and the wiring 1009 are electrically connected to each other.

When the memory device illustrated in FIG. 17 is arranged in a matrix like the memory device illustrated in FIG. 16, a memory cell array can be formed. Note that one transistor 400 can control the second gate voltages of a plurality of transistors 200. For this reason, the number of transistors 400 is preferably smaller than the number of transistors 200.

<Transistor 400>

The transistor 400 and the transistors 200 are formed in the same layer and thus can be fabricated in parallel. The transistor 400 includes a conductor 460 (a conductor 460a and a conductor 460b) functioning as the first gate electrode; a conductor 405 functioning as the second gate electrode; the insulator 222, the insulator 224, and an insulator 450 each functioning as a gate insulating layer; an oxide 430c including a region where a channel is formed; a conductor 442a, an oxide 443a, an oxide 432a, and an oxide 432b that function as one of the source and the drain; a conductor 442b, an oxide 443b, an oxide 431a, and an oxide 431b that function as the other of the source and the drain; and a conductor 440 (a conductor 440a and a conductor 440b).

In the transistor 400, the conductor 405 is in the same layer as the conductor 205. The oxide 431a and the oxide 432a are in the same layer as the oxide 230a, and the oxide 431b and the oxide 432b are in the same layer as the oxide 230b. The conductor 442a and the conductor 442b are in the same layer as the conductor 242. The oxide 443a and the oxide 443b are in the same layer as the oxide 243. The oxide 430c is in the same layer as the oxide 230c. The insulator 450 is in the same layer as the insulator 250. The conductor 460 is in the same layer as the conductor 260.

Note that the components formed in the same layer can be formed at the same time. For example, the oxide 430c can be formed by processing the oxide film 230C.

In the oxide 430c functioning as an active layer of the transistor 400, oxygen vacancies and impurities such as hydrogen and water are reduced, as in the oxide 230 or the like. Accordingly, the threshold voltage of the transistor 400 can be higher than 0 V, the off-state current can be reduced, and the drain current at the time when the second gate voltage and the first gate voltage are 0 V can be extremely low.

<Dicing Line>

A dicing line (also referred to as a scribe line, a dividing line, or a cutting line in some cases) that is provided when a large-sized substrate is divided into semiconductor elements so that a plurality of semiconductor devices are each formed in a chip form is described below. Examples of a dividing method include the case where a groove (a dicing line) for dividing the semiconductor elements is formed on the substrate, and then the substrate is cut along the dicing line to divide (split) it into a plurality of semiconductor devices.

Here, for example, design is preferably made such that a region in which the insulator 272 and the insulator 222 are in contact with each other is the dicing line, as illustrated in FIG. 17. That is, an opening is provided in the insulator 224 in the vicinity of the region to be the dicing line that is provided in an outer edge of the transistor 400 and the memory cell including a plurality of transistors 200. The insulator 272 is provided to cover the side surface of the insulator 224.

That is, in the opening provided in the insulator 224, the insulator 222 is in contact with the insulator 272. Here, the insulator 222 and the insulator 272 may be formed using the same material and the same method, for example. When the insulator 222 and the insulator 272 are formed using the same material and the same method, the adhesion therebetween can be increased. For example, aluminum oxide is preferably used.

With such a structure, the insulator 224, the transistor 200, and the transistor 400 can be enclosed with the insulator 222 and the insulator 272. Since the insulator 222 and the insulator 272 have a function of inhibiting diffusion of oxygen, hydrogen, and water, even when the substrate is divided into circuit regions each of which is provided with the semiconductor elements in this embodiment to form a plurality of chips, the entry and diffusion of impurities such as hydrogen or water from the side surface direction of the divided substrate into the transistor 200 and the transistor 400 can be prevented.

Furthermore, the structure can prevent excess oxygen in the insulator 224 from diffusing to the outside of the insulator 272 and the insulator 222. Accordingly, excess oxygen in the insulator 224 is efficiently supplied to the oxide where the channel is formed in the transistor 200 or the transistor 400. The oxygen can reduce oxygen vacancies in the oxide where the channel is formed in the transistor 200 or the transistor 400. Thus, the oxide where the channel is formed in the transistor 200 or the transistor 400 can be an oxide semiconductor with a low density of defect states and stable characteristics. That is, a change in electrical characteristics of the transistors 200 or the transistor 400 can be reduced and reliability can be improved.

The structures, methods, and the like described above in this embodiment can be used in combination as appropriate with the structures, methods, and the like described in the other embodiments and other examples.

Embodiment 3

In this embodiment, a memory device of one embodiment of the present invention including a transistor in which an oxide is used for a semiconductor (hereinafter referred to as an OS transistor in some cases) and a capacitor (hereinafter, such a memory device may be referred to as an OS memory device) will be described with reference to FIG. 18 and FIG. 19. The OS memory device is a memory device including at least a capacitor and an OS transistor that controls the charging and discharging of the capacitor. Since the OS transistor has an extremely low off-state current, the OS memory device has excellent retention characteristics and thus can function as a nonvolatile memory.

<Structure Example of Memory Device>

Figure 18A:
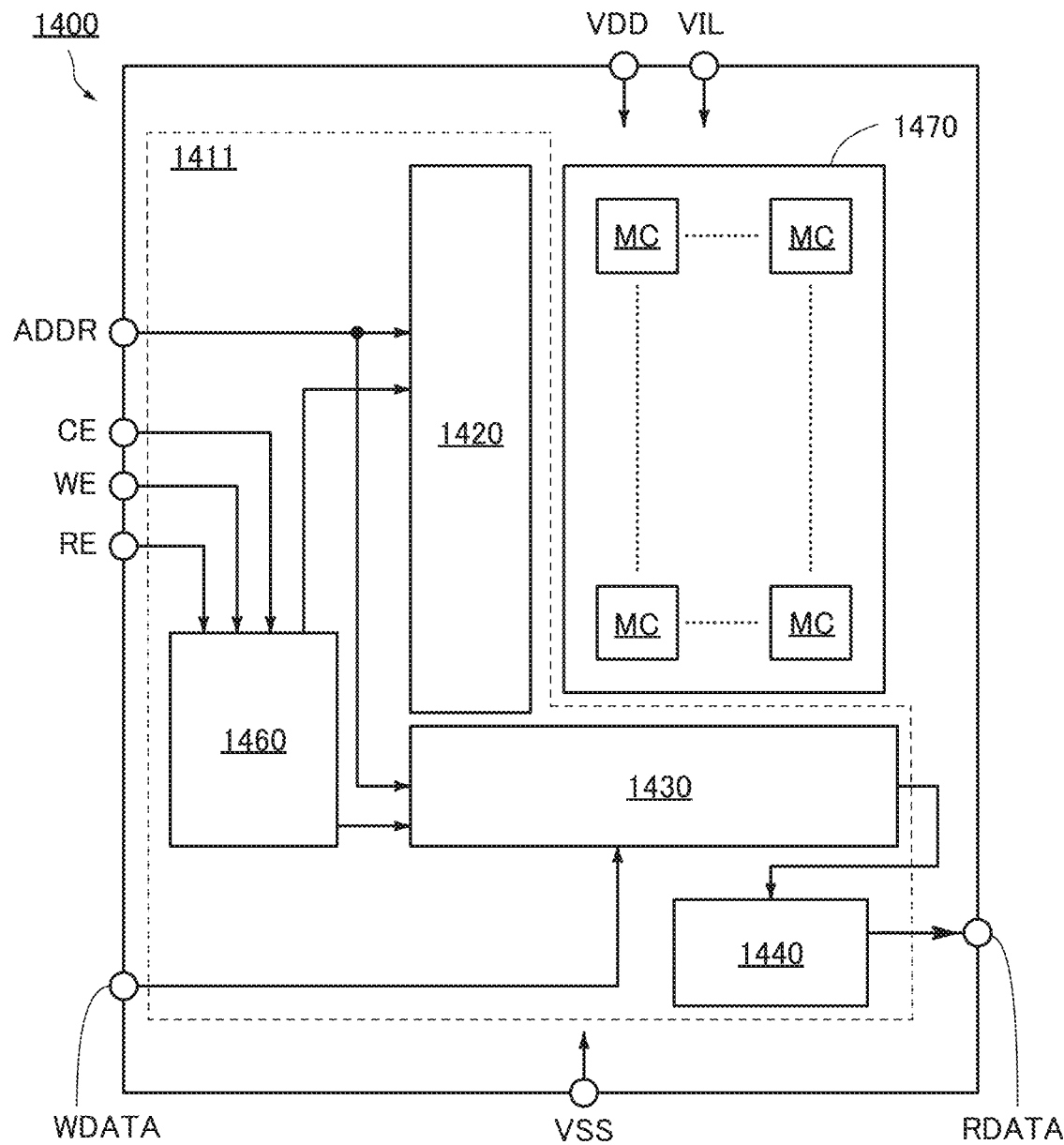
FIG. 18(A) is a block diagram illustrating a structure example of a memory device.

FIG. 18(A) illustrates a structure example of an OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. Note that the wirings are connected to memory cells included in the memory cell array 1470 and will be described later in detail. The amplified data signal is output as a data signal RDATA to the outside of the memory device 1400 through the output circuit 1440. The row circuit 1420 includes, for example, a row decoder and a word line driver circuit, and can select a row to be accessed.

As power supply voltages from the outside, a low power supply voltage (VSS), a high power supply voltage (VDD)

for the peripheral circuit 1411, and a high power supply voltage (VIL) for the memory cell array 1470 are supplied to the memory device 1400. Control signals (CE, WE, and RE), an address signal ADDR, and a data signal WDATA are also input to the memory device 1400 from the outside. The address signal ADDR is input to the row decoder and the column decoder, and WDATA is input to the write circuit.

The control logic circuit 1460 processes the signals (CE, WE, and RE) input from the outside, and generates control signals for the row decoder and the column decoder. CE is a chip enable signal, WE is a write enable signal, and RE is a read enable signal. Signals processed by the control logic circuit 1460 are not limited thereto, and other input signals are processed to generate control signals for the row decoder or the column decoder as necessary.

The memory cell array 1470 includes a plurality of memory cells MC arranged in a matrix and a plurality of wirings. Note that the number of wirings that connect the memory cell array 1470 and the row circuit 1420 depends on the configuration of the memory cell MC, the number of memory cells MC in one column, and the like. The number of wirings that connect the memory cell array 1470 and the column circuit 1430 depends on the configuration of the memory cell MC, the number of memory cells MC in one row, and the like.

Figure 18B:
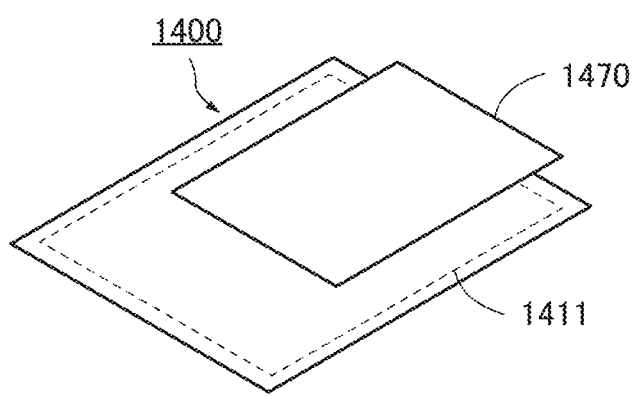
FIG. 18(B) is a schematic diagram illustrating a structure example of the memory device.

Note that FIG. 18(A) illustrates an example in which the peripheral circuit 1411 and the memory cell array 1470 are formed on the same plane; however, this embodiment is not limited thereto. For example, as illustrated in FIG. 18(B), the memory cell array 1470 may be provided to overlap part of the peripheral circuit 1411. For example, the sense amplifier may be provided below the memory cell array 1470 so that they overlap each other.

FIG. 19 illustrates configuration examples of a memory cell applicable to the memory cell MC.

[DOSRAM]

Figure 19A:
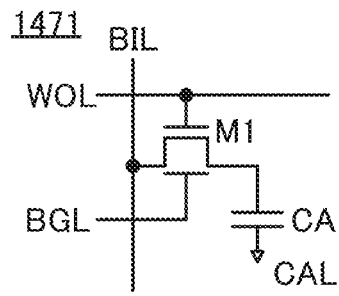
FIG. 19(A) to FIG. 19(H) are circuit diagrams each illustrating a configuration example of a memory device.
Figure 19B:
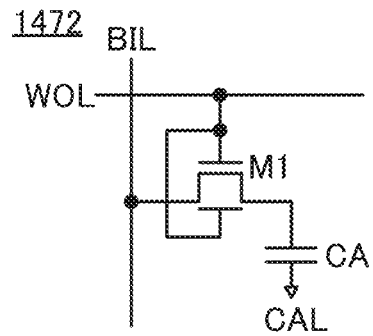
Figure 19C:
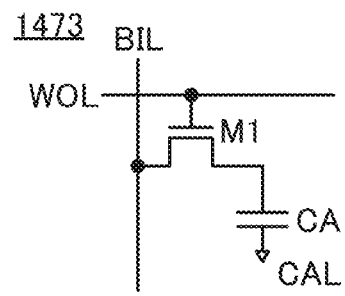
Figure 19D:
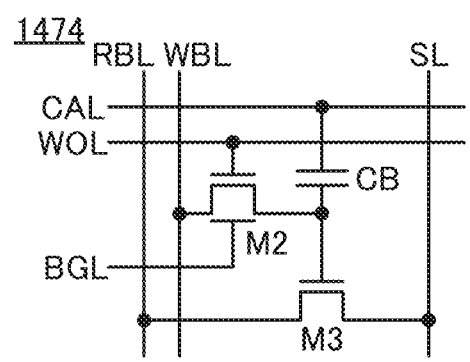
Figure 19E:
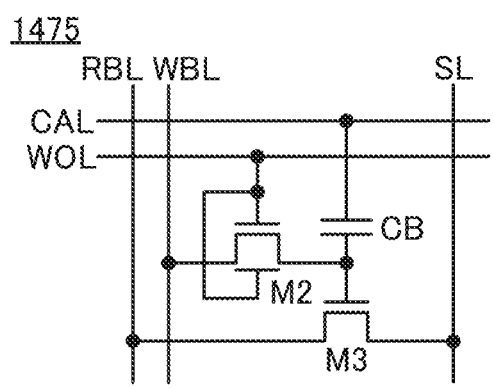
Figure 19F:
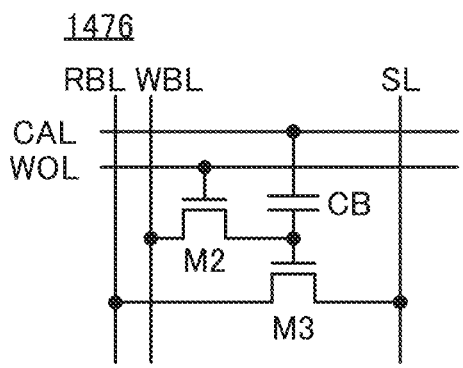
Figure 19G:
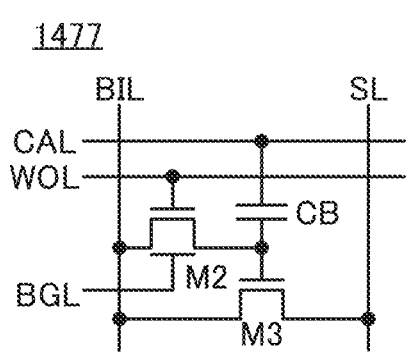

FIGS. 19(A) to 19(C) each illustrate a circuit configuration example of a memory cell of a DRAM. In this specification and the like, a DRAM using a memory cell including one OS transistor and one capacitor is referred to as DOSRAM (Dynamic Oxide Semiconductor Random Access Memory) in some cases. A memory cell 1471 illustrated in FIG. 19(A) includes a transistor M1 and a capacitor CA. Note that the transistor M1 includes a gate (referred to as a front gate in some cases) and a back gate.

A first terminal of the transistor M1 is connected to a first terminal of the capacitor CA. A second terminal of the transistor M1 is connected to a wiring BIL. The gate of the transistor M1 is connected to a wiring WOL. The back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In the time of data writing and data reading, a low-level potential is preferably applied to the wiring CAL. The wiring BGL functions as a wiring for applying a potential to the back gate of the transistor M1. By applying a given potential to the wiring BGL, the threshold voltage of the transistor M1 can be increased or decreased.

The memory cell MC is not limited to the memory cell 1471, and the circuit configuration can be changed. For example, in the memory cell MC, the back gate of the transistor M1 may be connected to the wiring WOL instead of the wiring BGL, as in a memory cell 1472 illustrated in FIG. 19(B). As another example, the memory cell MC may be a memory cell configured with a single-gate transistor M1, that is, a transistor M1 that does not have a back gate, like a memory cell 1473 illustrated in FIG. 19(C).

In the case where the semiconductor device described in the above embodiment is used in the memory cell 1471 and the like, the transistor 200 can be used as the transistor M1, and the capacitor 100 can be used as the capacitor CA. When an OS transistor is used as the transistor M1, the leakage current of the transistor M1 can be extremely low. That is, written data can be retained for a long time with the transistor M1; thus, the frequency of refresh of the memory cell can be reduced. Alternatively, refresh operation for the memory cell can be omitted. In addition, the extremely low leakage current allows multi-level data or analog data to be retained in the memory cell 1471, the memory cell 1472, and the memory cell 1473.

In the DOSRAM, when the sense amplifier is provided below the memory cell array 1470 so that they overlap each other as described above, the bit line can be shortened. This reduces bit line capacity, which reduces the storage capacity of the memory cell.

[NOSRAM]

FIGS. 19(D) to 19(H) each illustrate a circuit configuration example of a gain-cell type memory cell including two transistors and one capacitor. A memory cell 1474 illustrated in FIG. 19(D) includes a transistor M2, a transistor M3, and a capacitor CB. Note that the transistor M2 includes a front gate (simply referred to as a gate in some cases) and a back gate. In this specification and the like, a memory device including a gain-cell type memory cell using an OS transistor as the transistor M2 is referred to as NOSRAM (Nonvolatile Oxide Semiconductor RAM) in some cases.

A first terminal of the transistor M2 is connected to a first terminal of the capacitor CB. A second terminal of the transistor M2 is connected to a wiring WBL. The gate of the transistor M2 is connected to the wiring WOL. The back gate of the transistor M2 is connected to the wiring BGL. A second terminal of the capacitor CB is connected to the wiring CAL. A first terminal of the transistor M3 is connected to a wiring RBL, a second terminal of the transistor M3 is connected to a wiring SL, and a gate of the transistor M3 is connected to the first terminal of the capacitor CB.

The wiring WBL functions as a write bit line. The wiring RBL functions as a read bit line. The wiring WOL functions as a word line. The wiring CAL functions as a wiring for applying a predetermined potential to the second terminal of the capacitor CB. During data writing, data retention, and data reading, a low-level potential is preferably applied to the wiring CAL. The wiring BGL functions as a wiring for applying a potential to the back gate of the transistor M2. By applying a given potential to the wiring BGL, the threshold voltage of the transistor M2 can be increased or decreased.

The memory cell MC is not limited to the memory cell 1474, and the circuit configuration can be changed as appropriate. For example, in the memory cell MC, the back gate of the transistor M2 may be connected to the wiring WOL instead of the wiring BGL, as in a memory cell 1475 illustrated in FIG. 19(E). As another example, the memory cell MC may be a memory cell configured with a single-gate transistor M2, that is, a transistor M2 that does not have a back gate, like a memory cell 1476 illustrated in FIG. 19(F). As another example, the memory cell MC may have a structure in which the wiring WBL and the wiring RBL are combined into one wiring BIL as in a memory cell 1477 illustrated in FIG. 19(G).

In the case where the semiconductor device described in the above embodiment is used in the memory cell 1474 and the like, the transistor 200 can be used as the transistor M2, the transistor 300 can be used as the transistor M3, and the capacitor 100 can be used as the capacitor CB. When an OS transistor is used as the transistor M2, the leakage current of the transistor M2 can be extremely low. Consequently, written data can be retained for a long time with the transistor M2; thus, the frequency of refresh of the memory cell can be reduced. Alternatively, refresh operation for the memory cell can be omitted. In addition, since the transistor M2 has an extremely low leakage current, multi-level data or analog data can be retained in the memory cell 1474. The same applies to the memory cells 1475 to 1477.

Note that the transistor M3 may be a transistor containing silicon in a channel formation region (hereinafter referred to as a Si transistor in some cases). The conductivity type of the Si transistor may be either an n-channel type or a p-channel type. A Si transistor has higher field-effect mobility than an OS transistor in some cases. Therefore, a Si transistor may be used as the transistor M3 functioning as a read transistor. Furthermore, the use of a Si transistor as the transistor M3 enables the transistor M2 to be stacked over the transistor M3, in which case the area occupied by the memory cell can be reduced and high integration of the memory device can be achieved.

Alternatively, the transistor M3 may be an OS transistor. When an OS transistor is used as each of the transistors M2 and M3, the circuit of the memory cell array 1470 can be configured using only n-channel transistors.

Figure 19H:
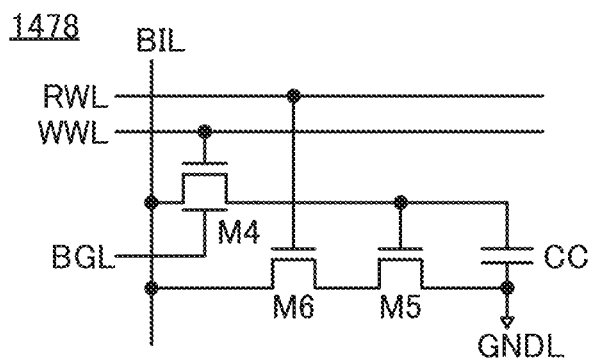

FIG. 19(H) illustrates an example of a gain-cell type memory cell including three transistors and one capacitor. A memory cell 1478 illustrated in FIG. 19(H) includes transistors M4 to M6 and a capacitor CC. The capacitor CC is provided as appropriate. The memory cell 1478 is electrically connected to wirings BIL, RWL, WWL, BGL, and a GNDL. The wiring GNDL is a wiring for supplying a low-level potential. Note that the memory cell 1478 may be electrically connected to the wirings RBL and WBL instead of the wiring BIL.

The transistor M4 is an OS transistor including a back gate, and the back gate is electrically connected to the wiring BGL. Note that the back gate and a gate of the transistor M4 may be electrically connected to each other. Alternatively, the transistor M4 does not necessarily include the back gate.

Note that each of the transistors M5 and M6 may be an n-channel Si transistor or a p-channel Si transistor. Alternatively, the transistors M4 to M6 may be OS transistors, in which case the circuit of the memory cell array 1470 can be configured using only n-channel transistors.

In the case where the semiconductor device described in any of the above embodiments is used in the memory cell 1478, the transistor 200 can be used as the transistor M4, the transistor 300 can be used as the transistors M5 and M6, and the capacitor 100 can be used as the capacitor CC. When an OS transistor is used as the transistor M4, the leakage current of the transistor M4 can be extremely low.

Note that the configurations of the peripheral circuit 1411, the memory cell array 1470, and the like described in this embodiment are not limited to the above. The arrangement and functions of these circuits and the wirings, circuit components, and the like connected to the circuits can be changed, removed, or added as needed.

The structures, methods, and the like described above in this embodiment can be used in combination as appropriate with the structures, methods, and the like described in the other embodiments and other examples.

Embodiment 4

In this embodiment, an example of a chip 1200 on which the semiconductor device of the present invention is mounted is described with reference to FIG. 20. A plurality of circuits (systems) are mounted on the chip 1200. A technique for integrating a plurality of circuits (systems) into one chip is referred to as system on chip (SoC) in some cases.

Figure 20A:
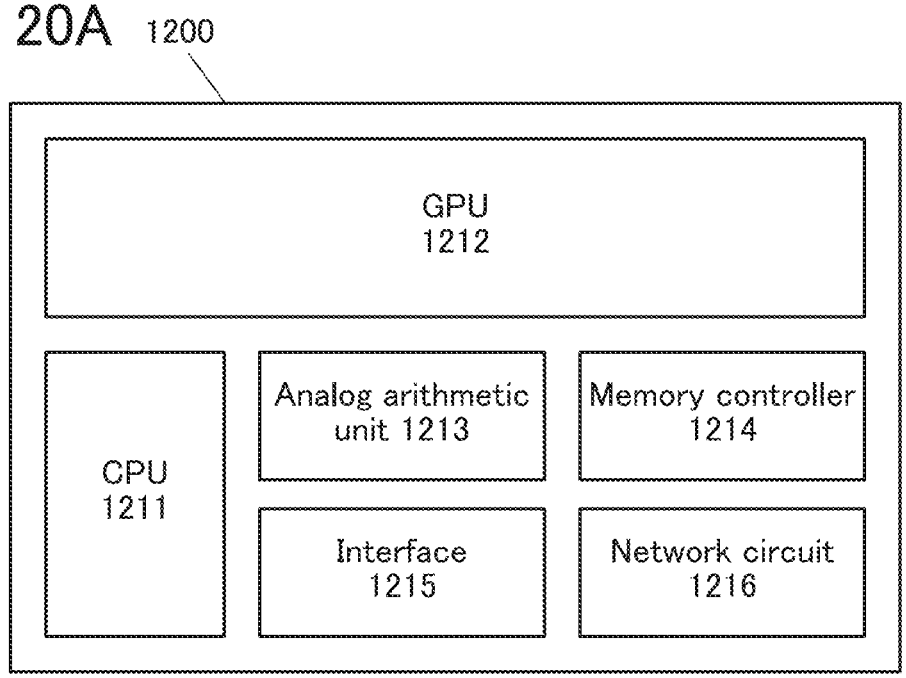
FIG. 20(A) is a block diagram illustrating a configuration example of a semiconductor device.

As illustrated in FIG. 20(A), the chip 1200 includes a CPU (Central Processing Unit) 1211, a GPU (Graphics Processing Unit) 1212, one or a plurality of analog arithmetic units 1213, one or a plurality of memory controllers 1214, one or a plurality of interfaces 1215, one or a plurality of network circuits 1216, and the like.

Figure 20B:
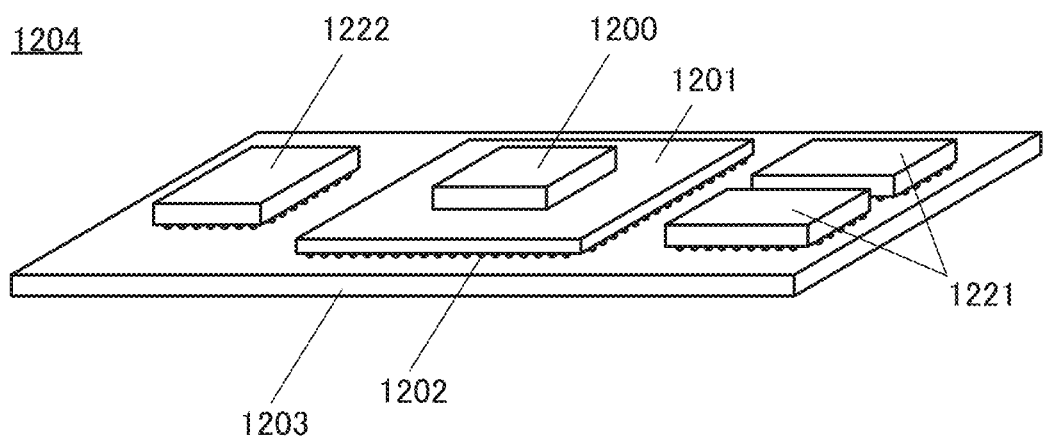
FIG. 20(B) is a schematic diagram illustrating a structure example of the semiconductor device.

A bump (not illustrated) is provided on the chip 1200, and is connected to a first surface of a printed circuit board (PCB) 1201 as illustrated in FIG. 20(B). A plurality of bumps 1202 are provided on the rear surface of the first surface of the PCB 1201 and are connected to a motherboard 1203.

Memory devices such as DRAMs 1221 and a flash memory 1222 may be provided over the motherboard 1203. For example, the DOSRAM described in the foregoing embodiment can be used as the DRAM 1221. In addition, for example, the NOSRAM described in the foregoing embodiment can be used as the flash memory 1222.

The CPU 1211 preferably includes a plurality of CPU cores. The GPU 1212 preferably includes a plurality of GPU cores. The CPU 1211 and the GPU 1212 may each include a memory for temporarily storing data. Alternatively, a common memory for the CPU 1211 and the GPU 1212 may be provided in the chip 1200. The NOSRAM or the DOSRAM described above can be used as the memory. The GPU 1212 is suitable for parallel computation of a number of data and thus can be used for image processing and product-sum operation. When an image processing circuit or a product-sum operation circuit using an oxide semiconductor of the present invention is provided in the GPU 1212, image processing and product-sum operation can be performed with low power consumption.

Since the CPU 1211 and the GPU 1212 are provided on the same chip, a wiring between the CPU 1211 and the GPU 1212 can be shortened, and the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the product-sum operation circuit may be provided in the analog arithmetic unit 1213.

The memory controller 1214 includes a circuit functioning as a controller for the DRAM 1221 and a circuit functioning as an interface to the flash memory 1222.

The interface 1215 includes an interface circuit for an external connection device such as a display device, a speaker, a microphone, a camera, or a controller. Examples of the controller include a mouse, a keyboard, and a game controller. As such an interface, a USB (Universal Serial Bus), an HDMI (registered trademark) (High-Definition Multimedia Interface), or the like can be used.

The network circuit 1216 includes a circuit for a network such as a LAN (Local Area Network). The network circuit 1216 may further include a circuit for network security.

The circuits (systems) can be formed in the chip 1200 through the same manufacturing process. Therefore, even when the number of circuits needed for the chip 1200 increases, there is no need to increase the number of steps in the manufacturing process; thus, the chip 1200 can be fabricated at low cost.

The motherboard 1203 provided with the PCB 1201 on which the chip 1200 including the GPU 1212 is mounted, the DRAMs 1221, and the flash memory 1222 can be referred to as a GPU module 1204.

The GPU module 1204 includes the chip 1200 using SoC technology, and thus can have a small size. In addition, the GPU module 1204 is excellent in image processing, and thus is suitably used in portable electronic devices such as a smartphone, a tablet terminal, a laptop PC, and a portable (mobile) game machine. Furthermore, the product-sum operation circuit using the GPU 1212 can implement arithmetic operation such as a deep neural network (DNN), a convolutional neural network (CNN), a recurrent neural network (RNN), an autoencoder, a deep Boltzmann machine (DBM), or a deep belief network (DBN); thus, the chip 1200 can be used as an AI chip or the GPU module 1204 can be used as an AI system module.

The structures, methods, and the like described above in this embodiment can be used in combination as appropriate with the structures, methods, and the like described in the other embodiments and other examples.

Embodiment 5

In this embodiment, application examples of the memory device using the semiconductor device described in the foregoing embodiment will be described. The semiconductor device described in the foregoing embodiment can be applied to, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the foregoing embodiment is applied to a variety of removable memory devices such as memory cards (e.g., SD cards), USB memories, and SSDs (solid state drives). FIG. 21 schematically illustrates some structure examples of removable memory devices. The semiconductor device described in the foregoing embodiment is processed into a packaged memory chip and used in a variety of storage devices and removable memories, for example.

Figure 21A:
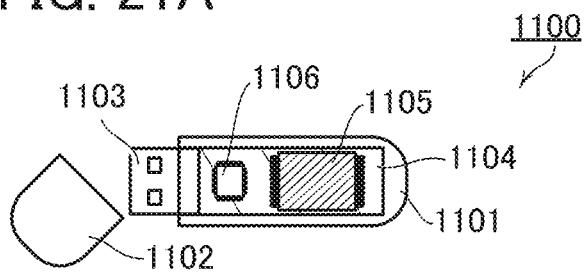
FIG. 21(A) to FIG. 21(E) are schematic diagrams illustrating structure examples of memory devices.

FIG. 21(A) is a schematic diagram of a USB memory. A USB memory 1100 includes a housing 1101, a cap 1102, a USB connector 1103, and a substrate 1104. The substrate 1104 is held in the housing 1101. The substrate 1104 is provided with a memory chip 1105 and a controller chip 1106, for example. The semiconductor device described in the foregoing embodiment can be incorporated in the memory chip 1105 or the like on the substrate 1104.

Figures 21B, 21C:
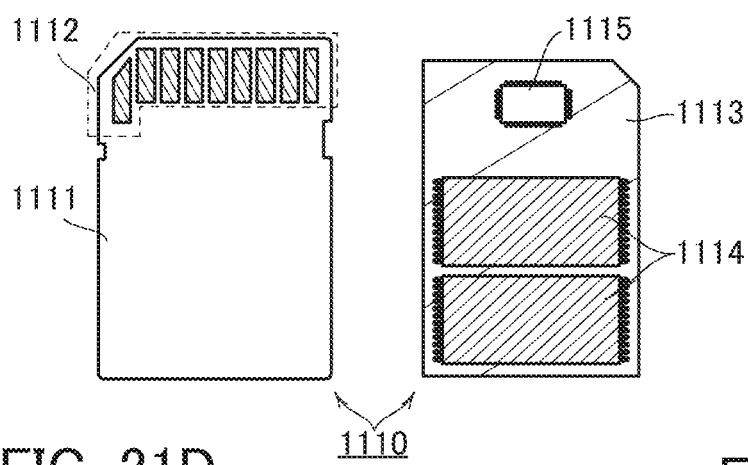

FIG. 21(B) is an external schematic diagram of an SD card, and FIG. 21(C) is a schematic diagram illustrating the internal structure of the SD card. An SD card 1110 includes a housing 1111, a connector 1112, and a substrate 1113. The substrate 1113 is held in the housing 1111. The substrate 1113 is provided with a memory chip 1114 and a controller chip 1115, for example. When the memory chip 1114 is also provided on the back side of the substrate 1113, the capacity of the SD card 1110 can be increased. In addition, a wireless chip with a radio communication function may be provided on the substrate 1113. Accordingly, data can be read from and written in the memory chip 1114 by radio communication between a host device and the SD card 1110. The semiconductor device described in the foregoing embodiment can be incorporated in the memory chip 1114 or the like on the substrate 1113.

Figures 21D, 21E:
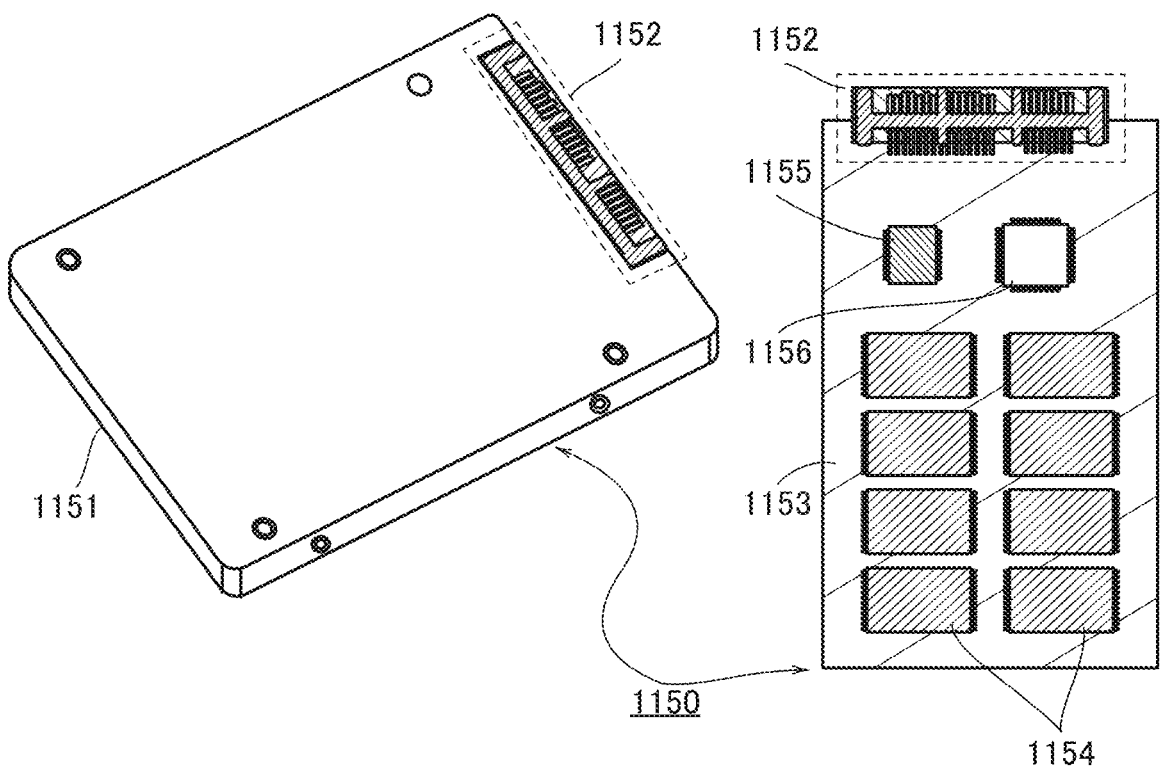

FIG. 21(D) is an external schematic diagram of an SSD, and FIG. 21(E) is a schematic diagram of the internal structure of the SSD. An SSD 1150 includes a housing 1151, a connector 1152, and a substrate 1153. The substrate 1153 is held in the housing 1151. The substrate 1153 is provided with a memory chip 1154, a memory chip 1155, and a controller chip 1156, for example. The memory chip 1155 is a work memory of the controller chip 1156, and a DOSRAM chip can be used, for example. When the memory chip 1154 is also provided on the back side of the substrate 1153, the capacity of the SSD 1150 can be increased. The semiconductor device described in the foregoing embodiment can be incorporated in the memory chip 1154 or the like on the substrate 1153.

The structures, methods, and the like described above in this embodiment can be used in combination as appropriate with the structures, methods, and the like described in the other embodiments and other examples.

Embodiment 6

In this embodiment, specific examples of electronic devices to which the semiconductor device of one embodiment of the present invention can be applied will be described with reference to FIG. 22.

Specifically, the semiconductor device of one embodiment of the present invention can be used in such as CPUs and GPUs or chips. FIG. 22 illustrates specific examples of electronic devices including processors such as CPUs and GPUs or chips of one embodiment of the present invention.
<Electronic Devices and System>

The GPU or the chip of one embodiment of the present invention can be incorporated into a variety of electronic devices. Examples of electronic devices include a digital camera, a digital video camera, a digital photo frame, a mobile phone, a portable game machine, a portable information terminal, and an audio reproducing device in addition to electronic devices provided with a relatively large screen, such as a television device, a desktop or laptop personal computer, a monitor for a computer and the like, digital signage, and a large game machine like a pachinko machine. When the integrated circuit or the chip of one embodiment of the present invention is provided in an electronic device, the electronic device can include artificial intelligence.

The electronic device of one embodiment of the present invention may include an antenna. When a signal is received by the antenna, the electronic device can display a video, data, and the like on the display portion. When the electronic device includes an antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, power, radioactive rays, flow rate, humidity, a gradient, oscillation, odor, or infrared rays).

The electronic device of one embodiment of the present invention can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 22 illustrates examples of electronic devices.

[Mobile Phone]

Figure 22A:
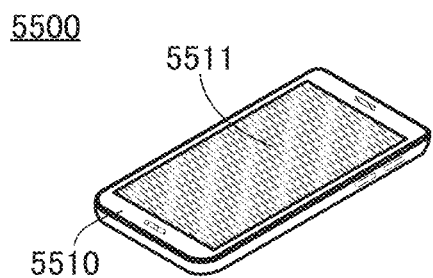

FIG. 22(A) illustrates a mobile phone (smartphone), which is a type of information terminal. An information terminal 5500 includes a housing 5510 and a display portion 5511. As input interfaces, a touch panel is provided in the display portion 5511, and a button is provided in the housing 5510.

The information terminal 5500 can execute an application utilizing artificial intelligence, with the use of the chip of one embodiment of the present invention. Examples of the application utilizing artificial intelligence include an application for interpreting a conversation and displaying its content on the display portion 5511; an application for recognizing letters, figures, and the like input to the touch panel of the display portion 5511 by a user and displaying them on the display portion 5511; and an application for biometric authentication using fingerprints, voice prints, or the like.

[Information Terminal 1]

Figure 22B:
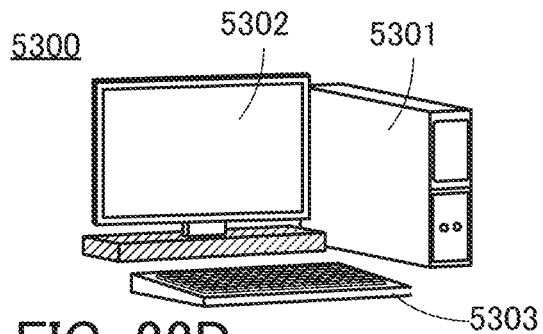

FIG. 22(B) illustrates a desktop information terminal 5300. The desktop information terminal 5300 includes a main body 5301 of the information terminal, a display 5302, and a keyboard 5303.

Like the information terminal 5500 described above, the desktop information terminal 5300 can execute an application utilizing artificial intelligence, with the use of the chip of one embodiment of the present invention. Examples of the application utilizing artificial intelligence include design-support software, text correction software, and software for automatic menu generation. Furthermore, with the use of the desktop information terminal 5300, novel artificial intelligence can be developed.

Note that in the above description, although the smartphone and the desktop information terminal are respectively illustrated in FIGS. 22(A) and 22(B) as examples of electronic devices, the chip of one embodiment of the present invention can also be applied to information terminals other than the smartphone and the desktop information terminal. Examples of information terminals other than a smartphone and a desktop information terminal include a PDA (Personal Digital Assistant), a laptop information terminal, and a workstation.

[Household Appliance]

Figure 22C:
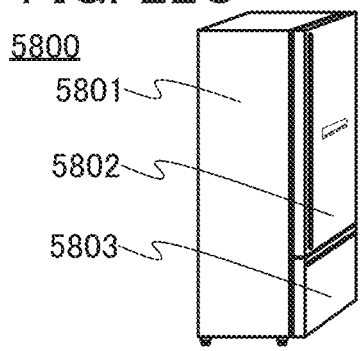

FIG. 22(C) illustrates an electric refrigerator-freezer 5800 as an example of a household appliance. The electric refrigerator-freezer 5800 includes a housing 5801, a refrigerator door 5802, a freezer door 5803, and the like.

When the chip of one embodiment of the present invention is used in the electric refrigerator-freezer 5800, the electric refrigerator-freezer 5800 including artificial intelligence can be achieved. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting temperature to be appropriate for the foods stored in the electric refrigerator-freezer 5800, and the like.

Although the electric refrigerator-freezer is described here as an example of a household appliance, other examples of household appliances include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

[Game Machine]

Figure 22D:
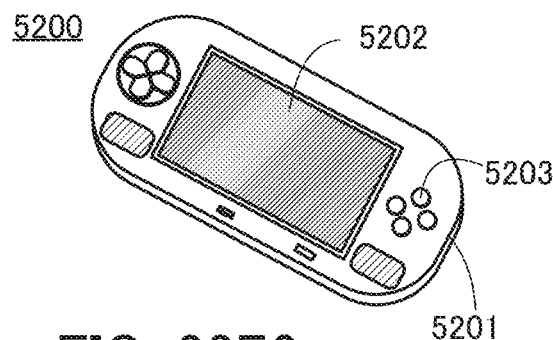
Figure 22D:
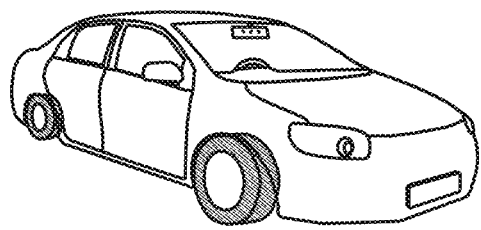
Figure 22D:
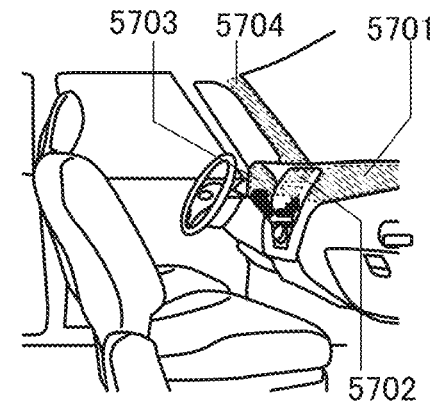

FIG. 22(D) illustrates a portable game machine 5200 as an example of a game machine. The portable game machine 5200 includes a housing 5201, a display portion 5202, a button 5203, and the like.

When the GPU or the chip of one embodiment of the present invention is used in the portable game machine 5200, the portable game machine 5200 with low power consumption can be obtained. Moreover, heat generation from a circuit can be reduced owing to low power consumption; thus, the influence of heat generation on the circuit, the peripheral circuit, and the module can be reduced.

Furthermore, when the GPU or the chip of one embodiment of the present invention is used in the portable game machine 5200, the portable game machine 5200 including artificial intelligence can be obtained.

In general, the progress of a game, the actions and words of game characters and expressions of a phenomenon and the like in the game are programed in the game; however, the use of artificial intelligence in the portable game machine 5200 enables expressions not limited by the game program. For example, it becomes possible to change expressions such as questions posed by the player, the progress of the game, time, and actions and words of game characters.

When a game requiring a plurality of players is played on the portable game machine 5200, the artificial intelligence can create a virtual game player; thus, the game can be played alone with the game player created by the artificial intelligence as an opponent.

Although the portable game machine is illustrated as an example of a game machine in FIG. 22(D), the game machine using the GPU or the chip of one embodiment of the present invention is not limited thereto. Examples of the game machine using the GPU or the chip of one embodiment of the present invention include a home stationary game machine, an arcade game machine installed in entertainment facilities (a game center, an amusement park, and the like), and a throwing machine for batting practice installed in sports facilities.

[Moving Vehicle]

The GPU or the chip of one embodiment of the present invention can be used in an automobile, which is a moving vehicle, and around a driver's seat in the automobile.

FIG. 22(E1) illustrates an automobile 5700, which is an example of a moving vehicle, and FIG. 22(E2) is a diagram illustrating the surroundings of a windshield inside the automobile. FIG. 22(E2) illustrates a display panel 5701, a display panel 5702, and a display panel 5703 that are attached to a dashboard, and a display panel 5704 that is attached to a pillar.

The display panel 5701 to the display panel 5703 can provide a variety of other information by displaying a speedometer, a tachometer, mileage, a fuel gauge, a gear state, air-condition setting, and the like. In addition, the content, layout, and the like of the display on the display panels can be changed as appropriate to suit the user's preference, so that the design quality can be increased. The display panel 5701 to the display panel 5703 can also be used as lighting devices.

The display panel 5704 can compensate for the view obstructed by the pillar (a blind spot) by showing an image taken by an imaging device (not illustrated) provided for the automobile 5700. That is, displaying an image taken by the imaging device provided on the outside of the automobile 5700 leads to compensation for the blind spot and enhancement of safety. In addition, displaying an image to compensate for a portion that cannot be seen makes it possible for the driver to confirm the safety more naturally and comfortably. The display panel 5704 can also be used as a lighting device.

Since the GPU or the chip of one embodiment of the present invention can be used as a component of artificial intelligence, the chip can be used in an automatic driving system of the automobile 5700, for example. The chip can also be used for a navigation system, risk prediction, or the like. A structure may be employed in which the display panel 5701 to the display panel 5704 display navigation information, risk prediction information, or the like.

Note that although an automobile is described above as an example of a moving vehicle, the moving vehicle is not limited to an automobile. Examples of the moving vehicle include a train, a monorail train, a ship, and a flying vehicle (a helicopter, an unmanned aircraft (a drone), an airplane, and a rocket), and these moving vehicles can each include a system utilizing artificial intelligence when the chip of one embodiment of the present invention is used in these moving vehicles.

[Broadcasting System]

The GPU or the chip of one embodiment of the present invention can be used in a broadcasting system.

Figure 22F:
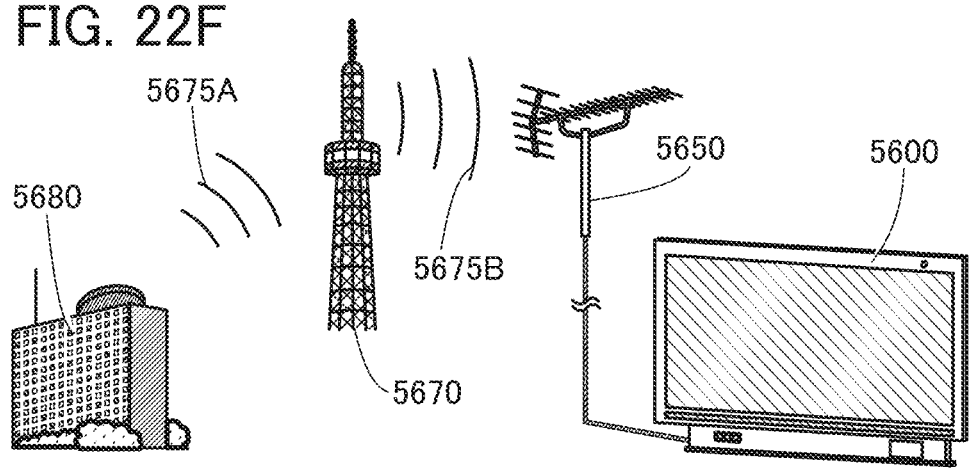

FIG. 22(F) schematically illustrates data transmission in a broadcasting system. Specifically, FIG. 22(F) illustrates a path in which a radio wave (a broadcast signal) transmitted from a broadcast station 5680 is delivered to a television receiver (TV) 5600 of each household. The TV 5600 includes a receiving device (not illustrated), and the broadcast signal received by an antenna 5650 is transmitted to the TV 5600 through the receiving device.

Although a UHF (Ultra High Frequency) antenna is illustrated as the antenna 5650 in FIG. 22(F), a BS/110° CS antenna, a CS antenna, or the like can also be used as the antenna 5650.

A radio wave 5675A and a radio wave 5675B are broadcast signals for terrestrial broadcasting; a radio wave tower 5670 amplifies the received radio wave 5675A and transmits the radio wave 5675B. Each household can view terrestrial TV broadcasting on the TV 5600 by receiving the radio wave 5675B with the antenna 5650. Note that the broadcasting system is not limited to the terrestrial broadcasting shown in FIG. 22(F) and may be satellite broadcasting using an artificial satellite, data broadcasting using an optical line, or the like.

The above-described broadcasting system may utilize artificial intelligence by using the chip of one embodiment of the present invention. When the broadcast data is transmitted from the broadcast station 5680 to the TV 5600 at home, the broadcast data is compressed by an encoder. When the antenna 5650 receives the compressed broadcast data, the compressed broadcast data is decompressed by a decoder of the receiving device in the TV 5600. With the use of artificial intelligence, for example, a display pattern included in an image to be displayed can be recognized in motion compensation prediction, which is one of the compressing methods for the encoder. In-frame prediction utilizing artificial intelligence, for instance, can also be performed. As another example, when the broadcast data with low resolution is received and displayed on the TV 5600 with high resolution, image interpolation such as upconversion can be performed in the broadcast data decompression by the decoder.

The above-described broadcasting system utilizing artificial intelligence is suitable for ultra-high definition television (UHDTV: 4K, 8K) broadcasting, which needs a large amount of broadcast data.

As an application of artificial intelligence in the TV 5600, a recording device including artificial intelligence may be provided in the TV 5600, for example. With such a structure, the artificial intelligence in the recording device can learn the user's preference, so that TV programs that suit the user's preference can be recorded automatically.

The electronic devices, the functions of the electronic devices, the application examples of artificial intelligence, their effects, and the like described in this embodiment can be combined as appropriate with the description of another electronic device.

The structures, methods, and the like described above in this embodiment can be used in combination as appropriate with the structures, methods, and the like described in the other embodiments and other examples.

Example 1

In this example, the sheet resistance of a stack in which a conductor was provided over an oxide was measured. Tantalum nitride was used as the conductor over the oxide, and the sheet resistance of the tantalum nitride was measured. Samples used for the measurement are described.

First, a method of fabricating Sample A is described. A surface of a substrate containing silicon was subjected to heat treatment in a hydrogen chloride (HCl) atmosphere, and a 100-nm-thick silicon oxide film was formed over the substrate. Next, a 300-nm-thick silicon oxynitride film was formed over the silicon oxide film by a CVD method. Then, oxygen was injected into the silicon oxynitride film by an ion implantation method so that the silicon oxynitride film functions as an oxygen supply film. Next, a 5-nm-thick first oxide was formed over the silicon oxynitride film by a sputtering method using a target with In:Ga:Zn=4:2:4.1 [atomic ratio]. Then, a 5-nm-thick tantalum nitride film was formed over the first oxide by a sputtering method. The tantalum nitride film was formed using a target containing Ta in an atmosphere containing argon and nitrogen at room temperature.

Next, Sample B is described. Sample B includes the first oxide that was formed as in Sample A. A 1-nm-thick second oxide was formed over the first oxide by a sputtering method using a target with In:Ga:Zn=1:3:4 [atomic ratio]. Next, a tantalum nitride film was formed over the second oxide, as in Sample A.

Next, Sample C is described. Sample C includes the first oxide that was formed as in Sample A and Sample B. A 5-nm-thick second oxide was formed over the first oxide by a sputtering method using a target with In:Ga:Zn=1:3:4 [atomic ratio]. Next, a tantalum nitride film was formed over the second oxide, as in Sample A and Sample B.

Sample A, Sample B, and Sample C were respectively divided into eight samples of Sample A1 to Sample A8, Sample B1 to Sample B8, and Sample C1 to Sample C8. The samples were subjected to treatment under two conditions of heat treatment temperature in a nitrogen atmosphere of 150° C. and 175° C. and four conditions of heat treatment time of 0, 1 hour, 10 hours, and 100 hours, i.e., under a total of eight conditions. Table 1 shows a summary of the treatment conditions of all the samples.

TABLE 1

| | | Heat treatment temperature of 150° C. | | | | Heat treatment temperature of 175° C. | | | |
|---|---|---|---|---|---|---|---|---|---|
| Sample No. | | 0 | 1 hour | 10 hours | 100 hours | 0 | 1 hour | 10 hours | 100 hours |
| Thickness of second oxide | 0 | A1 | A2 | A3 | A4 | A5 | A6 | A7 | A8 |
| | 1 nm | B1 | B2 | B3 | B4 | B5 | B6 | B7 | B8 |
| | 5 nm | C1 | C2 | C3 | C4 | C5 | C6 | C7 | C8 |

Figure 23A:
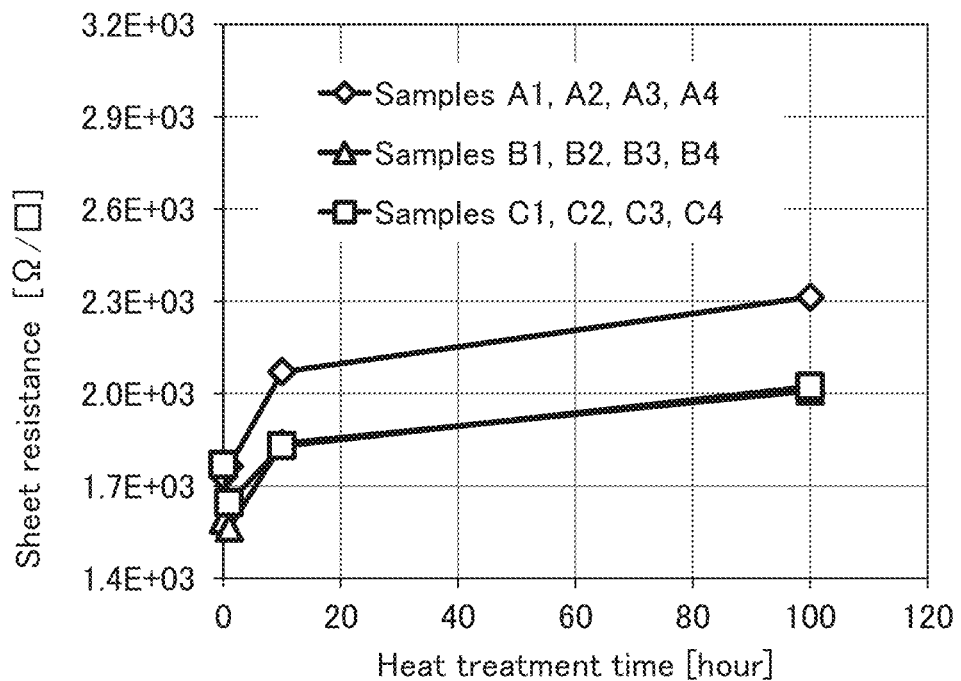
FIG. 23(A) and FIG. 23(B) are graphs each showing heat treatment time dependence of sheet resistance of tantalum nitride in Example.
Figure 23B:
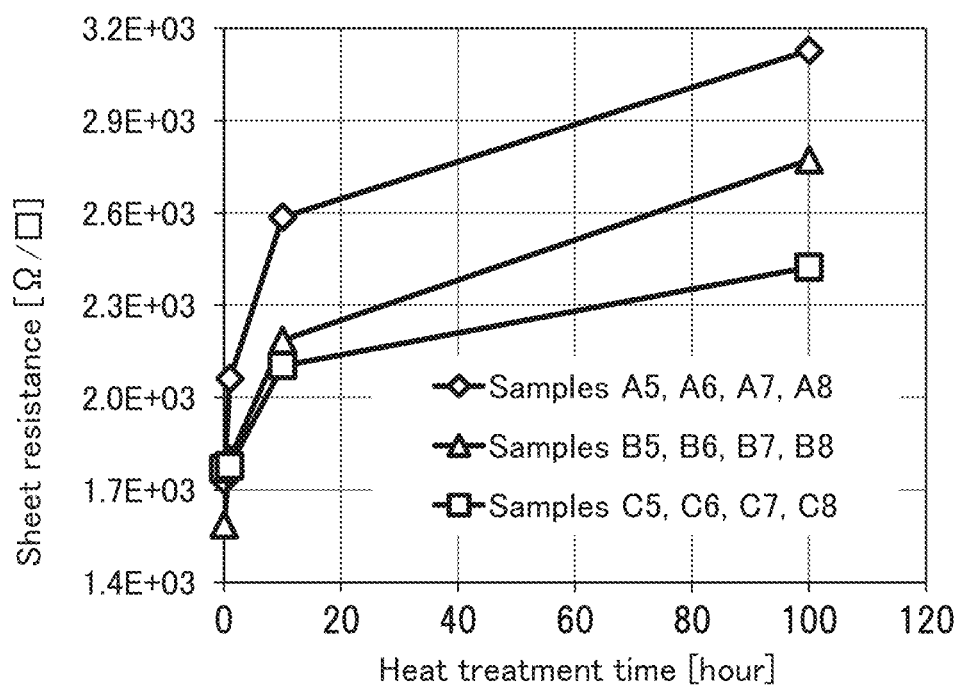

FIG. 23 shows graphs of heat treatment time dependence of sheet resistance of tantalum nitride. FIG. 23(A) is a graph with a heat treatment temperature of 150° C. FIG. 23(B) is a graph with a heat treatment temperature of 175° C. In all the samples, the increase in sheet resistance of the tantalum nitride is observed as the heat treatment time increases; however, it was found that the increase in sheet resistance of the tantalum nitride in Sample B and Sample C, in each of which the second oxide was provided between the first oxide and the tantalum nitride, was smaller than the increase in sheet resistance of the tantalum nitride in Sample A, in which the second oxide was not provided. In addition, at a heating temperature of 150° C. shown in FIG. 23(A), no difference in the increase in sheet resistance of the tantalum nitride was observed between Sample B including a 1-nm-thick second oxide and Sample C including a 5-nm-thick second oxide. At a heating temperature of 175° C. shown in FIG. 23(B), the results were such that the increase in sheet resistance of the tantalum nitride was smaller in Sample C including a 5-nm-thick second oxide than in Sample B including a 1-nm-thick second oxide.

This example can be used in an appropriate combination with the structures, methods, and the like described in other embodiments and the other examples.

Example 2

In this example, in a stack in which a conductor was provided over an oxide, the sheet resistance of the oxide in the depth direction was measured. Samples used for the measurement are described.

First, a method of fabricating Sample D is described. A quartz substrate was prepared, and a 500-nm-thick first oxide was formed over the quartz substrate by a sputtering method using a target with In:Ga:Zn=4:2:4.1 [atomic ratio]. Next, heat treatment in a nitrogen atmosphere was performed at 400° C. for one hour, and then heat treatment in an oxygen atmosphere was successively performed at 400° C. for one hour.

Then, a 20-nm-thick tantalum nitride film was formed over the first oxide by a sputtering method. The tantalum nitride film was formed using a target containing Ta in an atmosphere containing argon and nitrogen at room temperature.

Next, Sample E is described. Sample E includes the first oxide that was formed as in Sample D. A 1-nm-thick second oxide was formed over the first oxide by a sputtering method using a target with In:Ga:Zn=1:3:4 [atomic ratio]. Next, heat treatment in a nitrogen atmosphere was performed at 400° C. for one hour, and then heat treatment in an oxygen atmosphere was successively performed at 400° C. for one hour.

Then, a 20-nm-thick tantalum nitride film was formed over the first oxide by a sputtering method. The tantalum nitride film was formed using a target containing Ta in an atmosphere containing argon and nitrogen at room temperature.

Next, Sample F is described. Sample F includes the first oxide that was formed as in Sample D and Sample E. A 5-nm-thick second oxide was formed over the first oxide by a sputtering method using a target with In:Ga:Zn=1:3:4 [atomic ratio]. Next, heat treatment in a nitrogen atmosphere was performed at 400° C. for one hour, and then heat treatment in an oxygen atmosphere was successively performed at 400° C. for one hour.

Then, a 20-nm-thick tantalum nitride film was formed over the first oxide by a sputtering method. The tantalum nitride film was formed using a target containing Ta in an atmosphere containing argon and nitrogen at room temperature.

Sample D, Sample E, and Sample F were respectively divided into eight samples of Sample D1 to Sample D8, Sample E1 to Sample E8, and Sample F1 to Sample F8. The samples were subjected to treatment under two conditions of heat treatment temperature in a nitrogen atmosphere of 150° C. and 175° C. and four conditions of heat treatment time of 0, 1 hour, 10 hours, and 100 hours, i.e., under a total of eight conditions. Table 2 shows a summary of the treatment conditions of all the samples.

TABLE 2

| | | Heat treatment temperature of 150° C. | | | | Heat treatment temperature of 175° C. | | | |
|---|---|---|---|---|---|---|---|---|---|
| Sample No. | | 0 | 1 hour | 10 hours | 100 hours | 0 | 1 hour | 10 hours | 100 hours |
| Thickness of second oxide | 0 | D1 | D2 | D3 | D4 | D5 | D6 | D7 | D8 |
| | 1 nm | E1 | E2 | E3 | E4 | E5 | E6 | E7 | E8 |
| | 5 nm | F1 | F2 | F3 | F4 | F5 | F6 | F7 | F8 |

Next, the tantalum nitride of each sample was removed by a dry etching method. Subsequently, a step of measuring the sheet resistance of the first oxide (Step 1) was performed on each sample. Then, a step of etching the first oxide by approximately 3 nm (Step 2) was conducted. Next, a step of measuring the remaining thickness of the first oxide (Step 3) was performed. Then, Step 1 to Step 3 were repeated until the sheet resistance became $6 \times 10^6$ Ω/sq., which is an over range. Note that in Samples E1 to E8 and F1 to F8, there is a possibility that the sheet resistance of the second oxide was measured in the first Step 1; however, the influence on the results in this example is small.

Figure 24A:
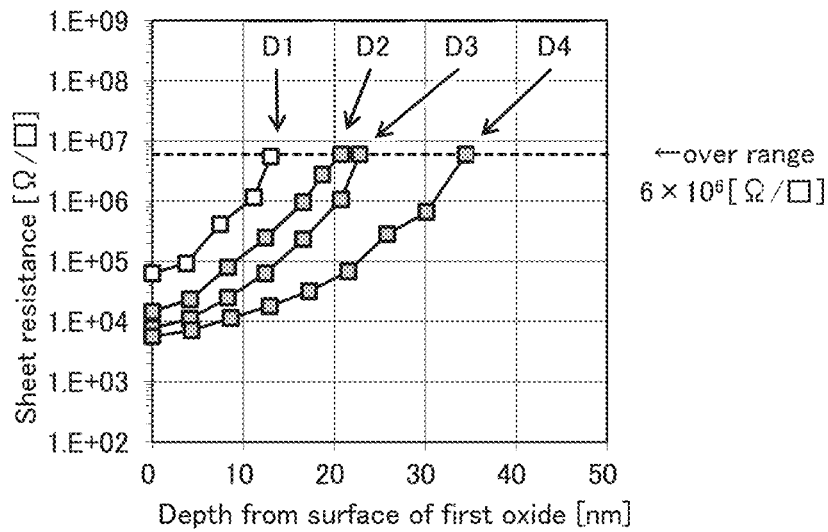
FIG. 24(A) to FIG. 24(C) are graphs each showing a change in the depth direction of sheet resistance of an oxide in Example.
Figure 24B:
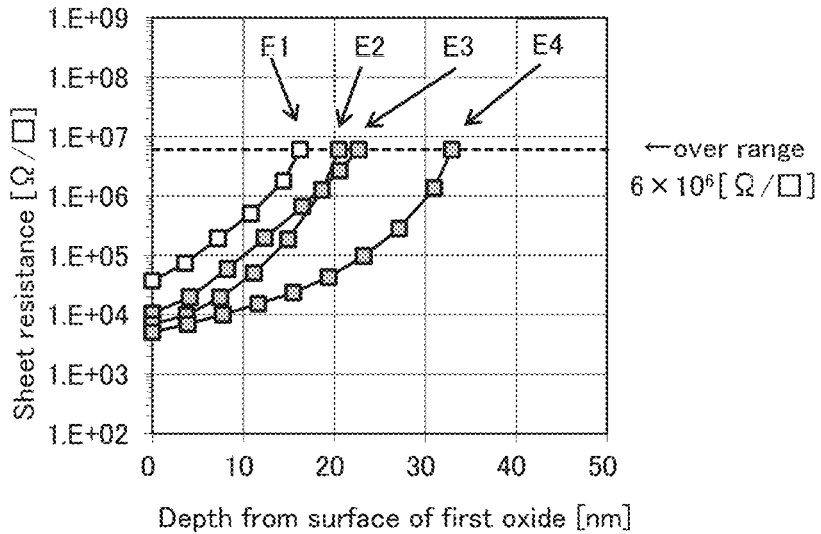
Figure 24C:
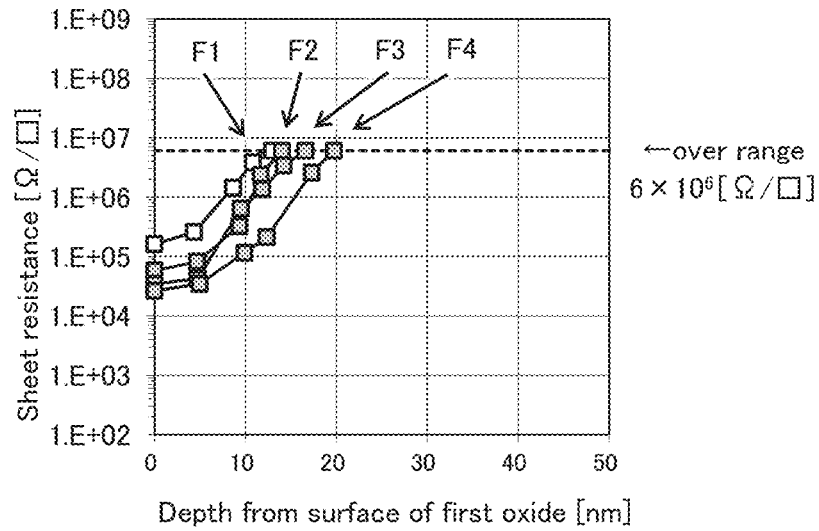
Figure 25A:
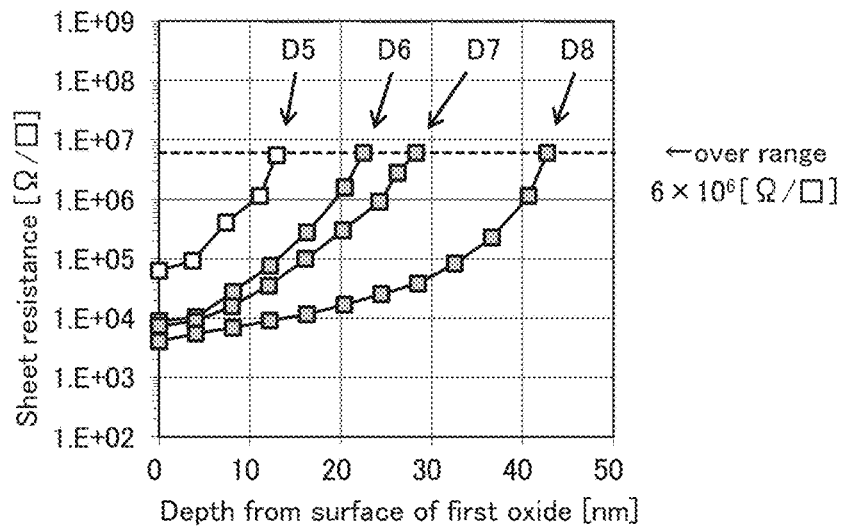
FIG. 25(A) to FIG. 25(C) are graphs each showing a change in the depth direction of sheet resistance of an oxide in Example.
Figure 25B:
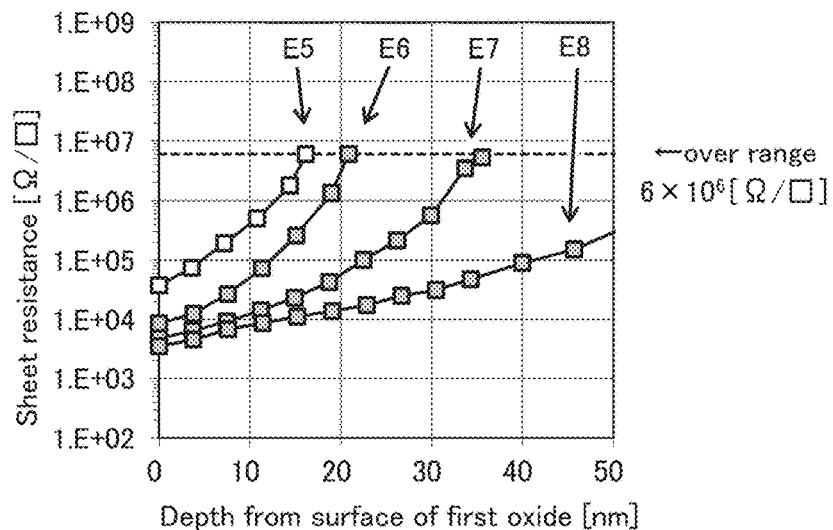
Figure 25C:
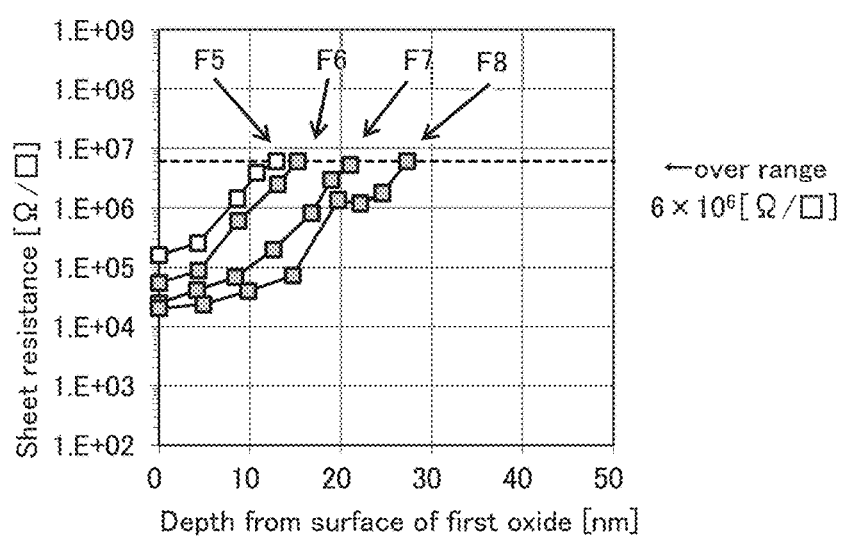

FIG. 24 and FIG. 25 show changes in the depth direction of the sheet resistance of the first oxide. FIG. 24 shows graphs at a heat treatment temperature of 150° C. FIG. 24(A) is a graph in the case where the second oxide is not provided. FIG. 24(B) is a graph in the case where the thickness of the second oxide was 1 nm. FIG. 24(C) is a graph in the case where the thickness of the second oxide was 5 nm. FIG. 25 shows graphs at a heat treatment temperature of 175° C. FIG. 25(A) is a graph in the case where the second oxide is not provided. FIG. 25(B) is a graph in the case where the thickness of the second oxide was 1 nm. FIG. 25(C) is a graph in the case where the thickness of the second oxide was 5 nm.

It was found from FIG. 24 and FIG. 25 that even when heat treatment was performed at a heat treatment temperature of 150° C. and 175° C. for 1 hour, 10 hours, and 100 hours, providing a 5-nm-thick second oxide between the first oxide and the conductor suppressed development of a low-resistance region of the first oxide in the depth direction, compared to the structure where the second oxide was not provided.

This example can be used in an appropriate combination with the structures, methods, and the like described in other embodiments and the other examples.

Example 3

In this example, with the use of a scanning transmission electron microscope (HD-2700, produced by Hitachi High-Technologies Corporation), cross-sectional observation of the portion shown in FIG. 3(A) and analysis by energy dispersive X-ray spectroscopy (EDX) were performed on samples in which the components up to the insulating film 250A were fabricated according to the method described in <Manufacturing method of semiconductor device>.

The structures of the fabricated samples are described. Samples G1 and G2 have a structure where the oxide 243 is not provided between the oxide 230b and the conductor 242. Samples H1 and H2 have a structure where the oxide 243 is provided between the oxide 230b and the conductor 242, and the thickness of the oxide 243 is 1 nm. Samples I1 and I2 have a structure where the oxide 243 is provided between the oxide 230b and the conductor 242, and the thickness of the oxide 243 is 2 nm. Samples J1 and J2 have a structure where the oxide 243 is provided between the oxide 230b and the conductor 242, and the thickness of the oxide 243 is 3 nm. In all the samples, the other components are the same.

In this example, the oxide 230b was deposited by a sputtering method using a target with In:Ga:Zn=4:2:4.1 [atomic ratio], and the oxide 243 was deposited using a target with In:Ga:Zn=1:3:4 [atomic ratio]. As the conductor 242, tantalum nitride was deposited by a sputtering method.

Samples G1, H1, I1, and J1 were subjected to heat treatment in a nitrogen atmosphere at a heating temperature of 400° C. for a heating time of 4 hours. Samples G2, H2, I2, and J2 were subjected to heat treatment in a nitrogen atmosphere at a heating temperature of 400° C. for a heating time of 8 hours.

Figure 26:
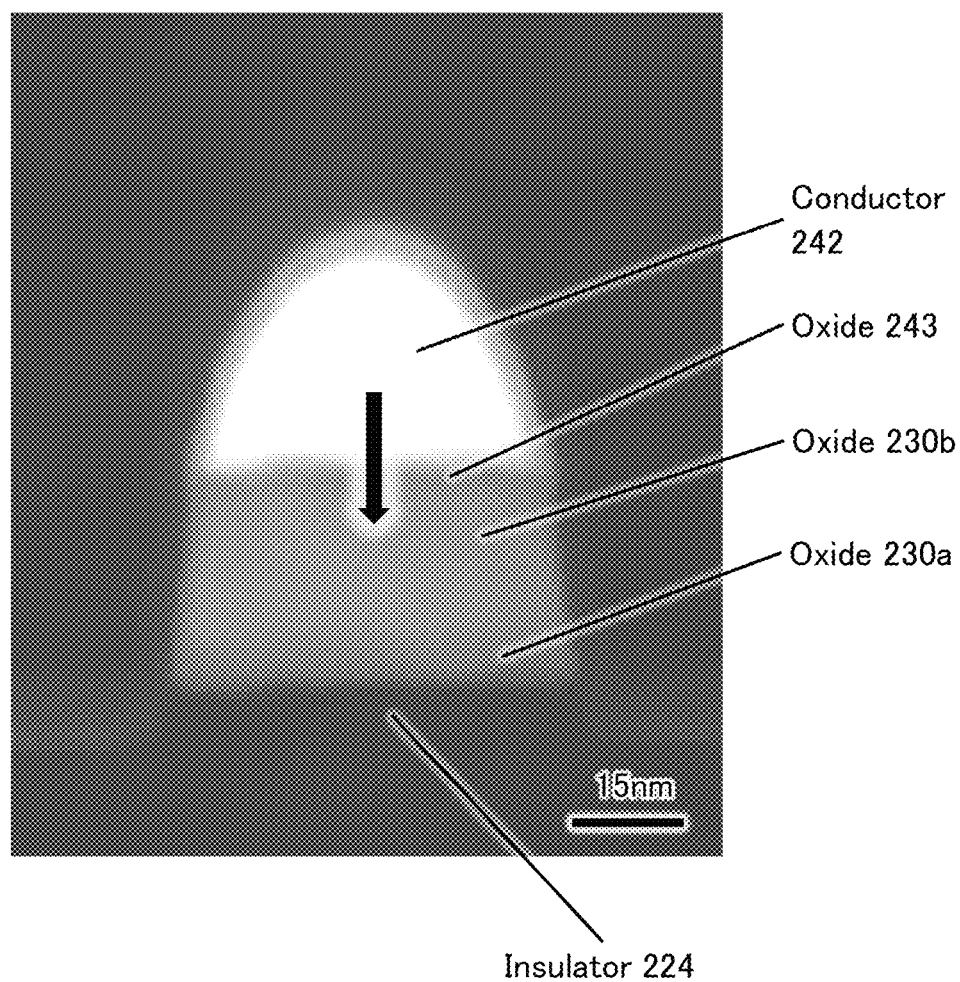
FIG. 26 is a cross-sectional image of a sample in Example.

After the above heat treatment, the cross section of each sample was observed. As an example, a cross-sectional image of Sample J1 is shown in FIG. 26. The stack of the oxide 230a, the oxide 230b, the oxide 243, and the conductor 242 was confirmed to be formed over the insulator 224.

Next, EDX line analysis was performed on each sample. An approximate position of the portion subjected to the analysis is indicated by the arrow in FIG. 26.

Figure 27:
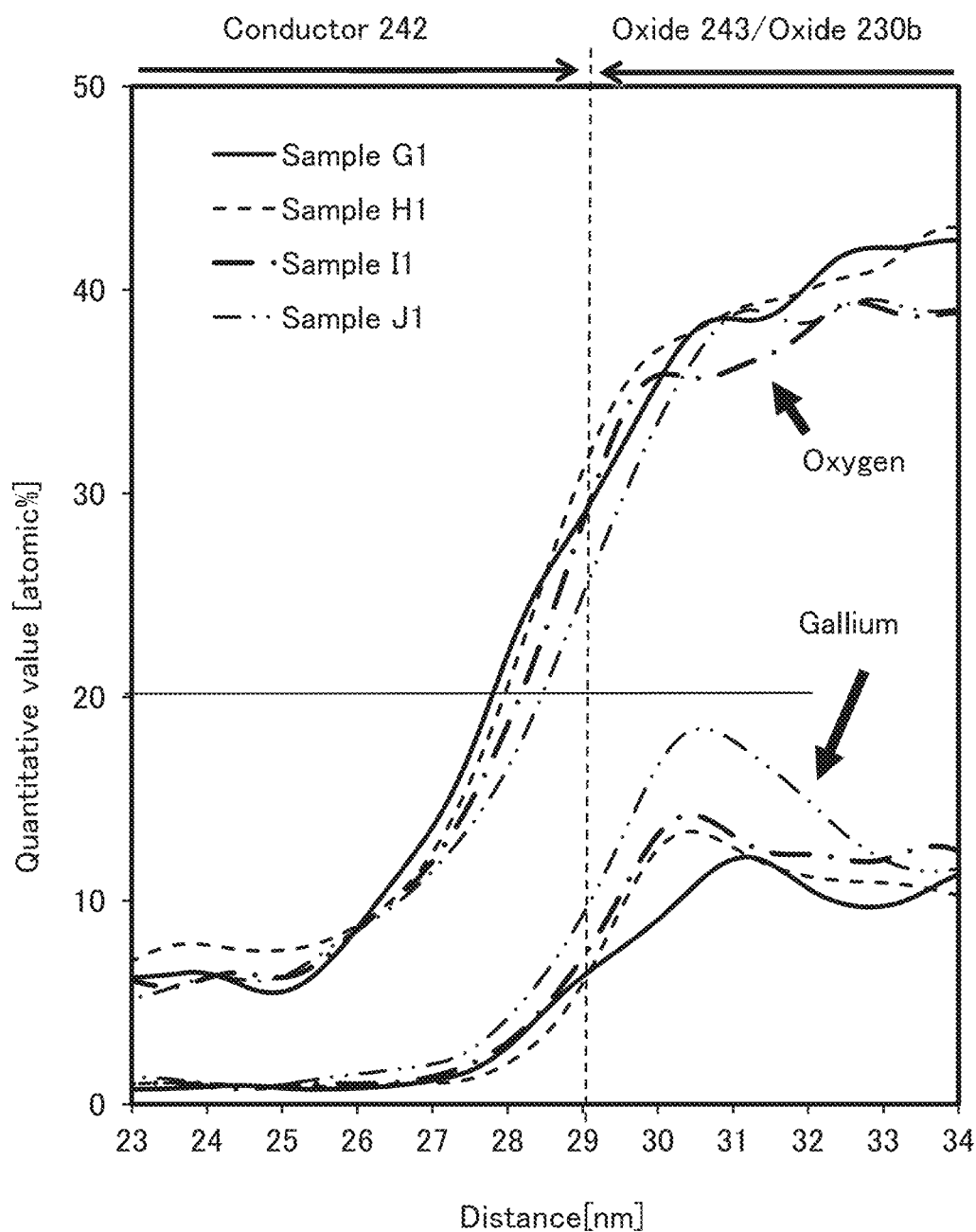
FIG. 27 is a graph showing EDX line analysis results in Example.
Figure 28:
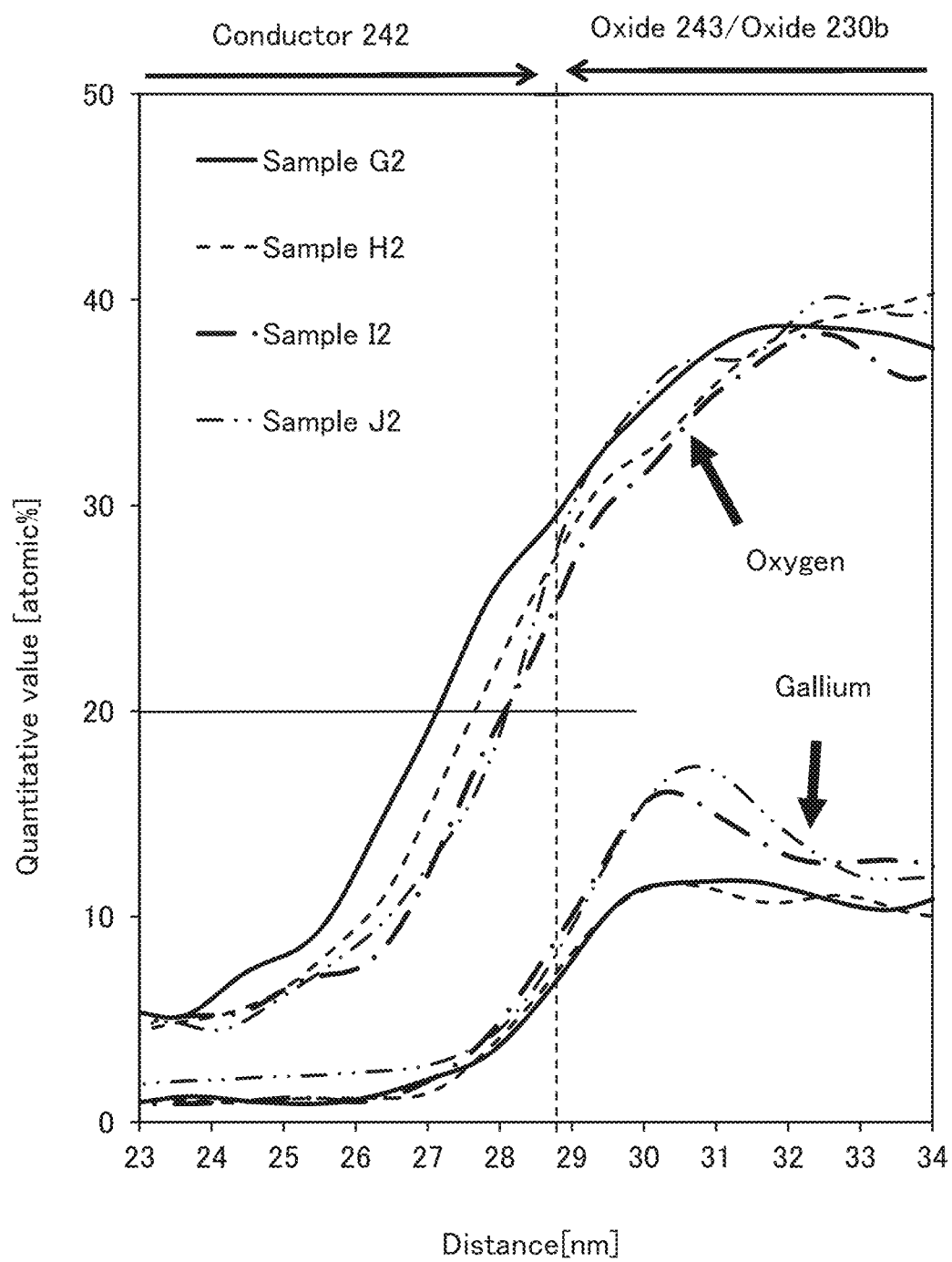
FIG. 28 is a graph showing EDX line analysis results in Example.

FIG. 27 and FIG. 28 show the summarized results of EDX line analysis on oxygen and gallium. The distance of the interface between the conductor and the oxide was obtained from the line analysis profile of gallium. The interface between the conductor and the oxide was near 29.1 nm in FIG. 27 and near 28.7 nm in FIG. 28. FIG. 27 shows the EDX line analysis results of oxygen and gallium of Samples G1, H1, I1, and J1 subjected to the heat treatment for 4 hours. FIG. 28 shows the EDX line analysis results of oxygen and gallium of Samples G2, H2, I2, and J2 subjected to a heating time of 8 hours.

In FIG. 27, the position where the oxygen profile of each sample intersects a quantitative value of 20 atomic % is at the smallest distance for Sample G1, in which the oxide 243 is not provided, and the ascending order of distance is Sample H1 including a 1-nm-thick oxide 243, Sample I1 including a 2-nm-thick oxide 243, and Sample J1 including a 3-nm-thick oxide 243. In other words, it is found that diffusion of oxygen into the conductor 242 tends to be suppressed as the thickness of the oxide 243 is larger. It is also found that FIG. 28 shows roughly the same tendency.

The above results demonstrate that the oxide 243 has a function of inhibiting diffusion of oxygen into the conductor 242, and that diffusion of oxygen into the conductor 242 tends to be suppressed as the thickness of the oxide 243 is larger.

This example can be used in an appropriate combination with the structures, methods, and the like described in other embodiments and the other examples.

Example 4

In this example, samples including the transistor 200 were fabricated by the method described in <Manufacturing method of semiconductor device>, and the reliability of the transistor 200 was evaluated. The fabricated samples were two types: Sample K and Sample L. Sample K and Sample L differ in the substrate temperature in formation of the oxide 243.

In Sample K, a 2-nm-thick oxide 243 was formed at a substrate temperature of 200° C. by a sputtering method using a target with In:Ga:Zn=1:3:4 [atomic ratio]. In Sample L, a 2-nm-thick oxide 243 was formed at a substrate temperature of 250° C. by a sputtering method using a target with In:Ga:Zn=1:3:4 [atomic ratio]. Note that both Sample J and Sample K were subjected to heat treatment in a nitrogen atmosphere at 400° C. for eight hours.

Next, the reliability of Sample K and Sample L was evaluated. The reliability was evaluated by a +GBT (Gate Bias Temperature) stress test. In the +GBT stress test, while the substrate is heated, the conductor 242a functioning as the source electrode of the transistor, the conductor 242b functioning as the drain electrode, and the conductor 205 functioning as the second gate (bottom gate) electrode are set to the same potential, and a potential higher than the potential applied to the conductor 242a, the conductor 242b, and the conductor 205 is applied to the conductor 260 functioning as the first gate (top gate) electrode for a certain time.

In the +GBT stress test according to this example, the set temperature was 150° C.; a drain potential Vd, a source potential Vs, and a bottom gate potential $V_{BG}$ were set to 0 V; and a top gate potential $V_G$ was set to +3.63 V. Note that the stress test was performed on two devices of each of Sample K and Sample L. As for the size of the evaluated devices, the design values of channel length and channel width were 60 nm and 60 nm.

The $I_D$-$V_G$ measurement was performed at certain intervals in the +GBT stress test. The $I_D$-$V_G$ measurement was performed under conditions where the drain potential Vd of the transistor was set to +1.2 V; the source potential Vs was set to 0 V; the bottom gate potential $V_{BG}$ was set to 0 V; and the gate potential $V_G$ was swept from −3.3 V to +3.3 V. Note that a semiconductor parameter analyzer manufactured by Keysight Technologies was used for the $I_D$-$V_G$ measurement. In the +GBT stress test, ΔVsh representing the amount of change in a shift voltage Vsh from the start of the measurement was used as an index of the amount of change in the electrical characteristics of the transistor. The shift voltage Vsh is defined as the value of Vg at the intersection of the tangent with the maximum slope of the Id-Vg curve and Id of $1.0 \times 10^{-12}$ (A).

Figure 29A:
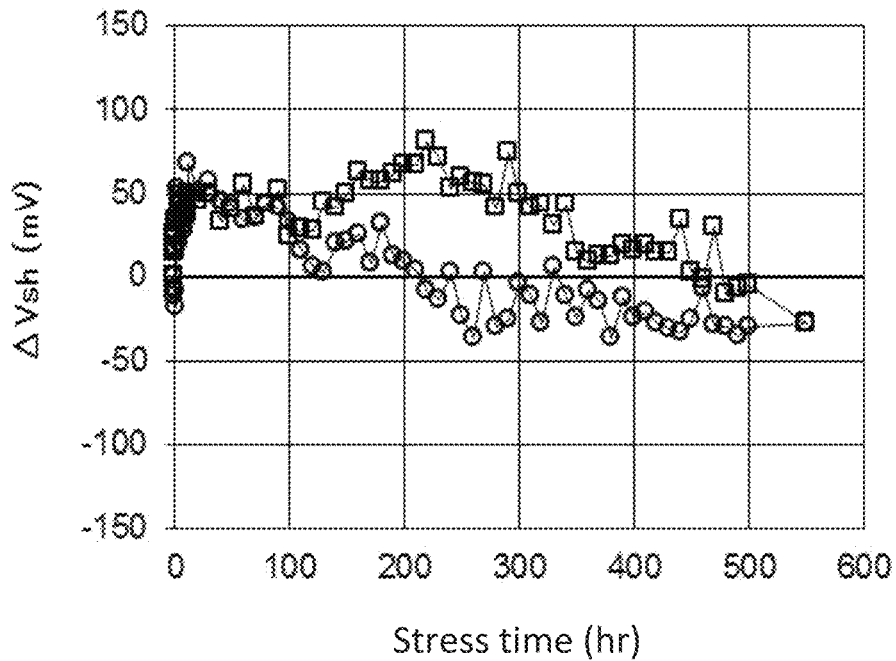
FIG. 29(A) and FIG. 29(B) are graphs each showing stress time dependence of ΔVsh in a +GBT stress test in Example.
Figure 29B:
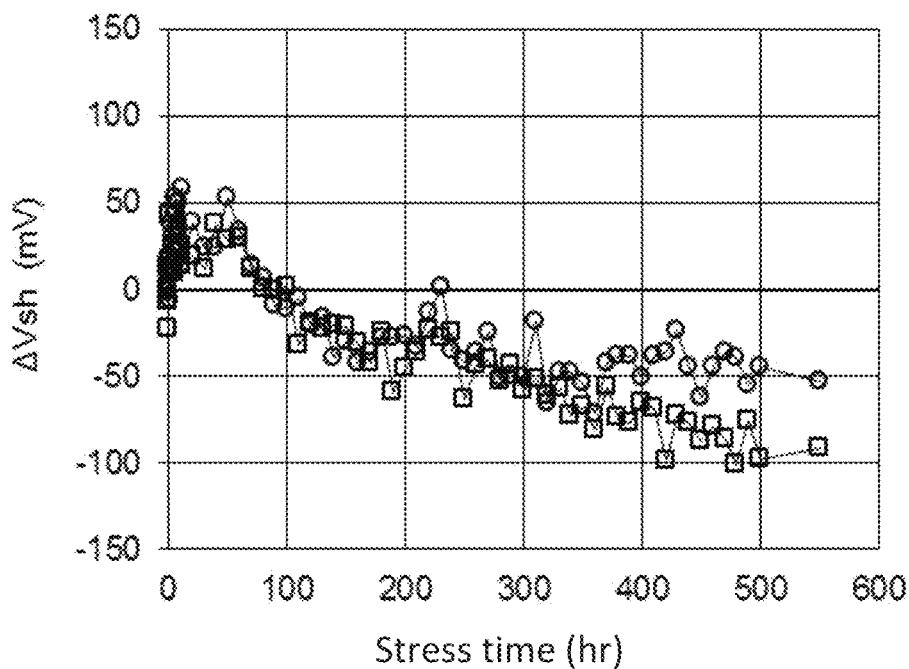

FIG. 29(A) shows the +GBT stress test results of Sample K. FIG. 29(B) shows the +GBT stress test results of Sample L. In FIG. 29, the horizontal axis represents stress time (hr), and the vertical axis represents ΔVsh (mV).

As shown in FIG. 29(A), the shift voltage change amount ΔVsh of both the two devices of Sample K is less than or equal to 100 mV after 550 hours have passed while the stress is being applied. In more detail, ΔVsh after 550 hours of the first device that is represented by white dots in the graph was 28 mV, and ΔVsh after 550 hours of the second device that is represented by white squares was 23 mV.

As shown in FIG. 29(B), the shift voltage change amount ΔVsh of both the two devices of Sample L is also less than or equal to 100 mV after 550 hours have passed while the stress is being applied. In more detail, ΔVsh after 550 hours of the first device that is represented by white dots in the graph was 53 mV, and ΔVsh after 550 hours of the second device that is represented by white squares was 92 mV.

The above results demonstrate that providing the oxide 243 between the oxide 230 and the conductor 242 can control ΔVsh due to the +GBT stress to be less than or equal to 100 mV after a stress time of 550 hours. It was also found that ΔVsh due to the +GBT stress was smaller in Sample K, in which the substrate temperature at the time of forming the oxide 243 was 200° C., than in Sample L, in which the substrate temperature at that time was 250° C.

This example can be used in an appropriate combination with the structures, methods, and the like described in other embodiments and the other examples.

Example 5

In this example, the reliability evaluation described in Example 4 was continuously performed, and the results at a stress time exceeding 1000 hours are described. A sample that is continuously subjected to the reliability evaluation was Sample K, in which a 2-nm-thick oxide 243 was formed at a substrate temperature of 200° C. by a sputtering method using a target with In:Ga:Zn=1:3:4 [atomic ratio]. As in Example 4, the reliability evaluation was conducted by a +GBT stress test at a stress temperature of 150° C. Note that in the stress test, the stress time at which ΔVsh exceeds 100 mV is defined as the lifetime of a transistor. Changes in Ion, the S value, and μFE with the stress time were also evaluated.

Note that Ion (A) is the value of Id when Vd is 1.2 V and Vg is 3.3 V. The S value (mV/dec) is the value of Vg that is necessary to change Id by an order of magnitude in the subthreshold region when Vd is set to 1.2 V. Moreover, μFE (cm²/Vs) is a value calculated from the equation of the linear region of gradual channel approximation.

Figure 30:
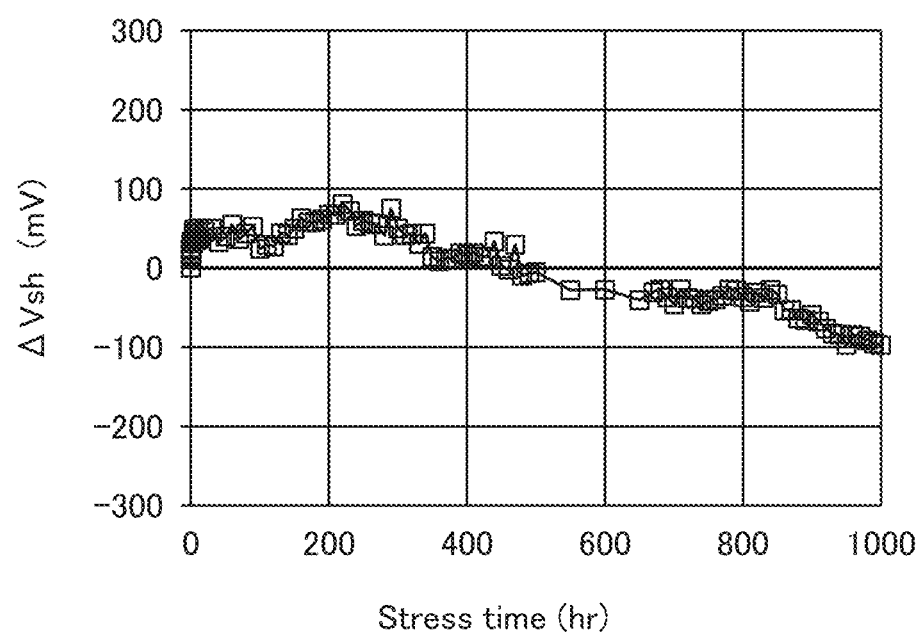
FIG. 30 is a graph showing stress time dependence of ΔVsh in a +GBT stress test in Example.

FIG. 30 shows the results of the +GBT stress test. In FIG. 30, the horizontal axis represents stress time (hr), and the vertical axis represents ΔVsh (mV). As shown in FIG. 30, after 1000 hours have passed while the stress is being applied to Sample K, the shift voltage change amount ΔVsh was 97 mV, which remains below 100 mV.

The set temperature of 150° C. in the +GBT stress test performed in this example is assumed to accelerate deterioration by approximately 24 times, compared to the set temperature of 125° C. in a +GBT stress test. Accordingly, the lifetime at a stress temperature of 125° C. can be estimated at 20000 hours or longer.

Figure 31A:
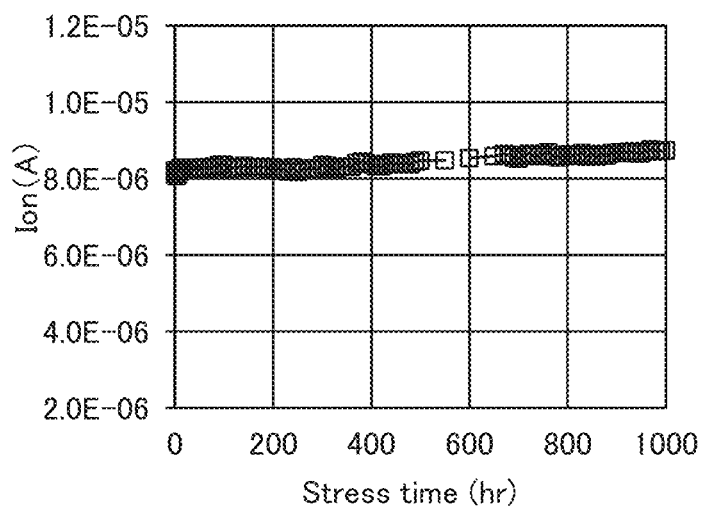
FIG. 31(A) to FIG. 31(C) are graphs showing stress time dependence of Ion, the S value, and μFE in a +GBT stress test in Example.
Figure 31B:
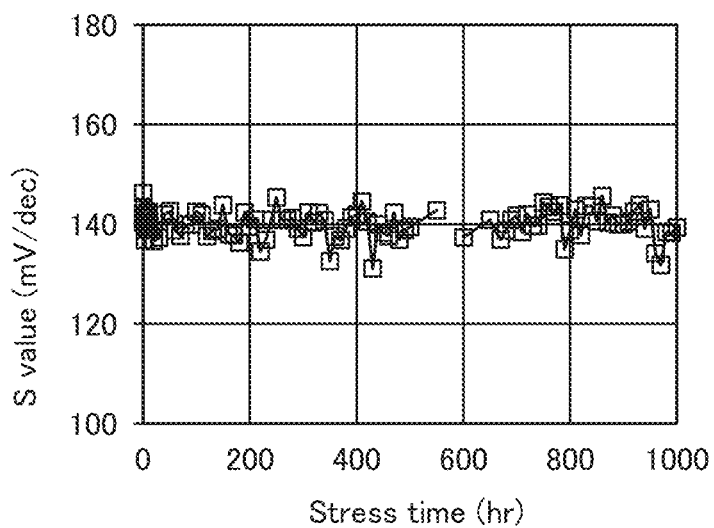
Figure 31C:
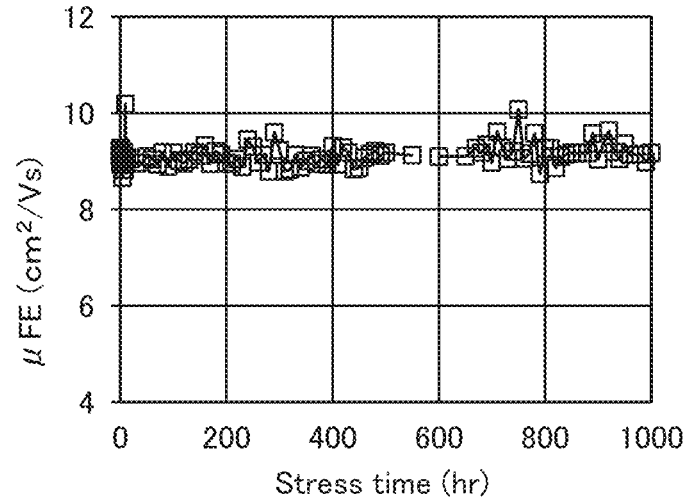

FIG. 31(A) shows changes in Ion with stress time. FIG. 31(B) shows changes in the S value with stress time. FIG. 31(C) shows changes in μFE with stress time. As shown in FIGS. 31(A), 31(B), and 31(C), the changes in Ion, the S value, and μFE with stress time were found to be small.

The above results demonstrate that the transistor 200 of one embodiment of the present invention has high reliability.

This example can be used in an appropriate combination with the structures, methods, and the like described in other embodiments and the other examples.

Example 6

In this example, reliability evaluation was performed, and the results at a stress time up to 2000 hours are described. As a sample subjected to the reliability evaluation, Sample L, in which a 2-nm-thick oxide 243 was formed at a substrate temperature of 200° C. by a sputtering method using a target with In:Ga:Zn=1:3:4 [atomic ratio], was used. Note that like Sample K, Sample L was subjected to heat treatment in a nitrogen atmosphere at 400° C. for eight hours. As in Example 5, the reliability evaluation was conducted by a +GBT stress test at a stress temperature of 150° C. Note that in the stress test, the stress time at which ΔVsh exceeds 100 mV is defined as the lifetime of a transistor. Changes in Ion, the S value, and μFE with the stress time were also evaluated.

Figure 32:
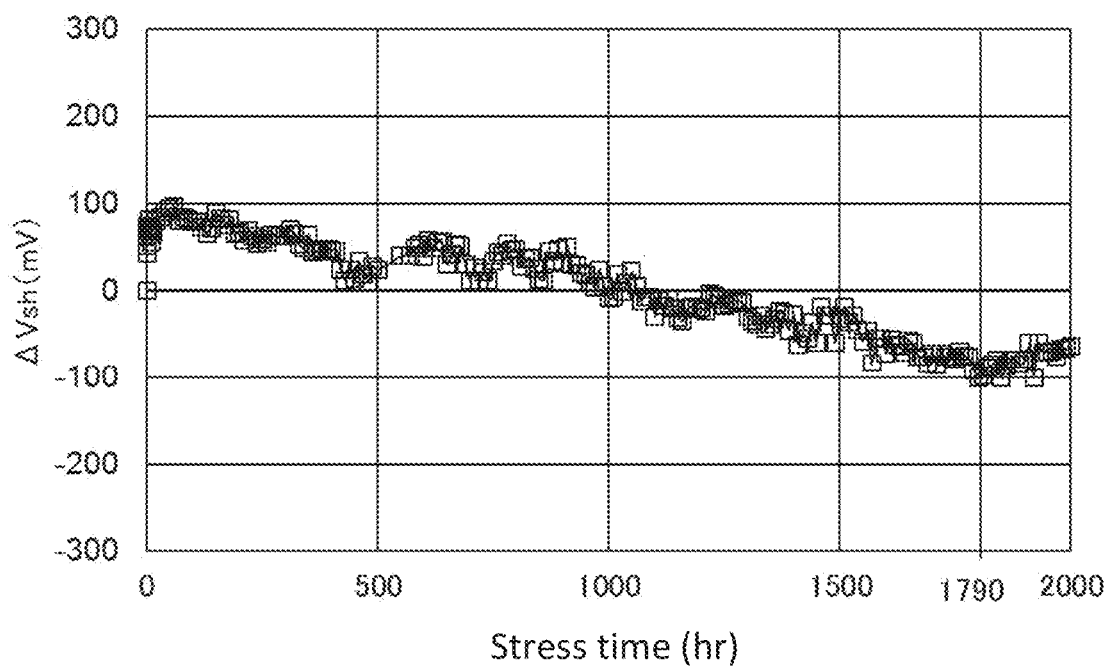
FIG. 32 is a graph showing stress time dependence of ΔVsh in a +GBT stress test in Example.

FIG. 32 shows the results of the +GBT stress test. In FIG. 32, the horizontal axis represents stress time (hr), and the vertical axis represents ΔVsh (mV). As shown in FIG. 32, Sample L has ΔVsh of −92 mV when 1790 hours have passed while the stress is being applied, meaning that the shift voltage change amount ΔVsh was kept within ±100 mV. Note that the shift voltage change amount ΔVsh exceeds ±100 mV when 1800 hours have passed. Accordingly, in the +GBT stress test at a stress temperature of 150° C., the lifetime of the transistor of Sample L was 1790 hours.

The set temperature of 150° C. in the +GBT stress test performed in this example is assumed to accelerate deterioration by approximately 24 times, compared to the set temperature of 125° C. in a +GBT stress test. Accordingly, the lifetime at a stress temperature of 125° C. can be estimated at 40000 hours or longer.

Figure 33A:
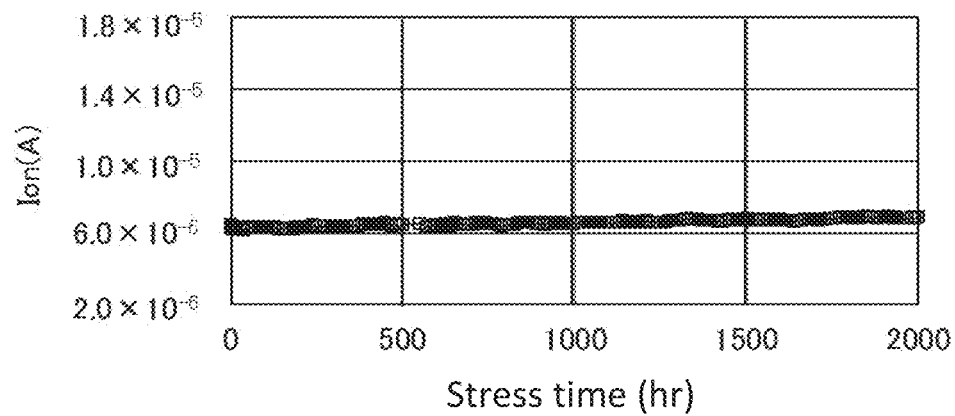
FIG. 33(A) to FIG. 33(C) are graphs showing stress time dependence of Ion, the S value, and μFE in a +GBT stress test in Example.
Figure 33B:
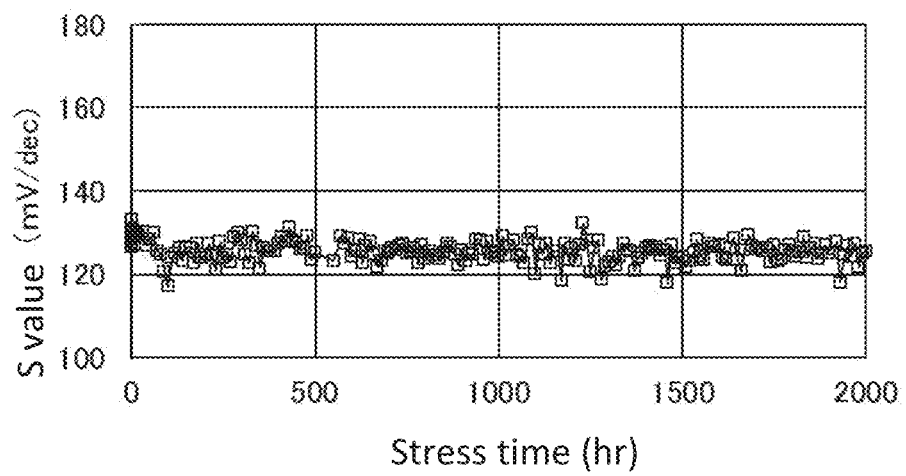
Figure 33C:
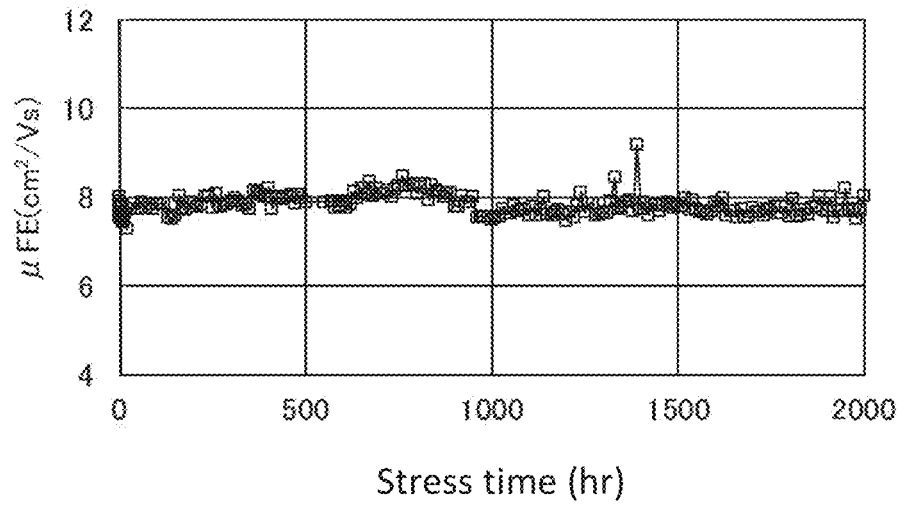

FIG. 33(A) shows changes in Ion with stress time. FIG. 33(B) shows changes in the S value with stress time. FIG. 33(C) shows changes in μFE with stress time. As shown in FIGS. 33(A), 33(B), and 33(C), the changes in Ion, the S value, and μFE with stress time were found to be small.

The above results demonstrate that the transistor 200 of one embodiment of the present invention has high reliability.

This example can be used in an appropriate combination with the structures, methods, and the like described in other embodiments and the other examples.

Example 7

In this example, Sample M including the transistor 200 was fabricated by the method described in <Manufacturing method of semiconductor device>, and the $I_D$-$V_G$ measurement of the transistor 200 was performed to evaluate variations in electrical characteristics.

In Sample M, a 2-nm-thick oxide 243 was formed at a substrate temperature of 200° C. by a sputtering method using a target with In:Ga:Zn=1:3:4 [atomic ratio]. Moreover, Sample M was subjected to heat treatment in a nitrogen atmosphere at 400° C. for four hours.

Next, the $I_D$-$V_G$ measurement of Sample M was conducted. The measurement was performed on 27 devices having a designed channel length of 60 nm and a designed channel width of 60 nm, and 9 devices having a designed channel length of 350 nm and a designed channel width of 350 nm.

The $I_D$-$V_G$ measurement was performed under the conditions where the drain potential Vd of the transistor was set to +1.2 V; the source potential Vs was set to 0 V; the bottom gate potential $V_{BG}$ was set to 0 V; and the gate potential $V_G$ was swept from −3.3 V to +3.3 V.

Figure 34:
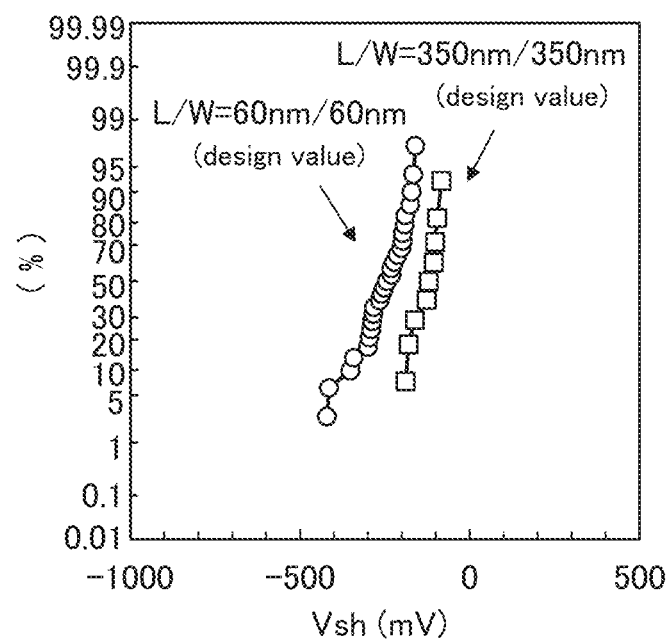
FIG. 34 is a graph showing normal probability distribution of Vsh in Example.

FIG. 34 shows normal probability plots of Vsh obtained in the $I_D$-$V_G$ measurement. A Vsh variation in the case where the design values of channel length and channel width were 60 nm and 60 nm had a standard deviation of 71 mV. A Vsh variation in the case where the design values of channel length and channel width were 350 nm and 350 nm had a standard deviation of 38 mV, demonstrating the results of a small variation for both the case the design values of channel length and channel width were 60 nm and 60 nm and the case where the design values of channel length and channel width were 350 nm and 350 nm.

Figure 35:
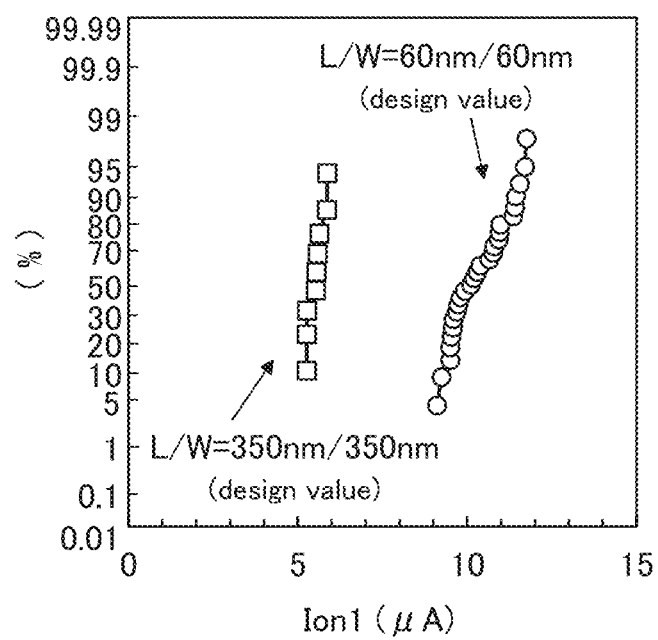
FIG. 35 is a graph showing normal probability distribution of Ion1 in Example.

FIG. 35 shows normal probability plots of $I_D$ (Ion1) when the gate potential $V_G$ was set to +3.3 V. An Ion1 variation in the case where the design values of channel length and channel width were 60 nm and 60 nm had a standard deviation of 0.8 μA. An Ion1 variation in the case where the design values of channel length and channel width were 350 nm and 350 nm had a standard deviation of 0.2 μA.

Figure 36:
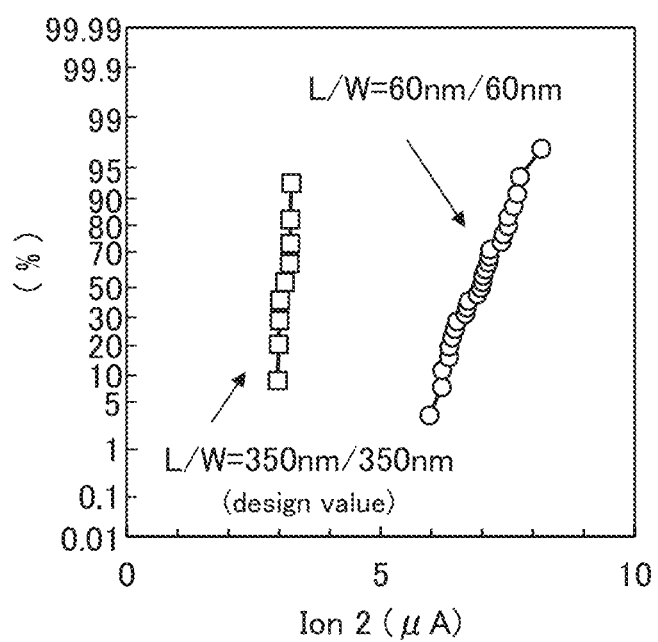
FIG. 36 is a graph showing normal probability distribution of Ion2 in Example.

FIG. 36 shows normal probability plots of $I_D$ (Ion2) when the gate potential $V_G$ was set to Vsh of +2.5 V. An Ion2 variation in the case where the design values of channel length and channel width were 60 nm and 60 nm had a standard deviation of 0.6 μA. An Ion2 variation in the case where the design values of channel length and channel width were 350 nm and 350 nm had a standard deviation of 0.1 μA.

This example can be used in an appropriate combination with the structures, methods, and the like described in other embodiments and the other examples.

Example 8

In this example, attention was focused on the fact that a defect in a crystal of an oxide semiconductor would be a cause of leakage current, and the influence of a defect in CAAC-IGZO on off-state current, including temperature dependence, was estimated by device calculation.

The model of the transistor used for the evaluation has the structure of the transistor 200 illustrated in FIG. 1; the thickness of the gate insulating film was an EOT of 6 nm, the gate length was 60 nm, and the channel width was 60 nm. The defect states were set to states attributed to oxygen vacancies located near the mid gap of the energy gap of CAAC-IGZO according to the analysis results of hard X-ray photoelectron spectrometry (HX-PES) and the like. As a result of device calculation of $I_D$-$V_G$ characteristics at $V_D$ of 1.2 V, the $I_D$-$V_G$ characteristics with the setting of the defect states were found to have a gentler $I_D$ slope in a region with low $V_G$ than the $I_D$-$V_G$ characteristics without the setting of the defect states. That is, the amount of $I_D$ change with respect to the $V_G$ change in the negative direction was found to be smaller in the $I_D$-$V_G$ characteristics with the setting of the defect states than in the $I_D$-$V_G$ characteristics without the setting of the defect states.

Furthermore, the influence of the increase in transistor temperature on the $I_D$-$V_G$ characteristics at $V_D$ of 1.2 V was calculated. The transistor temperature was set to 85° C., 125° C., and 192° C. As a result of calculation, the off-state current at $V_G$ of −2 V and a temperature of 85° C. was $6.5 \times 10^{-20}$ A/μm, the off-state current at $V_G$ of −2 V and a temperature of 125° C. was $3.6 \times 10^{-18}$ A/μm, and the off-state current at $V_G$ of −2 V and a temperature of 192° C. was $7.0 \times 10^{-16}$ A/μm.

Figure 37A:
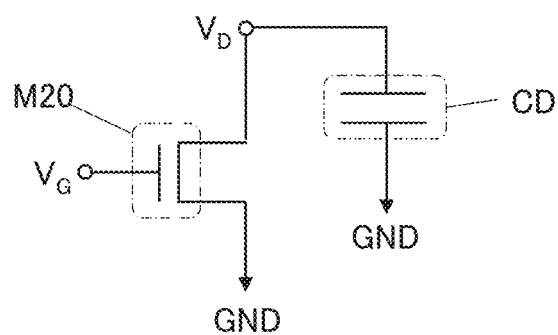
FIG. 37(A) is a circuit diagram used for calculation in Example.

Next, the temperature dependence of the potential change in a capacitor portion connected to a transistor was calculated on the basis of the off-state current at each temperature, which was obtained by the above device calculation. FIG. 37(A) illustrates a circuit configuration subjected to the calculation. A drain of a transistor M20 and one electrode of a capacitor CD are connected to each other. A source of the transistor M20 is grounded to GND. The other electrode of the capacitor CD is grounded to GND. In this calculation, the capacitance of the capacitor CD was set to 1 nF.

The following were set as the initial state: the capacitor CD was in a state of being charged, the transistor M20 was off by setting $V_G$ to −2, and $V_D$=1.2 V was set as the potential of the drain of the transistor M20 and the one electrode of the capacitor CD.

Figure 37B:
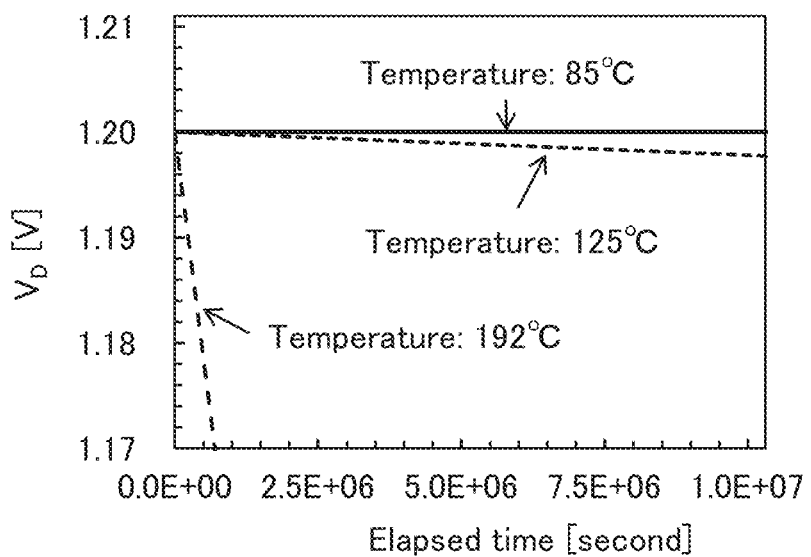
FIG. 37(B) is a graph showing calculation results in Example.

FIG. 37(B) shows the calculation results. It is found that as the temperature is higher, a decrease in the potential $V_D$ over time is larger, as shown in FIG. 37(B).

Example 9

In this example, attention was focused on the fact that a defect in a crystal of an oxide semiconductor would be a cause of leakage current, and the influence of a defect in CAAC-IGZO on off-state current, including temperature dependence, was estimated by device calculation. In addition, a simplified retention circuit was configured to verify, by calculation, how much the leakage current affects the retention characteristics of the circuit. Moreover, a TEG (Test Element Group) device for verifying retention characteristics was fabricated, and correspondence with the actual measurement results was examined.

Figure 38A:
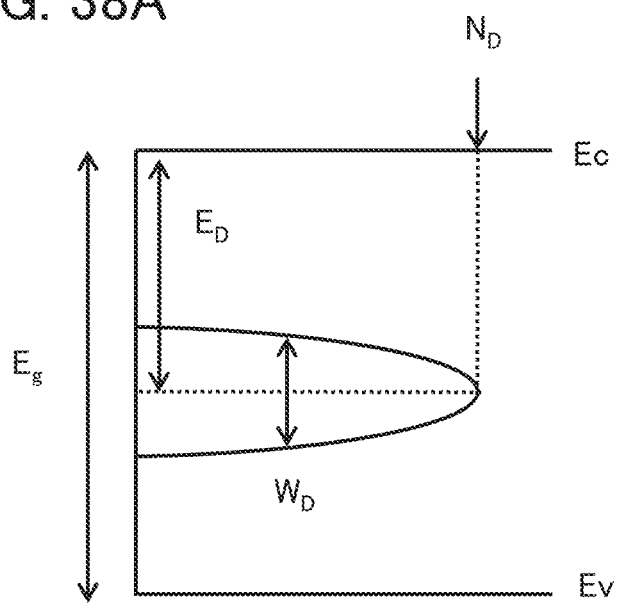
FIG. 38(A) is a graph showing defect states in Example.
Figure 38B:
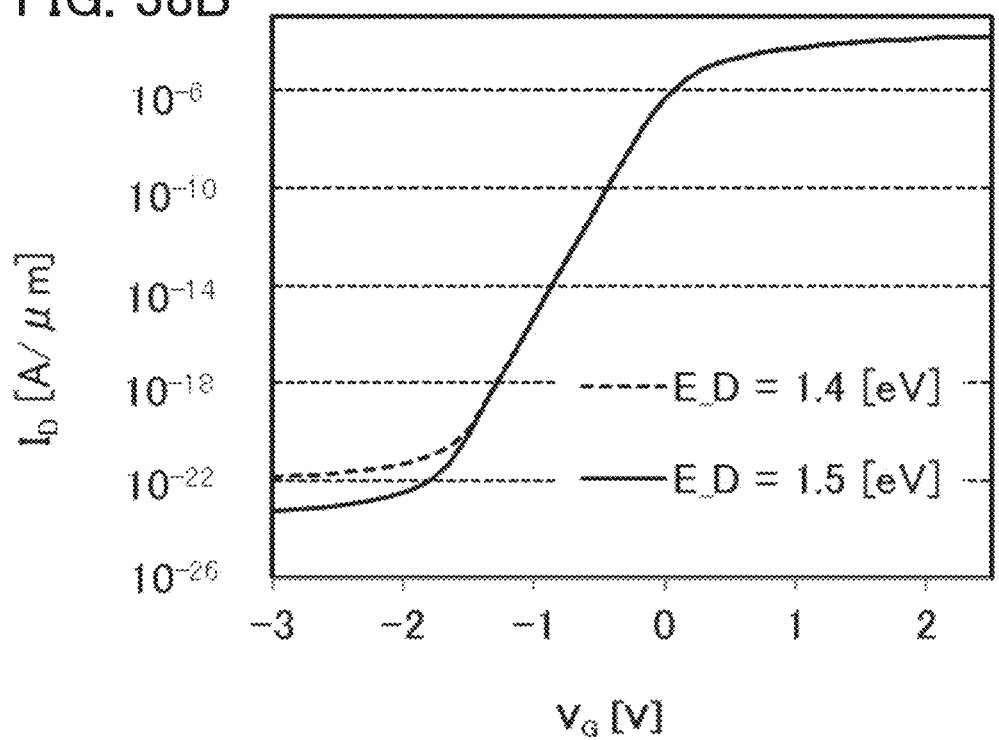
FIG. 38(B) is a graph showing calculation results in Example.

The model of the transistor used for the evaluation has the structure of the transistor 200 illustrated in FIG. 1; the thickness of the gate insulating film was an EOT of 6 nm, the gate length was 60 nm, and the channel width was 60 nm. The defect states were set to states attributed to oxygen vacancies located near the mid gap of the energy gap of CAAC-IGZO according to the analysis results of hard X-ray photoelectron spectrometry (HX-PES) and the like. FIG. 38(A) shows the distribution of the defect states. $E_g$ represents an energy gap of the oxide semiconductor and was set to 2.9 eV, $N_D$ represents a peak density of the defect states and was set to $1 \times 10^{21}$ /cm$^3$·eV, and $W_D$ represents a standard deviation of the defect states and was set to 0.25 eV. ED represents an energy at the intermediate position of the defect states and was set to 1.4 eV and 1.5 eV. The temperature was set to 27° C.

FIG. 38(A) shows $I_D$-$V_G$ characteristics at $V_D$ of 1.2V that were obtained as a result of the device calculation. The results demonstrate that the off-state current with ED set to 1.4 eV is higher than the off-state current with ED set to 1.5 eV. That is, a phenomenon in which the off-state current increases as the energy at the intermediate position of the defect states becomes closer to the conduction band minimum Ec was observed.

Figure 39A:
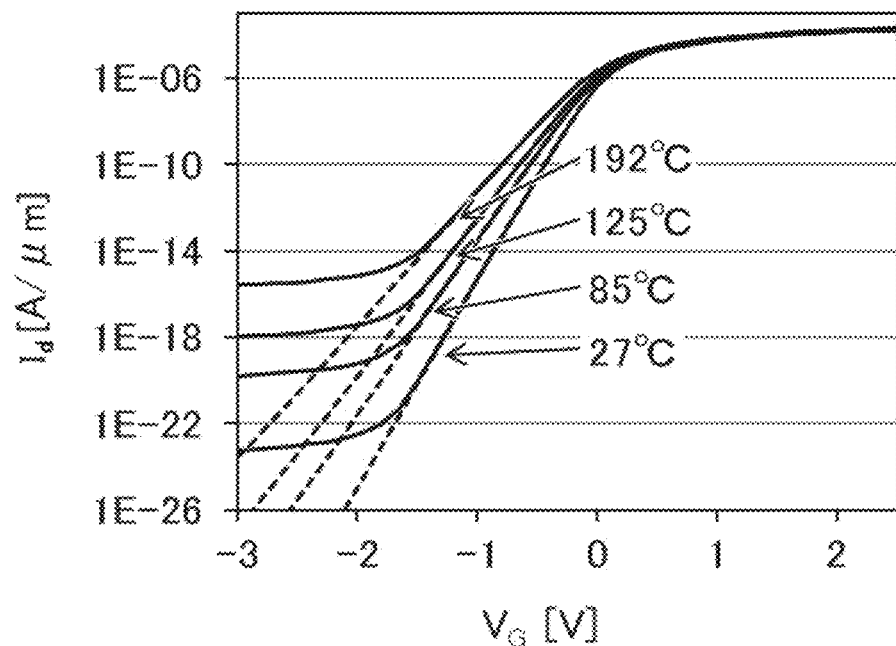
FIG. 39(A) is a graph showing $I_D$-$V_G$ characteristics in Example.
Figure 39B:
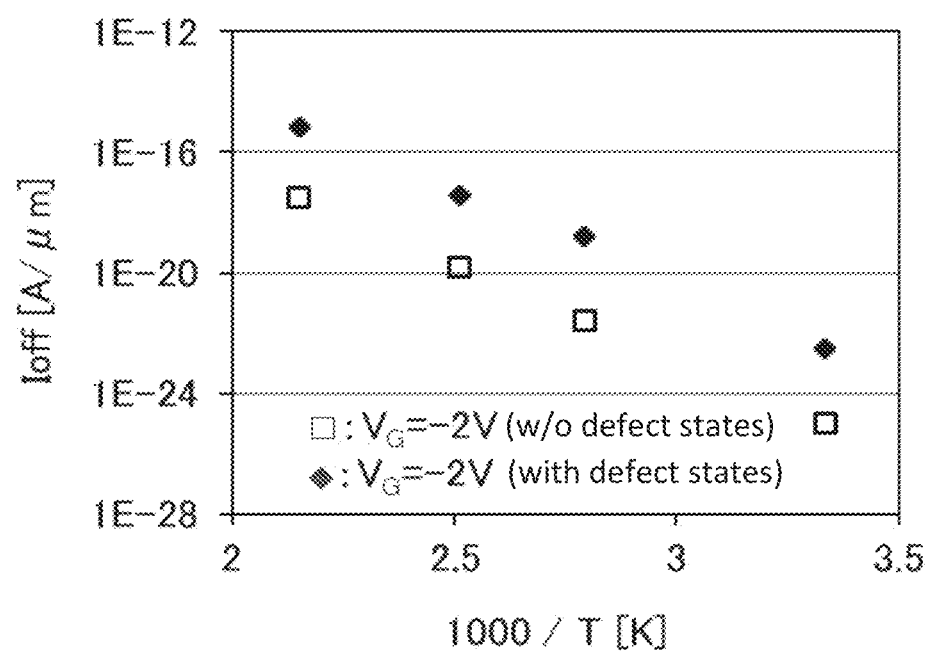
FIG. 39(B) is a graph showing temperature dependence of off-state current.

Next, $E_g$, $N_D$, and $W_D$ were set as above, ED was fixed at 1.5 eV, and the temperature was set to 27° C., 85° C., 125° C., and 192° C. FIG. 39(A) shows $I_D$-$V_G$ characteristics at $V_D$ of 1.2V that were obtained as a result of the device calculation. FIG. 39(B) shows a graph of the relation between the off-state current and the inverse of the temperature at $V_G$ of −2 V.

Regarding the $I_D$-$V_G$ characteristics at $V_D$ of 1.2 V, the $I_D$-$V_G$ characteristics with the setting of the defect states were found to have a gentler $I_D$ slope in a region with low $V_G$ than the $I_D$-$V_G$ characteristics without the setting of the defect states. That is, the amount of $I_D$ change with respect to the $V_G$ change in the negative direction was found to be smaller in the $I_D$-$V_G$ characteristics with the setting of the defect states than in the $I_D$-$V_G$ characteristics without the setting of the defect states. It was also found that, regardless of with or without the setting of the defect states, the off-state current becomes higher as the temperature is higher (see FIGS. 39(A) and 39(B)).

Next, a retention circuit having a simplified configuration was set, and the influence of off-state current on retention characteristics was obtained by calculation. The retention circuit having a simplified configuration was the circuit illustrated in FIG. 37(A), as in Example 8. Note that the capacitance of the capacitor CD was set to 10 aF in this example. The transistor M20 was turned off by setting $V_G$ to −2, the capacitor CD was in a state of being charged, and the potential $V_D$ of the drain of the transistor M20 and the one electrode of the capacitor CD was set to 1.2 V as the initial state. The temperature was set to 125° C. and 192° C.

Figure 40:
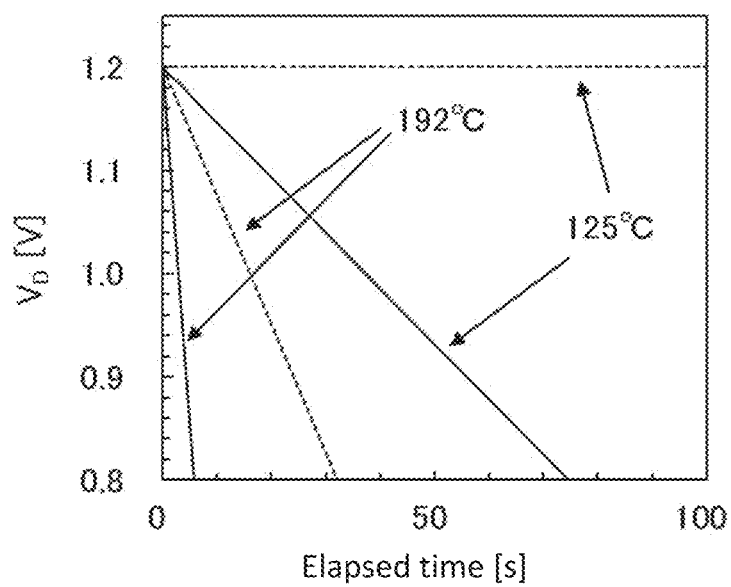
FIG. 40 is a graph showing temperature dependence of retention characteristics in Example.

FIG. 40 shows the calculation results. The graphs indicated by dotted lines show the results of calculation without the setting of defect states, and the graphs indicated by solid lines show the results of calculation with the setting of defect states. These results demonstrate that the decrease in the potential $V_D$ overtime is large and the retention characteristics deteriorate under the conditions where the temperature is high and the defect states are set. It is also found that, under the conditions where the temperature is 125° C. and the defect states are not set, a decrease in the potential $V_D$ hardly occurs in the range of elapsed time shown in FIG. 40.

Figure 41:
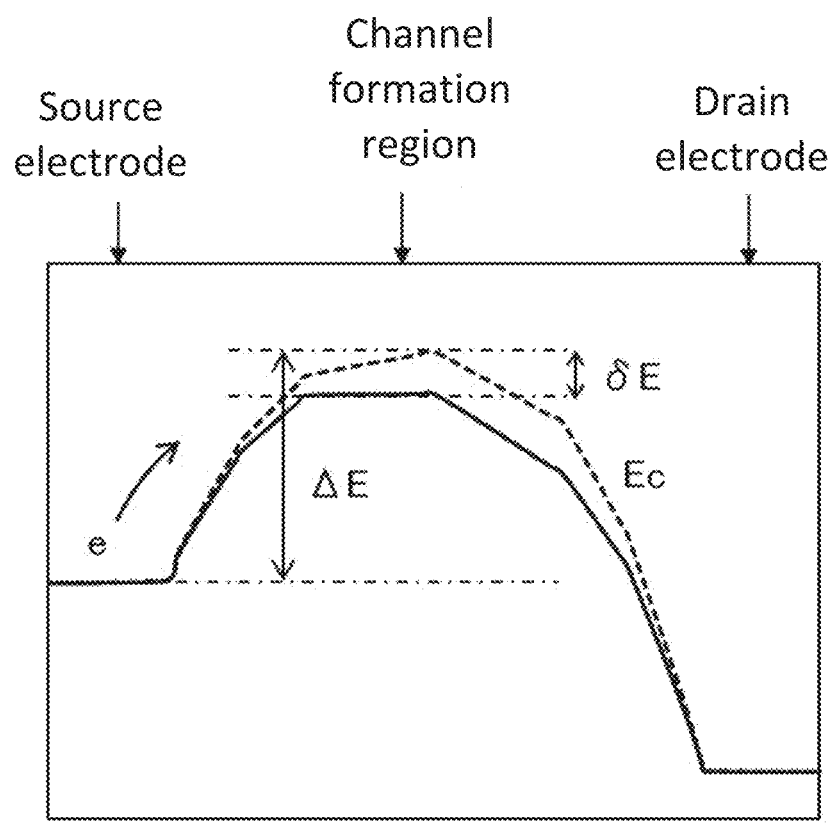
FIG. 41 is a graph showing a band diagram in Example.

Next, the reason that the off-state current increases and the retention characteristics deteriorate when such defect states exist is considered. FIG. 41 shows the results of calculating a band diagram of the conduction band minimum Ec of a source electrode, a channel formation region, and a drain electrode of the transistor in the off state. The graph indicated by a dotted line shows the result of calculation without the setting of defect states, and the graph indicated by a solid line shows the result of calculation with the setting of defect states.

The calculation results demonstrate that the energy barrier of electrons is lower in the off state when the defect states exist than in the off state when the defect states do not exist. This is probably because when a negative voltage is applied to a top gate, an energy barrier of ΔE is ordinarily caused, whereas the increase in energy barrier is suppressed by Fermi-level pinning and electrons are more likely to get over the energy barrier, that is, the off-state current increases. In FIG. 41, the energy barrier decreases by 6E. This presumably corresponds to the fact that the amount of $I_D$ change with respect to the $V_G$ change is smaller in the subthreshold region of the $I_D$-$V_G$ characteristics as shown in FIG. 39(A).

Next, TEG (Test Element Group) devices for measuring retention characteristics were fabricated, and correspondence with the actual measurement results was examined.

The TEG devices for measuring retention characteristics include the transistor 200 and were fabricated by the method described in <Manufacturing method of semiconductor device>.

Figure 42A:
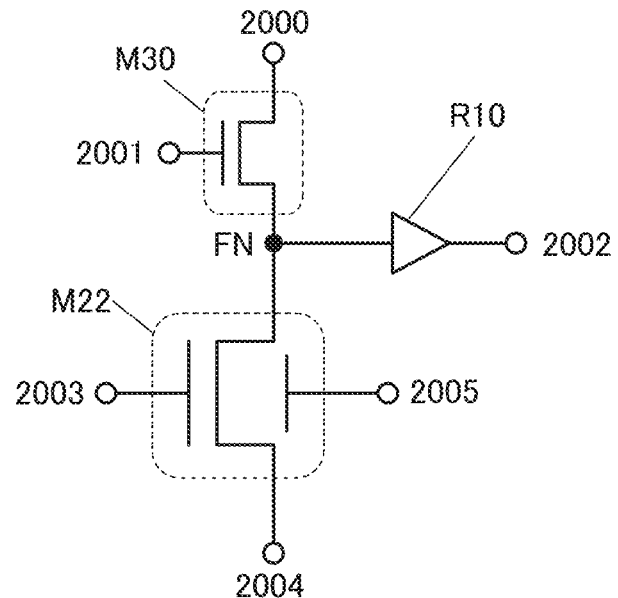
FIG. 42(A) and FIG. 42(B) are circuit diagrams of TEG devices for measuring retention characteristics in Example.
Figure 42B:
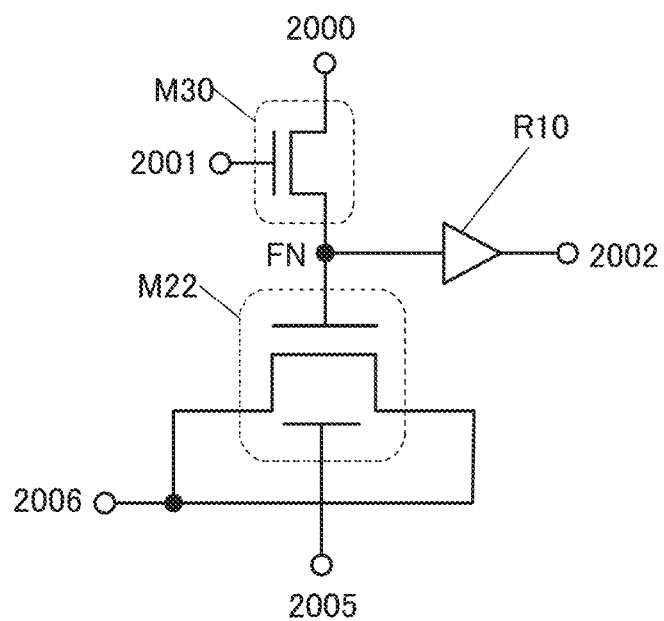

FIGS. 42(A) and 42(B) are circuit diagrams of the TEG devices for measuring retention characteristics. FIG. 42(A) shows a circuit of a TEG device capable of measuring the drain leakage current and the top-gate leakage current from the retention characteristics. FIG. 42(B) shows a circuit of a TEG device capable of measuring only the top-gate leakage current from the retention characteristics.

As illustrated in FIG. 42(A), a wiring 2000 is electrically connected to one of a source and a drain of a transistor M30, a wiring 2001 is electrically connected to a gate of the transistor M30, and a wiring 2002 is electrically connected to one terminal of a read circuit R10. The other of the source and the drain of the transistor M30 is electrically connected to a floating node FN, the other terminal of the read circuit R10 is electrically connected to the floating node FN, and one of a source and a drain of a transistor M22 is electrically connected to the floating node FN. A wiring 2003 is electrically connected to a gate of the transistor M22, a wiring 2004 is electrically connected to the other of the source and the drain of the transistor M22, and a wiring 2005 is electrically connected to a back gate of the transistor M22.

As illustrated in FIG. 42(B), the wiring 2000 is electrically connected to one of the source and the drain of the transistor M30, the wiring 2001 is electrically connected to the gate of the transistor M30, and the wiring 2002 is electrically connected to one terminal of the read circuit R10. The other of the source and the drain of the transistor M30 is electrically connected to the floating node FN, the other terminal of the read circuit R10 is electrically connected to the floating node FN, and the gate of the transistor M22 is electrically connected to the floating node FN. A wiring 2006 is electrically connected to the source and the drain of the transistor M22, and the wiring 2005 is electrically connected to the back gate of the transistor M22.

The transistor M30 is a write transistor, and the transistor M22 is a transistor targeted for measurement of retention characteristics. Although the transistor M22 is shown as one transistor in FIGS. 42(A) and 42(B), the transistor M22 is composed of 20000 parallel-connected transistors each having a channel length of 60 nm and a channel width of 60 nm. That is, the transistor M22 is a transistor having a channel length of 60 nm and a channel width of 60 nm×20000=1.2 mm.

Figure 43:
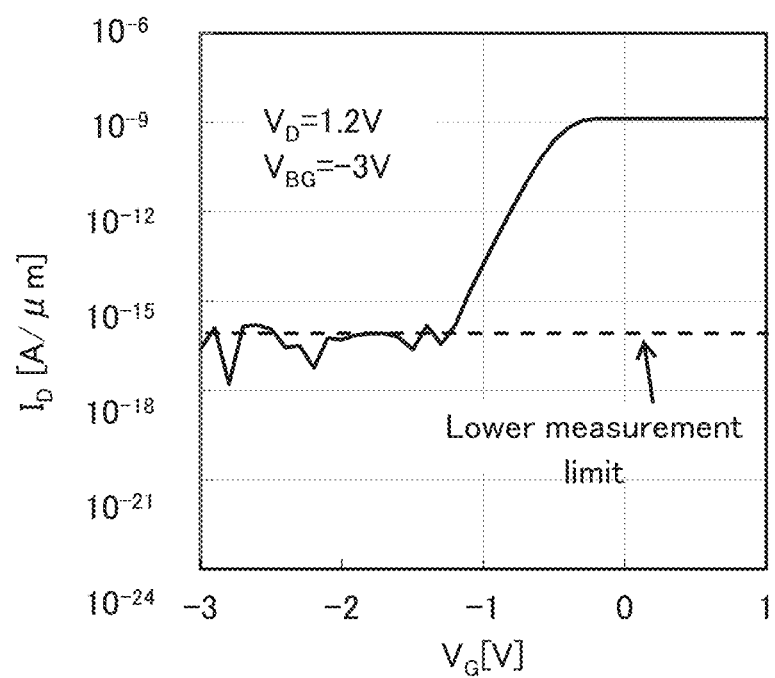
FIG. 43 is a graph showing $I_D$-$V_G$ characteristics in Example.

Next, the $I_D$-$V_G$ measurement was performed on the transistor M22 using a semiconductor parameter analyzer, which is used in electrical measurement of semiconductor devices. FIG. 43 is a graph showing the $I_D$-$V_G$ characteristics of the transistor M22. In the measurement by the semiconductor parameter analyzer, the off-state current was less than or equal to $1\times10^{-16}$ A/µm, which is the lower measurement limit of the semiconductor parameter analyzer, even though the channel width was 1.2 mm.

Then, the drain leakage current and the top-gate leakage current were estimated from the retention characteristics with the use of the TEG device illustrated in FIG. 42(A). First, the wiring 2001 was set to a potential such that the transistor M30 was turned on, a potential of 1.2 V was supplied to the wiring 2000, and charge was accumulated in the node FN so that the node FN had a potential of 1.2 V. After that, a potential of −3 V was supplied to the wiring 2001, whereby the transistor M30 was turned off. The potential of the wiring 2000 was set to 0 V and the potential of the wiring 2005 was set to −3 V so that the transistor M22 was turned off. The potential of the wiring 2003, which was electrically connected to the gate, was set to −2 V and −2.5 V. The above state was held for a certain time, a change in the potential of the node FN over time was read out by the read circuit R10, and the drain leakage current and the top-gate leakage current were estimated from the read value.

Next, the top-gate leakage current was measured from the retention characteristics with the use of the TEG device illustrated in FIG. 42(B). First, the wiring 2001 was set to a potential such that the transistor M30 was turned on, a potential of 1.2 V was supplied to the wiring 2000, and charge was accumulated in the node FN so that the node FN had a potential of 1.2 V. After that, a potential of −3 V was supplied to the wiring 2001, whereby the transistor M30 was turned off. The transistor M22 set the potential of the wiring 2006 to 4.4 V and 4.9 V and the potential of the wiring 2005 to 1.2 V. The above state was held for a certain time, a change in the potential of the node FN over time was read out by the read circuit R10, and the top-gate leakage current was estimated from the read value.

Figure 44A:
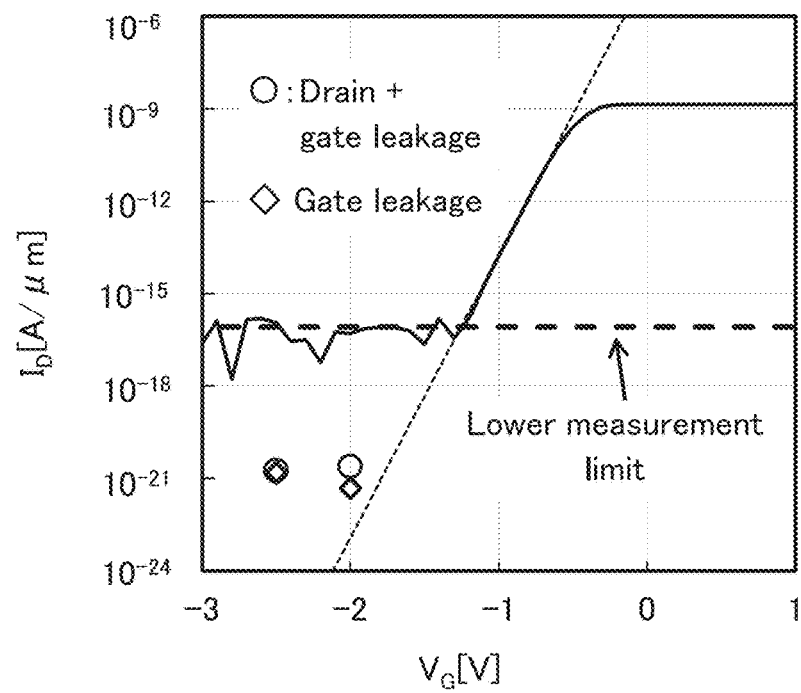
FIG. 44(A) and FIG. 44(B) are graphs showing results of evaluating leakage current in Example.

FIG. 44(A) is a graph where the values of the drain leakage current and the top-gate leakage current at $V_G$ of −2 V and −2.5 V and the values of the gate leakage current at $V_G$ of −2 V and −2.5 V, which were obtained in the above, are plotted in the graph of the $I_D$-$V_G$ characteristics of the transistor M22 measured by the semiconductor parameter analyzer. The straight line indicated by a dotted line is the extrapolation line of the subthreshold region.

Figure 44B:
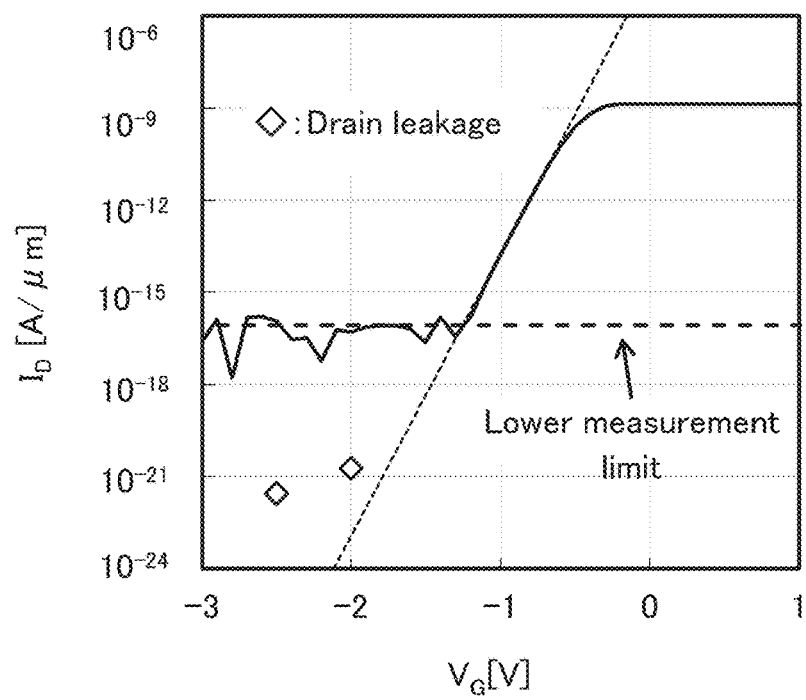

FIG. 44(B) is a graph where values obtained by subtracting the values of the gate leakage current at $V_G$ of −2 V and −2.5 V from the values of the drain leakage current and the top-gate leakage current at $V_G$ of −2 V and −2.5 V are plotted in the graph of the $I_D$-$V_G$ characteristics of the transistor M22 measured by the semiconductor parameter analyzer. That is, FIG. 44(B) shows the drain leakage current values that do not include the gate leakage. The straight line indicated by a dotted line is the extrapolation line of the subthreshold region.

Figure 45:
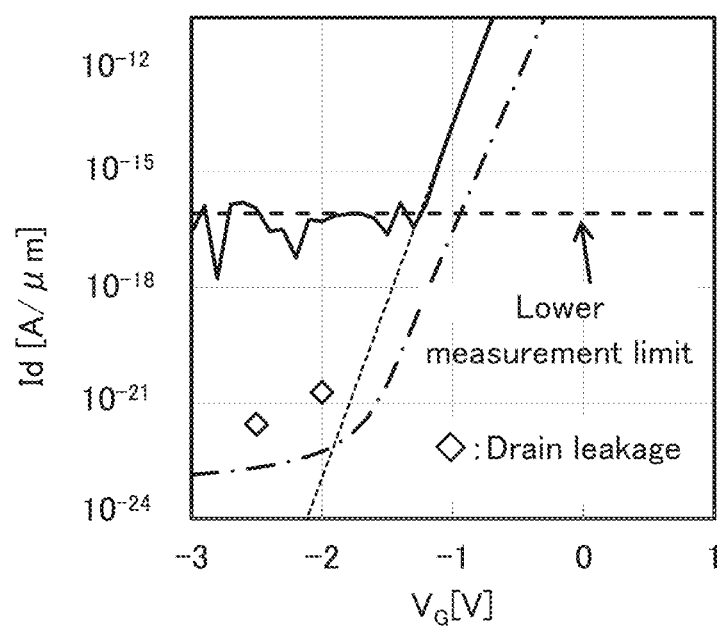
FIG. 45 is a graph showing results of evaluating leakage current in Example.

FIG. 45 is a graph in which $I_D$-$V_G$ characteristics obtained by device calculation with the setting of defect states are added to FIG. 44(B). The $I_D$-$V_G$ characteristics obtained by the device calculation are indicated by a dashed-dotted curve. This demonstrates that the off-state current at the time when a negative gate potential was applied deviated from the extrapolation line of the subthreshold region. This is similar to the behavior of Fermi-level pinning due to defect states, which was demonstrated by the calculation.

REFERENCE NUMERALS

10: oxide semiconductor, 20: conductor, 22: oxygen-dissolved region, 30: oxide, 100: capacitor, 110: conductor, 112: conductor, 120: conductor, 130: insulator, 150: insulator, 200: transistor, 205: conductor, 205a: conductor, 205b: conductor, 205c: conductor, 205d: conductor, 205e: conductor, 205f: conductor, 205g: conductor, 210: insulator, 212: insulator, 214: insulator, 216: insulator, 218: conductor, 222: insulator, 224: insulator, 224A: insulating film, 230: oxide, 230a: oxide, 230A: oxide film, 230b: oxide, 230B: oxide film, 230c: oxide, 230C: oxide film, 240: conductor, 240a: conductor, 240b: conductor, 241: insulator, 241a: insulator, 241b: insulator, 242: conductor, 242a: conductor, 242A: conductive film, 242b: conductor, 242B: conductor layer, 243: oxide, 243a: oxide, 243A: oxide film, 243b: oxide, 243B: oxide layer, 245: conductor, 246: conductor, 246a: conductor, 246b: conductor, 250: insulator, 250A: insulating film, 260: conductor, 260a: conductor, 260Aa: conductive film, 260Ab: conductive film, 260b: conductor, 272: insulator, 272A: insulating film, 273: insulator, 273A: insulating film, 274: insulator, 276: insulator, 280: insulator, 281: insulator, 282: insulator, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 400: transistor, 405: conductor, 405a: conductor, 405b: conductor, 430c: oxide, 431a: oxide, 431b: oxide, 432a: oxide, 432b: oxide, 440: conductor, 440a: conductor, 440b: conductor, 442: conductor, 442a: conductor, 442b: conductor, 443: oxide, 443a: oxide, 443b: oxide, 450: insulator, 460: conductor, 460a: conductor, 460b: conductor, 1001: wiring, 1002: wiring, 1003: wiring, 1004: wiring, 1005: wiring, 1006: wiring, 1007: wiring, 1008: wiring, 1009: wiring, 1010: wiring

The invention claimed is:

1. A semiconductor device comprising:
a first insulator;
a first oxide over the first insulator;
a second oxide over and in contact with the first oxide;
a first conductor over the second oxide;
a second conductor over the second oxide;
a second insulator covering the first oxide, the second oxide, the first conductor, and the second conductor;
a third insulator over the second insulator;
a third oxide over the second oxide, the third oxide being provided in an opening of the third insulator;
a fourth insulator over the third oxide; and
a third conductor over the third insulator,
wherein the third oxide is in contact with a top surface of the second oxide, a first side surface of the first conductor and a first side surface of the second conductor,
wherein the third oxide is in contact with a side surface of the third insulator in the opening,
wherein the second oxide comprises In, an element M, and Zn, where the element M is Al, Ga, Y, or Sn,
wherein the second insulator is in contact with a top surface of the first conductor, a top surface of the second conductor, a second side surface of the first conductor, a second side surface of the second conductor, a side surface of the second oxide, and a side surface of the first oxide, and
wherein the third oxide comprises aluminum.

2. The semiconductor device according to claim 1,
wherein each of the first conductor and the second conductor comprises tantalum and nitrogen, and
wherein the second insulator comprises aluminum and oxygen.

3. The semiconductor device according to claim 1,
wherein the first oxide comprises at least one of constituent elements included in the second oxide.

4. The semiconductor device according to claim 1,
wherein the second oxide has crystallinity.

5. A semiconductor device comprising:
a first insulator;
a first oxide over the first insulator;
a second oxide over the first oxide;
a third oxide and a fourth oxide over the second oxide;
a first conductor over the third oxide;
a second conductor over the fourth oxide;
a fifth oxide over the second oxide;
a second insulator over the fifth oxide;

a third conductor over the second insulator;
a third insulator over the first conductor and the second conductor; and
a fourth insulator over the third insulator,
wherein the fifth oxide is in contact with a top surface of the second oxide, a first side surface of the first conductor, a first side surface of the second conductor, a first side surface of the third oxide, a first side surface of the fourth oxide, and a side surface of the third insulator,
wherein the fifth oxide is in contact with an inner surface of an opening provided in the fourth insulator,
wherein the third conductor is provided to fill the opening,
wherein the second oxide comprises In, an element M and Zn, where the element M is Al, Ga, Y, or Sn,
wherein the first oxide comprise at least one of constituent elements included in the second oxide,
wherein the third oxide and the fourth oxide each comprise the element M, and
wherein the third oxide and the fourth oxide each comprise a region having a concentration of the element M higher than a concentration of the element M in the second oxide, and
wherein the fifth oxide comprises aluminum.

6. The semiconductor device according to claim 5,
wherein each of the first conductor and the second conductor comprises tantalum and nitrogen, and
wherein the second insulator comprises aluminum and oxygen.

7. The semiconductor device according to claim 5,
wherein the third oxide and the fourth oxide each comprise a region having a thickness of greater than or equal to 0.5 nm and less than or equal to 5 nm.

8. The semiconductor device according to claim 5,
wherein the third oxide and the fourth oxide each comprise a region having a thickness of greater than or equal to 1 nm and less than or equal to 3 nm.

9. The semiconductor device according to claim 5,
wherein the third oxide and the fourth oxide each comprise gallium.

10. The semiconductor device according to claim 5,
wherein the third oxide and the fourth oxide each have crystallinity.

11. A transistor device comprising:
a first insulator;
a first oxide over the first insulator;
a second oxide over the first oxide;
a third oxide and a fourth oxide over the second oxide;
a first conductor over the third oxide;
a second conductor over the fourth oxide;
a fifth oxide over the second oxide;
a second insulator over the fifth oxide;
a third conductor over the second insulator;
a third insulator over the first conductor and the second conductor; and
a fourth insulator over the third insulator,
wherein the fifth oxide is in contact with a top surface of the second oxide, a first side surface of the first conductor, a first side surface of the second conductor, a first side surface of the third oxide, a first side surface of the fourth oxide, and a side surface of the third insulator,
wherein the fifth oxide is in contact with an inner surface of an opening provided in the fourth insulator,
wherein the third conductor is provided to fill the opening,
wherein the second oxide comprises In, an element M and Zn, where the element M is Al, Ga, Y, or Sn,
wherein the first oxide comprise at least one of constituent elements included in the second oxide,
wherein the third oxide and the fourth oxide each comprise the element M, and
wherein the third oxide and the fourth oxide each comprise a region having a concentration of the element M higher than a concentration of the element M in the second oxide, and
wherein a shift voltage change amount $\Delta Vsh$ of the transistor is less than or equal to 100 mV after 550 hours of the +GBT stress test,
wherein a gate voltage of the +GBT stress test is set to 3.63V and a temperature of the +GBT stress test is set to 150° C.

12. The transistor according to claim 11,
wherein the shift voltage change amount $\Delta Vsh$ of the transistor is less than or equal to 100 mV after 1100 hours of the +GBT stress test.

13. The transistor according to claim 11,
wherein each of the first conductor and the second conductor comprises tantalum and nitrogen, and
wherein the second insulator comprises aluminum and oxygen.

14. The transistor according to claim 11,
wherein the third oxide and the fourth oxide each comprise a region having a thickness of greater than or equal to 0.5 nm and less than or equal to 5 nm.

15. The transistor according to claim 11,
wherein the third oxide and the fourth oxide each comprise a region having a thickness of greater than or equal to 1 nm and less than or equal to 3 nm.

16. The transistor according to claim 11,
wherein the third oxide and the fourth oxide each comprise gallium.

17. The transistor according to claim 11,
wherein the third oxide and the fourth oxide each have crystallinity.

18. The transistor according to claim 11,
wherein the fifth oxide comprises aluminum.

* * * * *